(12) United States Patent
Nishino et al.

(10) Patent No.: US 6,473,352 B2
(45) Date of Patent: Oct. 29, 2002

(54) SEMICONDUCTOR INTEGRATED CIRCUIT DEVICE HAVING EFFICIENTLY ARRANGED LINK PROGRAM CIRCUITRY

(75) Inventors: Aiko Nishino, Hyogo (JP); Naoya Watanabe, Hyogo (JP); Katsumi Dosaka, Hyogo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 09/843,690

(22) Filed: Apr. 30, 2001

(65) Prior Publication Data

US 2002/0054529 A1 May 9, 2002

(30) Foreign Application Priority Data

Nov. 7, 2000 (JP) ........................................ 2000-338875

(51) Int. Cl.⁷ ................................................. G11C 7/00
(52) U.S. Cl. ...................................... 365/219; 365/221
(58) Field of Search ................................ 365/219, 221

(56) References Cited

U.S. PATENT DOCUMENTS 4,989,261 A * 1/1991 Lee ........................... 455/127

FOREIGN PATENT DOCUMENTS

| JP | 0024080 | * | 2/1982 | ............ G11C/8/00 |
| JP | 5724080 | * | 2/1982 | ............ G11C/8/00 |
| JP | 11-31398 | | 2/1999 | |

OTHER PUBLICATIONS

Betty Prince, "Semiconductor Memories", 1983, Wiley, 2$^{nd}$ edition, pp. 766–768.*

"A 1.4ns Access 700MHz 288kb SRAM Macro with Expandable Architecture", by Shimizu et al., 1999 IEEE International Solid–State Circuits Conference (Feb. 16, 1999), pp. 190–191.

* cited by examiner

*Primary Examiner*—M. Tran
(74) *Attorney, Agent, or Firm*—McDermott, Will & Emery

(57) ABSTRACT

Outside core circuit, link circuits are concentratedly arranged in an LT link portion. The LT link information sent from the LT link portion is serially transferred to transfer control circuit. Transfer control portion converts the serially transferred link information to parallel information, and transfers the parallel information to latch circuits arranged in the core circuit and corresponding to circuits requiring the LT link information. An influence on an interconnection layout by laser trimmable link elements is eliminated.

13 Claims, 32 Drawing Sheets

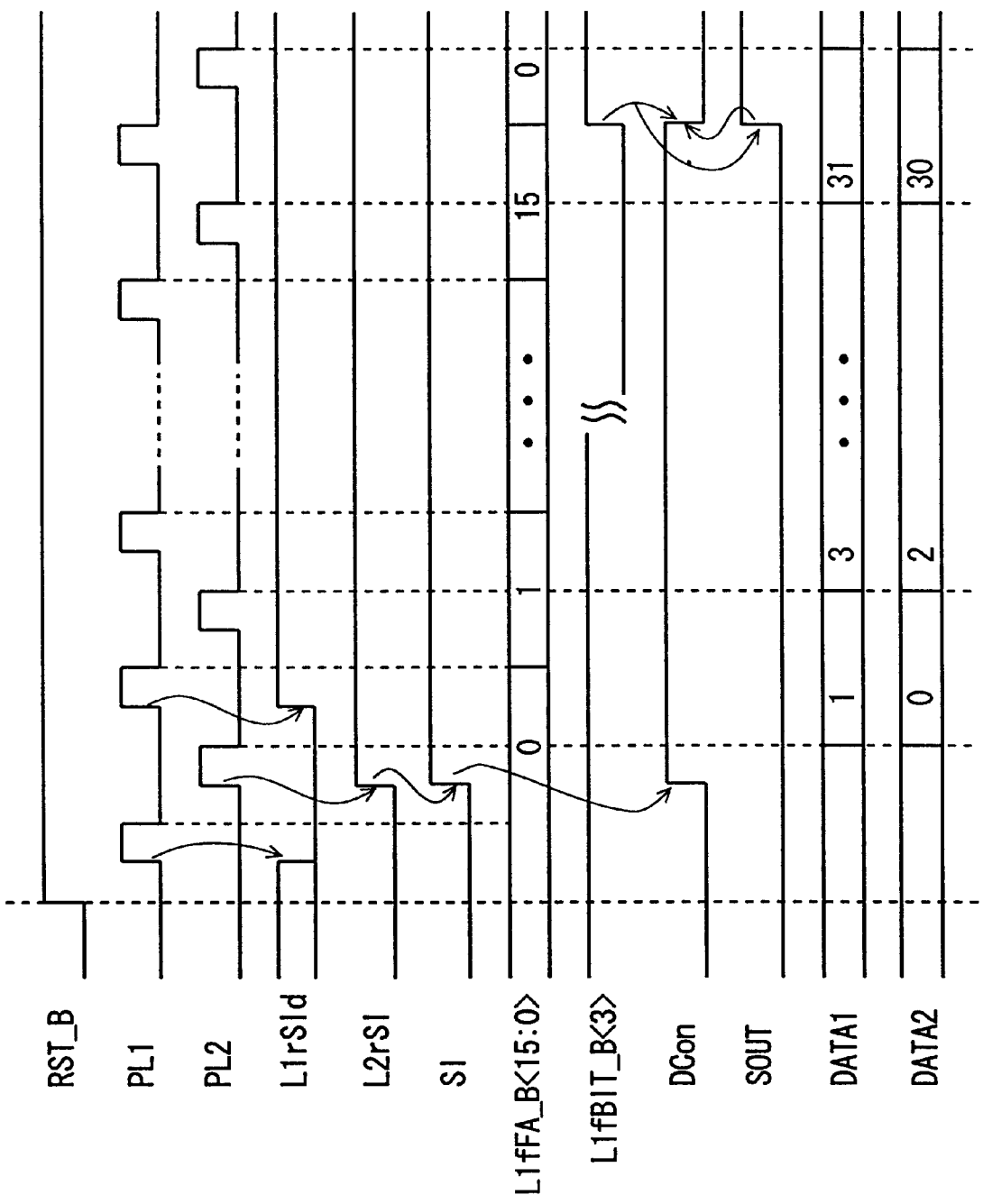

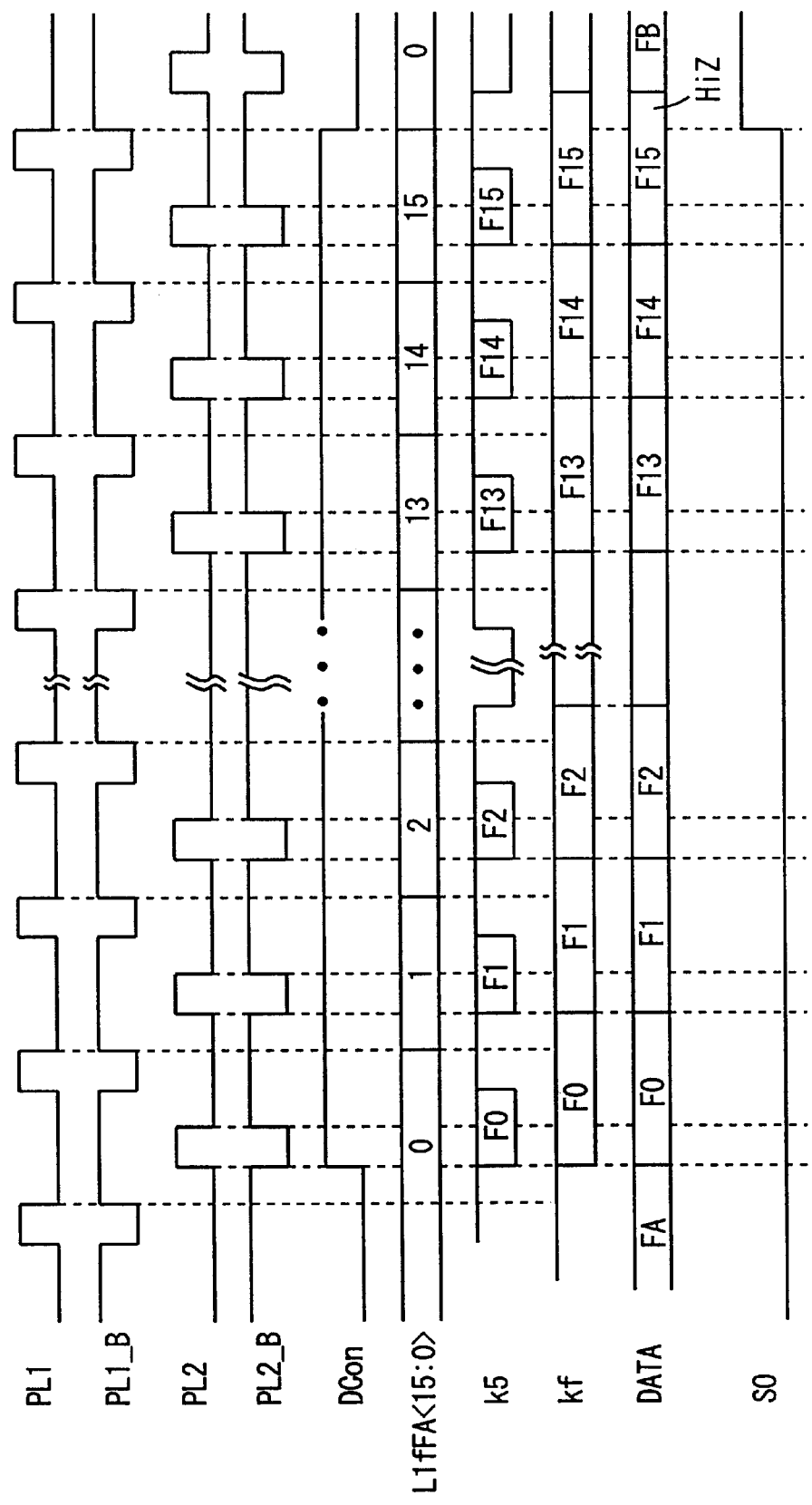

SEMICONDUCTOR INTEGRATED CIRCUIT DEVICE HAVING EFFICIENTLY ARRANGED LINK PROGRAM CIRCUITRY

BACKGROUND OF THE INVENTION

1. Field of the Invention

The present invention relates to a semiconductor integrated circuit device, and particularly to a semiconductor integrated circuit device having a link program circuit for programming an internal state of a core circuit with link elements. More particularly, the invention relates to an arrangement of programmable link elements in the semiconductor integrated circuit device.

2. Description of the Background Art

In a semiconductor integrated circuit device, a fuse program circuit (link circuit) is arranged for adjusting internal operation characteristics after manufacturing of the circuit device. By programming (blowing or no-blowing) fuse elements (link elements) in this fuse program circuit, variations in manufacturing parameters are compensated for to set the internal circuit characteristics optimum values, and further a defective bit in a storage device is repaired so that the manufacturing yield is improved. The fuse program circuit is generally referred to as an LT (Laser Trimming) link circuit because laser is generally used for programming the link elements (fuse elements).

A redundant circuit for repairing a defective bit is an example of the circuitry utilizing the LT link circuit, as is disclosed in Japanese Patent Laying-Open No. 11-31398. The defective bit repair circuit repairs a defective bit by programming a defective address with the link element to replace the circuit at the defective address with a redundant circuit. This LT link circuit is arranged for each fault repairing unit such as a row block.

The LT link circuit is used for adjusting the delay time of a delay circuit to optimize the operation timings of internal circuitry. In this case, the number of delay stages or the operation current is adjusted by programming the link elements, to adjust the timing of signals, resulting in an improved operation margin.

The semiconductor integrated circuit device produces an internal voltage for a specific internal operation from an external power supply voltage. Such internal voltages include a reference voltage defining an operation power supply current, and a reference voltage for determining the voltage level of an internal power supply voltage or an internal high voltage. When the voltage level of the reference voltage changes from a predetermined voltage level, internal operation conditions change so that intended operation characteristics cannot be achieved. For adjusting the voltage level of the reference voltage, the LT link circuit is arranged for such a circuit for generating the reference voltage.

As described above, the purpose of provision of the LT link circuit is not restricted to repairing of defective bits in the semiconductor memory device. LT link circuits are generally arranged in the semiconductor integrated circuit devices for compensating for variations in various operation conditions caused by variations in manufacturing parameters. The LT link circuit is generally arranged near a target circuit. This arrangement is employed for preventing complication of signal interconnection lines. Also, this arrangement is employed in the case of repairing defective bits, because a signal indicating use or nonuse of a redundant bit must be transmitted fast for fast repairing of the defective bits.

FIG. 57 shows an example of a structure of the conventional LT link circuit. In FIG. 57, an LT link circuit 1 includes: a P-channel MOS transistor (insulated gate field effect transistor) 1$a$ which is connected between a power supply node NDP and an internal node ND0, and receives on its gate a reset signal RST_B; and a link element 1$c$ and an N-channel MOS transistor 1$b$, which are connected in series between internal node ND0 and a ground node. N-channel MOS transistor 1$b$ receives reset signal RST_B on its gate.

LT link circuit 1 further includes: an inverter 1$d$ which inverts a signal on internal node ND0, and outputs program data FDATA; and a P-channel MOS transistor 1$e$ which receives program data FDATA received from inverter 1$d$ on a gate thereof, and selectively couples power supply node NDP to internal node ND0 electrically. Inverter 1$d$ and MOS transistor 1$e$ form a so-called half latch.

When reset signal RST_B is at L-level, MOS transistor 1$b$ is off, and MOS transistor 1$a$ is on, so that MOS transistor 1$a$ charges internal node ND0 to the power supply voltage level. Accordingly, inverter 1$d$ drives program data FDATA to the L-level so that P-channel MOS transistor 1$e$ is turned on, and inverter 1$d$ and MOS transistor 1$e$ latch program data FDATA.

When reset signal RST_B attains H-level, MOS transistor 1$a$ is turned off, and MOS transistor 1$b$ is turned on. When link element (fuse element) 1$c$ is blown off, internal node ND0 maintains H-level, and program data FDATA attains L-level. If link element 1$c$ is not blown, a path for current flowing from internal node ND0 to the ground node is present, and internal node ND0 attains L-level, and thereby program data FDATA generated from inverter 1$d$ attains H-level. In this state, MOS transistor 1$e$ is off.

Accordingly, when reset signal RST_B attains H-level, program data FDATA is set to a logical level corresponding to blowing/non-blowing of link element 1$c$. This program data FDATA is applied to a target circuit or a circuit of interest in the succeeding stage for achieving an intended internal circuit operation.

FIG. 58 shows, by way of example, a structure of a circuit using the LT (laser trimming) information. In FIG. 58, a reference voltage generating circuit for generating a reference voltage Vref is shown as an example of an internal circuit. In FIG. 58, the reference voltage generating circuit includes: a constant current source CRS connected between a power supply node NDP1 and an output node ND1; resistance elements R0–Rn connected in series between output node ND1 and the ground node; and N-channel MOS transistors TR1–TRn connected in parallel to resistance elements R1–Rn to receive program data FDATA1–FDATAn on their gates, respectively.

In the reference voltage generating circuit shown in FIG. 58, the voltage level of reference voltage Vref depends on a resistance value between output node ND1 and the ground node as well as a current I flowing from constant current source CRS. By selectively setting program data FDATA1–FDATAn to H-level or L-level by the LT link circuit, MOS transistors TR1–TRn are selectively turned on/off so that the resistance value between node ND1 and the ground node is adjusted. When all MOS transistors TR1–TRn are made conductive, resistance elements each R1–Rn attain a short-circuited state, and a state is achieved equivalently that only resistance element R0 is connected between output node ND1 and the ground node. In this state, reference voltage Vref is at the voltage level expressed by I·R0, where R0 represents a resistance value of resistance element R0.

When all MOS transistors TR0–TRn are off, the resistance value between output node ND1 and the ground node becomes equal to (R0+...+Rn), and reference voltage Vref is at the voltage level expressed by I·R, where R represents a combined resistance of series-connected resistance elements R0–Rn.

Therefore, by selectively turning on/off these MOS transistors TR1–TRn in accordance with program data FDATA1–FDATAn, the voltage level of reference voltage Vref can be adjusted to the optimum level, and can be adjusted so as to optimize the internal operation.

FIG. 59 schematically shows a whole structure of a semiconductor memory device as an example of the semiconductor integrated circuit device. The semiconductor memory device shown in FIG. 59 is an eRAM (embedded Dynamic Random Access Memory), which is integrated with a logic such as a processor on a common semiconductor chip.

In FIG. 59, the semiconductor memory device includes: memory cell arrays 2a and 2b each having a plurality of memory cells arranged in rows and columns; a row control portion 3 arranged between memory cell arrays 2a and 2b for performing operations related to row selection in memory cells 2a and 2b; data path portions 4a and 4b for transmitting data between the selected memory cells in memory cell arrays 2a and 2b and an external device such as a logic; a control portion 5 for controlling the operation of this semiconductor memory device in accordance with external control signals; and a power supply circuit portion 6 for producing an internal voltage required in the semiconductor memory device.

Row control portion 3 includes row decoders for selecting the memory cell rows in memory cell arrays 2a and 2b, a sense amplifier control circuit for controlling sense amplifier circuits that sense, amplify and latch the data of selected memory cells, and redundant row decoders for repairing a defective memory cell row. For adjusting the activation timing of the sense amplifier circuit, and for programming a defective row address, row control portion 3 is provided with LT link circuits 1 arranged near target circuits, respectively.

Each of data path portions 4a and 4b includes a write driver and a preamplifier arranged corresponding to each of memory cell arrays 2a and 2b for writing and reading data, a defective column repairing circuit for repairing a defective column, and a data input/output circuit forming an external interface. In each of data path portions 4a and 4b, the defective column repairing circuit usually repairs a defective column on a basis of an internal data line. Therefore, a redundant I/O line (spare I/O line) is arranged for a predetermined number of internal data lines (I/O lines). The defective column address program circuit is arranged for each of these redundant I/O lines. For programming a defective column address, LT link circuits 1 are likewise arranged in data path portions 4a and 4b.

Control portion 5 operates in accordance with the externally applied control signal and the address signal to produce signals for selecting a memory cell row in the semiconductor memory device, for selecting the memory cell column and for controlling write/read of data. In this control portion 5, LT link circuitry 1 is arranged for adjusting the generation timing of the internal control signal.

Power supply circuit portion 6 includes an internal voltage down converter for producing an internal power supply voltage from the external power supply voltage, a high-voltage generating circuit for generating a high voltage (boosted voltage) to be transmitted onto a selected word line, and a substrate bias generating circuit for generating a substrate bias voltage to be applied to a substrate region of the memory cell array. The voltage level of the internal power supply voltage to be produced depends on the reference voltage generated from the reference voltage generating circuit. For adjusting the voltage level of this reference voltage, LT link circuits 1 are arranged. For adjusting the current drive capability of the internal voltage down converter, which generates the internal power supply voltage, unit current drive transistors are selectively turned on, and LT link circuits 1 are utilized for this turn-on.

When generating a high voltage or a substrate voltage, the device utilizes a charge pump circuit, which performs a charge pump operation in response to a dock signal. In this case, LT link circuit 1 is utilized for adjusting a cycle period of the clock signal and/or the charge pump capability.

These LT link circuits are arranged as dose as possible to the target circuits for reducing the interconnection line lengths. As shown in FIG. 59, therefore, LT link circuits 1 are distributed substantially over an entire of the semiconductor memory device. LT link circuit 1 includes link element 1c, as shown in FIG. 57. An occupation area of link element 1c is larger than a layout area of a usual MOS transistor, resulting in a problem that the LT link circuits occupy a large area on the chip.

A laser or energy beam is used for programming a link element in LT link circuit 1. Since this laser beam is emitted from a portion outside the chip, another interconnection line cannot be disposed above this link element. This disadvantageously lowers the flexibility in interconnection layout. Particularly, in the case of eRAM, data bits to be input/output are greater in number so that it is extremely difficult to arrange LT link circuits 1 between the internal data lines in data path portions 4a and 4b particularly.

Although the eRAM is integrated with a logic such as a processor on a common semiconductor chip, other circuit blocks such as SRAM (Static Random Access Memory), a nonvolatile memory and an analog core for processing an analog signal are also integrated on the same semiconductor chip. Therefore, interconnection lines extending over the eRAM could not utilized as interconnection lines connecting the logic to the circuits blocks other than the eRAM, because the trimming must be effected on the LT link circuits arranged distributedly in the eRAM. Accordingly, the interconnection for the circuit blocks other than the eRAM must be made avoiding an area of the eRAM, resulting in disadvantageous increase in interconnection area and therefore chip area of the semiconductor integrated circuit device.

In LT link circuit 1, it is impossible to change program contents after the link elements are programmed with an energy beam such as the laser. Therefore, a program fault cannot be repaired if the program fault occurs in programming of many LT link circuits, which lowers the manufacturing yield. In particular, if many LT link circuits 1 are distributed on the semiconductor chip, many steps are required for programming all the LT link circuits so that the programming of the LT circuits takes a long time. Further, it would be difficult to program all the LT link circuits accurately, and the program defective is liable to occur. Once the signal timing or the like is set by the programming of the link elements, the re-adjustment thereof is impossible thereafter.

Each LT link circuit 1 is disposed near the target circuit, and the output signal (program data FDATA) thereof is applied only to the target circuit. This program information cannot be externally read out from the integrated circuit device. Therefore, it is impossible to detect whether each LT link circuit is accurately programmed or not.

Since the LT link circuit is programmed by the energy beam such as a laser beam in a destructive manner, it is impossible to change the program information in the semiconductor integrated circuit device after it is packaged.

SUMMARY OF THE INVENTION

An object of the invention is to provide a semiconductor integrated circuit device, in which restrictions on a layout of interconnection lines can be reduced without increasing an area occupied by the interconnection lines.

Another object of the invention is to provide a semiconductor integrated circuit device, in which restrictions on arrangement positions of LT link circuits are reduced, and flexibility in circuit layout is improved.

Still another object of the invention is to provide a semiconductor integrated circuit device, which allows reprogramming of LT information.

Yet another object of the invention is to provide a semiconductor integrated circuit device, which allows external monitoring of LT information.

Further another object of the invention is to provide a semiconductor integrated circuit device, which can improve yield of programming of LT information.

A further object of the invention is to provide a semiconductor integrated circuit device, which allows efficient programming of LT information.

A semiconductor integrated circuit device according to the present invention includes: at least one core circuit for performing a predetermined operation; an LT link circuitry arranged outside the core circuit for holding programmable internal information for setting an internal state of the core circuit; a transfer circuit for serially transferring the information held by the LT link circuitry to the core circuit upon power-up; a plurality of latch circuits disposed in the core circuit and arranged corresponding to predetermined internal circuits for latching corresponding internal information and applying the latched information to the corresponding predetermined internal circuit portions, respectively; and a transfer control circuit arranged in the core circuit for converting serial information transferred from the transfer circuit to parallel information, and transferring the parallel information to the plurality of latch circuits.

The LT link circuitry is arranged outside the core circuit, and the internal information held by the LT link circuitry is transferred to the latch circuits arranged corresponding to the internal circuits in the core circuit. Therefore, the link element is not disposed in the core circuit so that the interconnection layout area can be significantly reduced. The link element is not disposed in the core circuit, but merely the latch circuit is disposed therein, reducing an area penalty of the link elements. Arrangement of the LT link circuitry outside the core circuit significantly improves the flexibility in arrangement position of the LT link circuits so that the core circuit can be designed in an optimum manner to reduce the occupying area in the chip.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a timing chart representing an operation of the fuse block shown in FIG. 18;

FIG. 21 is a timing chart representing an operation of the sub-fuse block shown in FIGS. 20A and 20B;

DESCRIPTION OF THE PREFERRED EMBODIMENTS

First Embodiment

Figure 1:
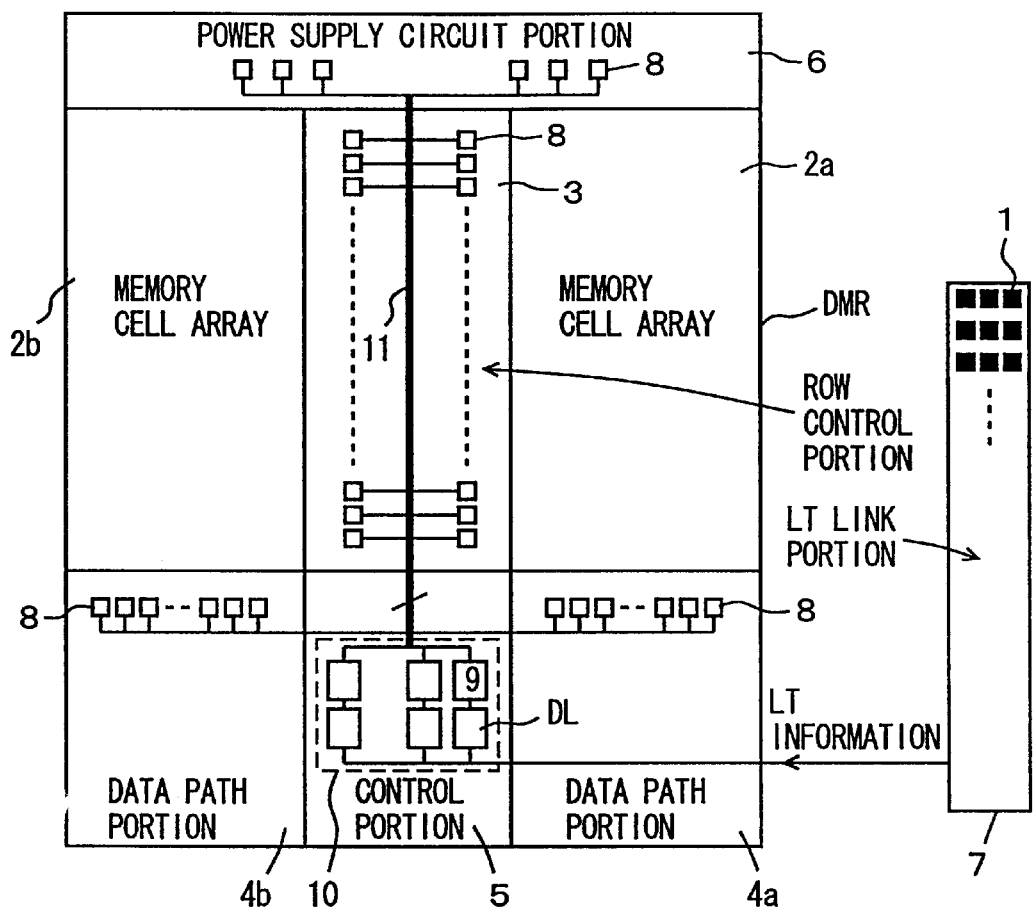
FIG. 1 schematically shows a whole structure of a semiconductor integrated circuit device according to a first embodiment of the invention.

FIG. 1 schematically shows a whole structure of a semiconductor integrated circuit device according to a first embodiment of the present invention. In FIG. 1, the semiconductor integrated circuit device includes a DRAM macro (core circuit) DMR, and an LT link portion 7 arranged outside DRAM macro DMR. DRAM macro DMR and LT link portion 7 are integrated on a common semiconductor chip. In LT link portion 7, LT link circuits 1 are concentratedly arranged.

DRAM macro DMR includes memory cell arrays 2a and 2b, a row control portion 3, data path portions 4a and 4b, a control portion 5 and a power supply circuit portion 6, similarly to the conventional circuit device. For these circuit portions, latch circuits (D-latches) 8 are arranged in place of conventional LT circuits.

Control portion 5 includes a transfer control circuit 10 for converting LT information (program information) serially transferred from LT link portion 7 to parallel information for transference via a multi-bit bus 11. Transfer control circuit 10 includes a plurality of stages each having a latch circuit (D-latch) 9 and a shift latch DL for the serial-parallel conversion. In transfer control circuit 10, the sets of shift latch DL and latch circuit (D-latch) 9 are arranged corresponding in number to the bus width of multi-bit signal bus 11.

In LT link portion 7, LT link circuits 1 including LT link elements are arranged, and programming of LT link circuits 1 is executed. In DRAM core DMR, latch circuits 8 and 9 as well as shift latches DL are arranged, and signal interconnection lines can be arranged to these latch circuits 8 and 9 as well as shift latches DL. Therefore, the flexibility in layout of signal interconnection in DRAM core DMR is significantly improved. Since LT link circuits 1 are arranged concentratedly in LT link portion 7, it is not necessary to consider the layout of internal peripheral interconnection lines of the DRAM core circuit when LT link circuits 1 are concentratedly arranged, and LT link circuits 1 can be arranged efficiently.

Figure 2:
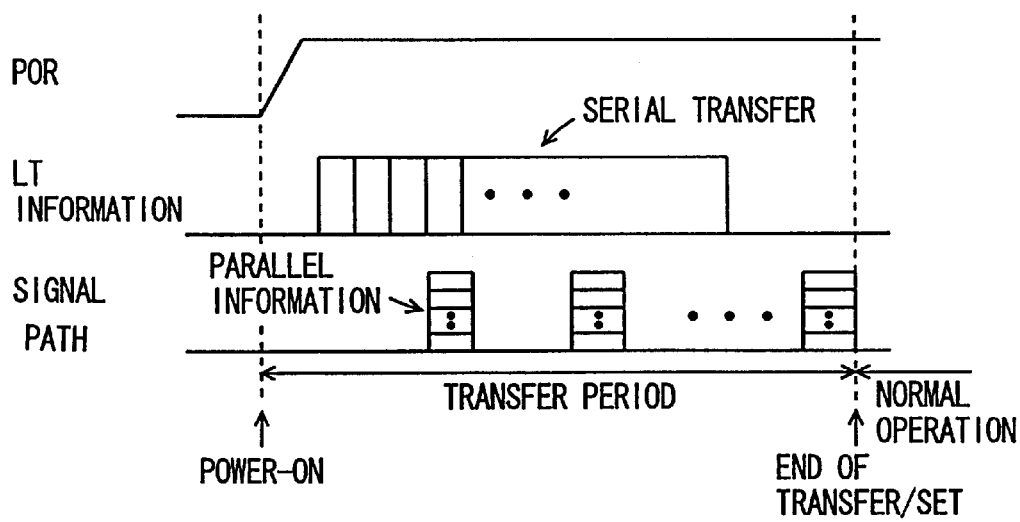
FIG. 2 is a timing chart representing an LT link information transferring operation of the semiconductor integrated circuit device shown in FIG. 1.

FIG. 2 is a timing chart representing a transfer operation of LT information (information programmed in the LT link circuits) of the semiconductor integrated circuit device shown in FIG. 1. Upon power-on, a power-on detection signal POR becomes active. After this power-on, LT link portion 7 serially transfers the information programmed in LT link circuits 1 to transfer control circuit 10. The LT information transferred serially is latched by latch circuits 9 arranged in transfer control circuit 10. In transfer control circuit 10, when latch circuit 9 latches the LT information of a predetermined number of bits, the latch circuit 9 transfers the LT information via multi-bit signal bus 11 to latch circuits 8, and particularly transfers an LT information in a unit of multiple bits. Upon transferring the LT information, clock signals for the latch circuits are successively activated (not shown), and the LT information stored in LT link circuits 1 is stored in corresponding latch circuits 8.

When all the LT information programmed in LT link circuits 1 in LT link portion 7 is transferred, the transfer operation ends after a transfer end instructing signal as will be described later is produced and transfer control circuit 10 transfers the final parallel LT information via multi-bit signal bus 11. After the end of this transfer of the LT information via multi-bit signal bus 11, a normal access operation is allowed in DRAM macro DMR. Since the transfer of LT information from LT link portion 7 to latch circuits 8 in DRAM macro DMR is automatically executed within the semiconductor integrated circuit device in response to each power-on, a load for control of a logic such as a processor arranged outside DRAM macro DMR is reduced. The transfer of LT link information is performed merely by externally applying a (power-on) reset signal (transfer operation instruction) from an outside of DRAM macro DMR.

By transferring the LT link information in parallel via multi-bit signal bus 11, the latch circuits provided for transfer in transfer control circuit 10 can be smaller in number as compared to the case of serially transferring the LT link information. In the case of serially transferring the LT link information in DRAM macro DMR, a latch for transferring and holding must be arranged for each latch circuit so that the transfer control circuit occupies a larger area, and the chip area increases.

Further, the serial transfer of LT information from LT link portion 7 to transfer control circuit 10 reduces the number of signal lines provided for transferring the LT link information. The transfer of LT information from LT link portion 7 to transfer control circuit 10 may be performed in. such a manner that the LT link information of multiple bits is serially transferred, and then is converted by transfer control circuit 10 to parallel information, which in turn is then transferred via multi-bit signal bus 11.

By arranging LT link portion 7 outside DRAM core DMR, metal interconnection lines can be arranged over and above DRAM core DMR without consideration to the arrangement of LT link elements. Thus, the interconnection layout can be simplified, and interconnections to blocks other than DRAM core DMR can be achieved in an efficient manner. Also, in DRAM macro DMR, an internal data bus of a wide bit width can be efficiently arranged.

Figure 3:
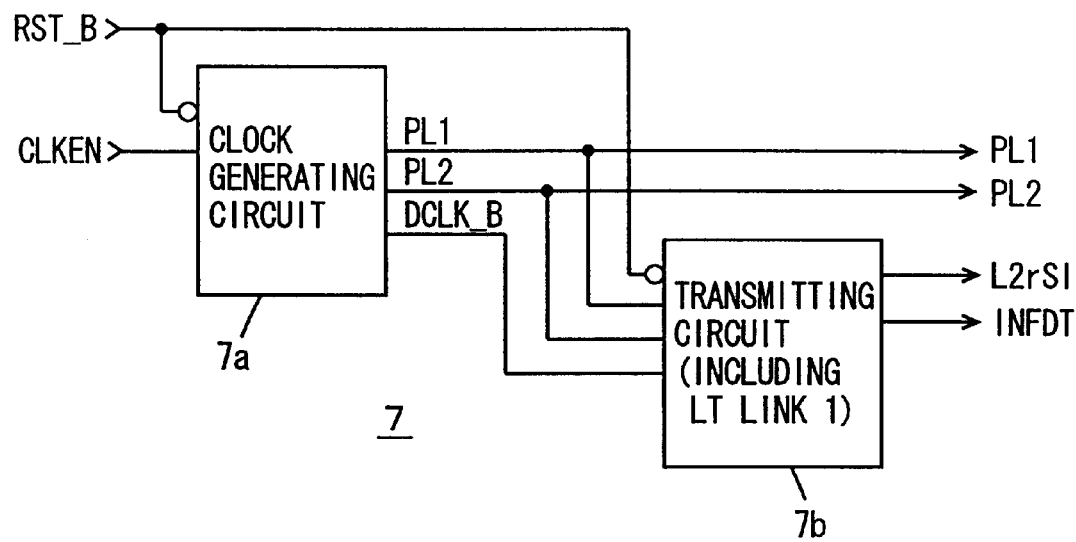
FIG. 3 schematically shows a structure of an LT link portion shown in FIG. 1.

FIG. 3 schematically shows a structure of LT link portion 7 shown in FIG. 1. In FIG. 3, LT link portion 7 includes: a clock generating circuit 7a which receives a reset signal RST_B activated in response to the power-on and a clock enable signal CLKEN being active during a transfer period, and generates clock signals PL1 and PL2 for LT information transfer as well as frequency-divided clock signal DCLK_B; and a transmitting circuit 7b which is activated in response to activation of reset signal RST_B, and operates in accordance with transfer clock signals PL1 and PL2 as well as frequency-divided dock signal DCLK_B to serially transmit LT information INFDT and also to produce a clock signal L2rSI for serial-parallel conversion.

Clock generating circuit 7a performs an oscillation operation to produce clock signals PL1, PL2 and DCLK_B while reset signal RST_B is at H-level, and clock enable signal CLKEN is active at H-level.

Transmitting circuit 7b includes LT link circuits 1, and serially transfers LT information INFDT programmed in LT link circuits 1 in accordance with transfer clock signals PL1 and PL2.

Transmitting circuit 7b activates transfer start instructing signal L2rSI at the start of transfer of LT information, and signals transfer control circuit 10 of transmission of the LT information.

The reset signal RST_B, which is applied from an outside of DRAM macro DMR, may be a power-on detecting signal POR, or may be activated in response to power-on detection signal POR and/or a system reset signal.

Figure 4:
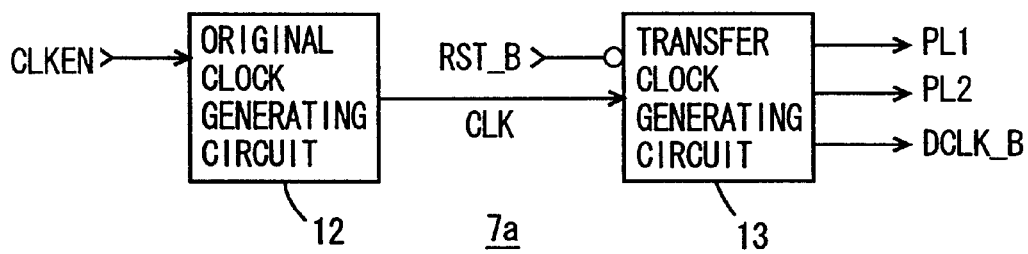
FIG. 4 schematically shows a structure of a clock generating circuit shown in FIG. 3.

FIG. 4 schematically shows a structure of clock generating circuit 7a shown in FIG. 3. In FIG. 4, clock generating circuit 7a includes: an original clock generating circuit 12 which is activated to produce an original dock signal CLK at a predetermined cycle when clock enable signal CLKEN is active; and a transfer dock generating circuit 13 which is activated to produce clock signals PL1, PL2 and DCLK_B in accordance with original clock signal CLK when reset signal RST_B is inactive. Original clock generating circuit 12 is essentially a self-running oscillating circuit, and performs the oscillation at a predetermined cycle to produce original clock signal CLK when clock enable signal CLKEN is active. Transfer clock generating circuit 13 is activated to divide the frequency of original clock signal CLK when reset signal RST_B is inactive, and alternately activates transfer clock signals PL1 and PL2 in accordance with the frequency divided signal.

Figure 5:
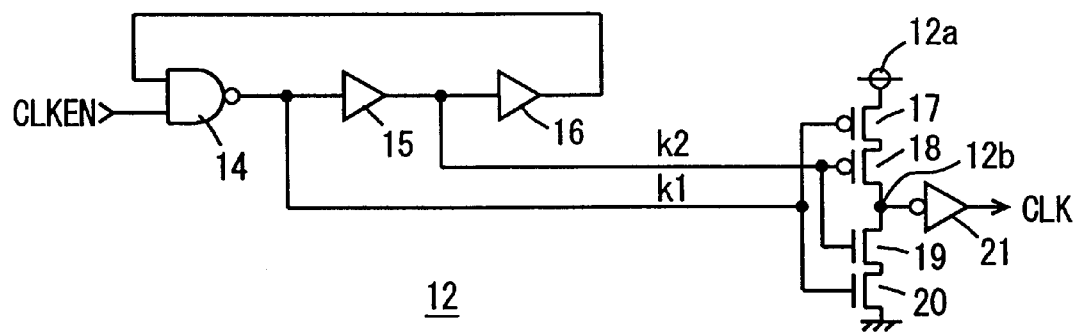
FIG. 5 shows a structure of an original clock generating circuit shown in FIG. 4.

FIG. 5 shows, by way of example, a structure of the original clock generating circuit 12 shown in FIG. 4. In FIG. 5, original clock generating circuit 12 includes an NAND circuit 14 receiving clock enable signal CLKEN on a first input thereof, a buffer circuit 15 for buffering an output signal k1 of NAND circuit 14 to produce a signal k2, and a buffer circuit 16 for buffering output signal k2 of buffer circuit 15 to application to a second input of NAND circuit 14. These buffer circuits 15 and 16 have predetermined delay times, respectively. When clock enable signal CLKEN is active, NAND circuit 14 as well as buffer circuits 15 and 16 form a ring oscillator.

Original clock generating circuit 12 further includes a P-channel MOS transistors 17 and 18 connected in series between a power supply node 12a and an internal node 12b and receiving signals k1 and k2 on their respective gates, N-channel MOS transistors 19 and 20 connected in series between node 12b and the ground node and receiving signals k2 and k1 on their respective gates, and inverter circuit 21 inverting a signal on node 12b to produce original clock signal CLK.

Figure 6:
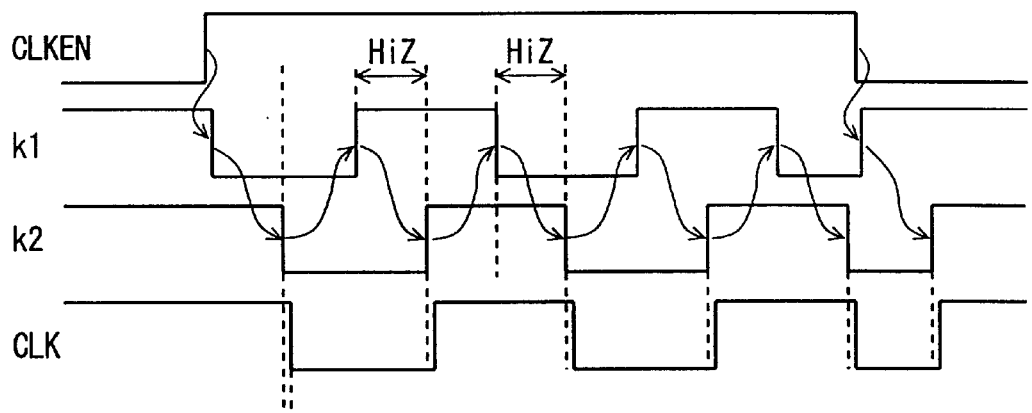
FIG. 6 is a signal waveform diagram representing an operation of the original clock generating circuit shown in FIG. 5

The circuit formed of MOS transistors 17–20 outputs a signal at a logical level opposite to the logical level of signals k1 and k2 when these signals k1 and k2 are at the same logical level. When the signals k1 and k2 are at different logical levels from each other, the circuit formed of MOS transistors 17–20 attains an output high-impedance state. The operation of original clock generating circuit 12 shown in FIG. 5 will now be described with reference to a signal waveform diagram of FIG. 6.

Clock enable signal CLKEN is active during a period for transferring LT link information. At the end of transfer of LT link information, an end instructing signal is produced, and a signal corresponding to clock enable signal CLKEN is deactivated, as will be described later.

When clock enable signal CLKEN is at L-level, output signal k1 of NAND circuit 14 is at H-level, and output signal k2 of buffer circuit 15 is also at H-level. Therefore, MOS transistors 19 and 20 are on, and MOS transistors 17 and 18 are off so that original clock signal CLK generated from inverter circuit 21 maintains H-level.

When clock enable signal CLKEN rises to H-level, NAND circuit 14 operates as an inverter circuit. Upon rising of clock enable signal CLKEN, the output signal of buffer circuit 16 is at H-level, and therefore output signal k1 of NAND circuit 14 falls to L-level. When the delay time of buffer circuit 15 elapses thereafter, output signal k2 of buffer circuit 15 falls to L-level. When the signals k1 and k2 are at L- and H-levels, respectively, MOS transistors 18 and 20 are off, and MOS transistors 17 and 19 are on so that node 12*b* is in the high-impedance state, and original clock signal CLK generated from inverter 21 maintains H-level.

When both signals k1 and k2 attain L-level, MOS transistors 17 and 18 are on, and MOS transistors 19 and 20 are off so that node 12*b* is at H-level, and therefore original clock signal CLK generated from inverter circuit 21 falls to L-level.

When the delay times of buffer circuit 16 and NAND circuit 14 elapse after output signal k2 of buffer circuit 15 lowers to L-level, the signal k1 rises to H-level, and MOS transistor 17 is responsively turned off. Since MOS transistor 19 is off, node 12*b* attains the high-impedance state again. In this state, original clock signal CLK maintains L-level.

When output signal k2 of buffer circuit 15 rises to H-level, both MOS transistors 19 and 20 are turned on, and both MOS transistors 17 and 18 are turned off so that node 12*b* attains L-level, and original clock signal CLK generated from inverter circuit 21 rises to H-level.

When output signals k1 and k2 are at the same logical level, original clock signal CLK is at the same logical level as that of the signals k1 and k2. When the signals k1 and k2 are at different logical levels from each other, node 12*b* attains the high-impedance state, and maintains the last state. By entering the node 12*b* into the high-impedance state, it is possible to prevent flowing of a through current in the circuit formed of MOS transistors 17–20, and node 12*b* can be rapidly changed in accordance with the signals k1 and k2 so that original clock signal CLK having a steep waveform is produced. The cycle period of original clock signal CLK depends on the delay times in buffer circuits 15 and 16 as well as NAND circuit 14, and fast original dock signal CLK can be accurately produced.

When clock enable signal CLKEN falls to L-level, output signal k1 of NAND circuit 14 is fixed to H-level. When a predetermined time elapses thereafter, output signal k2 of buffer circuit 15 is fixed to H-level, and original clock signal CLK is also fixed to H-level. In accordance with thus generated original dock signal CLK, the LT information is transferred.

Figure 7:
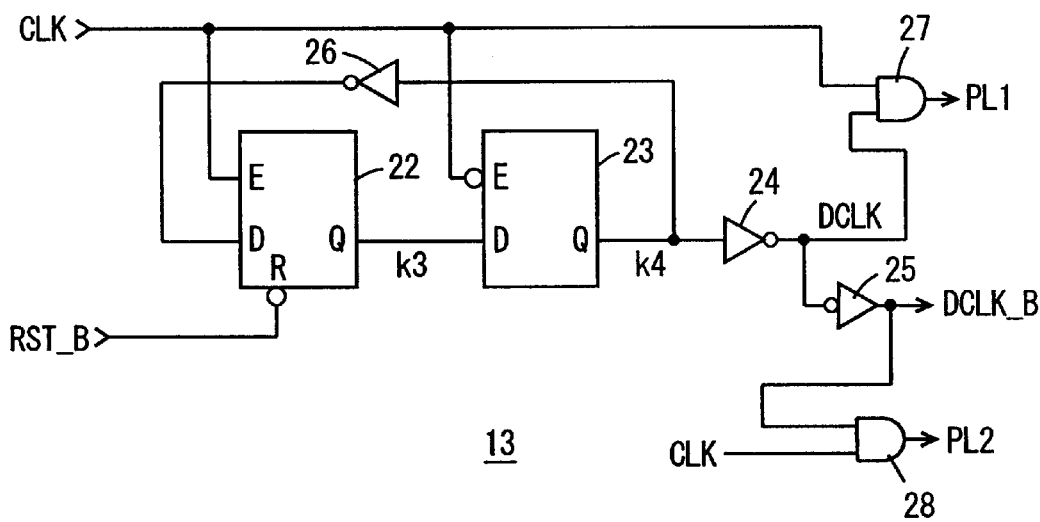
FIG. 7 shows a structure of a transfer clock generating circuit shown in FIG. 4.

FIG. 7 shows a structure of transfer clock generating circuit 13 shown in FIG. 4. In FIG. 7, transfer clock generating circuit 13 includes: cascaded two D-latches 22 and 23; an inverter circuit 24 for inverting a signal k4 generated from an output Q of D-latch 23; an AND circuit 27 receiving an output clock signal DCLK of inverter circuit 24 and original dock signal CLK to produce transfer dock signal PL1; an inverter circuit 25 inverting an output signal DCLK of inverter circuit 24 to produce a frequency-divided clock signal DCLK_B; and an AND circuit 28 receiving frequency-divided clock signal DCLK_B generated from inverter circuit 25 and original clock signal CLK to produce transfer clock signal PL2.

D-latch 22 has a clock input E for receiving original clock signal CLK, a reset input R for receiving reset signal RST_B, a data input D for receiving output signal k4 of D-latch 23 via an inverter circuit 26, and an output Q for outputting an output signal k3. D-latch 23 has a clock input E for receiving original clock signal CLK, a data input D for receiving signal k3 from output Q of D-latch 22 and an output Q.

D-latch 22 attains a through state when original clock signal CLK is at H-level to take in a signal applied to data input D. When original clock signal CLK is at L-level, D-latch 22 attains a latch state. D-latch 23 attains the through state to take in output signal k3 of D-latch 22 when original clock signal CLK is at L-level. When original clock signal CLK attains H-level, D-latch 23 attains a latch state. An inverted signal of output signal k4 of D-latch 23 is applied to data input D of D-latch 22. Therefore, D-latches 22 and 23 form a frequency dividing circuit, and produces frequency-divided clock signal DCLK by frequency division of original clock signal CLK.

Transfer clock signal PL1 attains H-level when both original clock signal CLK and frequency-divided clock signal DCLK are at H-level. Transfer clock signal PL2 attains H-level when complementary frequency-divided clock signal DCLK_B is at H-level and original clock signal CLK is at H-level. Therefore, transfer clock signals PL1 and PL2 are alternately generated (activated) in accordance with original clock signal CLK.

Figure 8A:
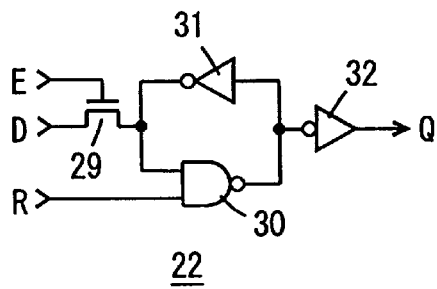
FIG. 8A shows a structure of a resettable D-latch shown in FIG. 7.

FIG. 8A shows an example of a structure of D-latch 22 shown in FIG. 7. In FIG. 8A, D-latch 22 includes an N-channel MOS transistor (transfer gate) 29 that is turned on to pass the signal applied to data input D when the signal applied to clock input E is at H-level, an NAND circuit 30 that receives a signal applied via transfer gate 29 and a signal applied to reset input R, an inverter 32 that inverts the output signal of NAND circuit 30 for transmission to output Q, and an inverter 31 that inverts the output signal of NAND circuit 30 for application to a second input of NAND circuit 30.

In this D-latch 22, when the signal applied to dock input E, i.e., original clock signal CLK is at H-level, transfer gate 29 is turned on to take in the signal applied to data input D. When the signal applied to reset input R, i.e., reset signal RST_B is at H-level, NAND circuit 30 operates as an inverter, and NAND circuit 30 and inverter circuit 31 form an inverter latch. Therefore, when the signal applied to clock input E, i.e., original clock signal CLK attains H-level, D-latch 22 attains the through state so that the signal applied to data input D is taken and transmitted to output Q. When the signal (original clock signal CLK) applied to clock input E attains L-level, transfer gate 29 is turned off, and D-latch 22 attains the latch state.

Figure 8B:
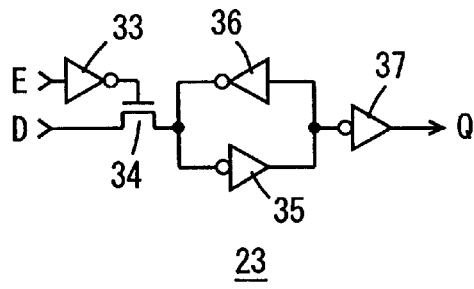
FIG. 8B shows a structure of the D-latch shown in FIG. 7.

FIG. 8B shows an example of a structure of D-latch 23 shown in FIG. 7. In FIG. 8B, D-latch 23 includes an inverter 33 that inverts the signal (original clock signal CLK) applied to clock input E, a transfer gate (N-channel MOS transistor) 34 that is turned on to pass the signal applied to data input D when the output signal of inverter 33 is at H-level, an inverter 35 that inverts the signal passed through transfer gate 34, an inverter 36 that inverts and transmits the output signal of inverter 35 to an input of inverter 35, and an inverter 37 that inverts and transmits the output signal of inverter 35 to output Q.

The structure and the operation manner of D-latch 23 are the same as those of D-latch 22 having the reset function, except for that reset input R is not employed. When original clock signal CLK applied to clock input E is at L-level, transfer gate 34 is turned on, and the signal applied to data input D is passed to output Q, and is latched. When the signal applied to clock input E attains H-level, transfer gate 34 is turned off, and D-latch 23 enters the latch state.

Figure 9:
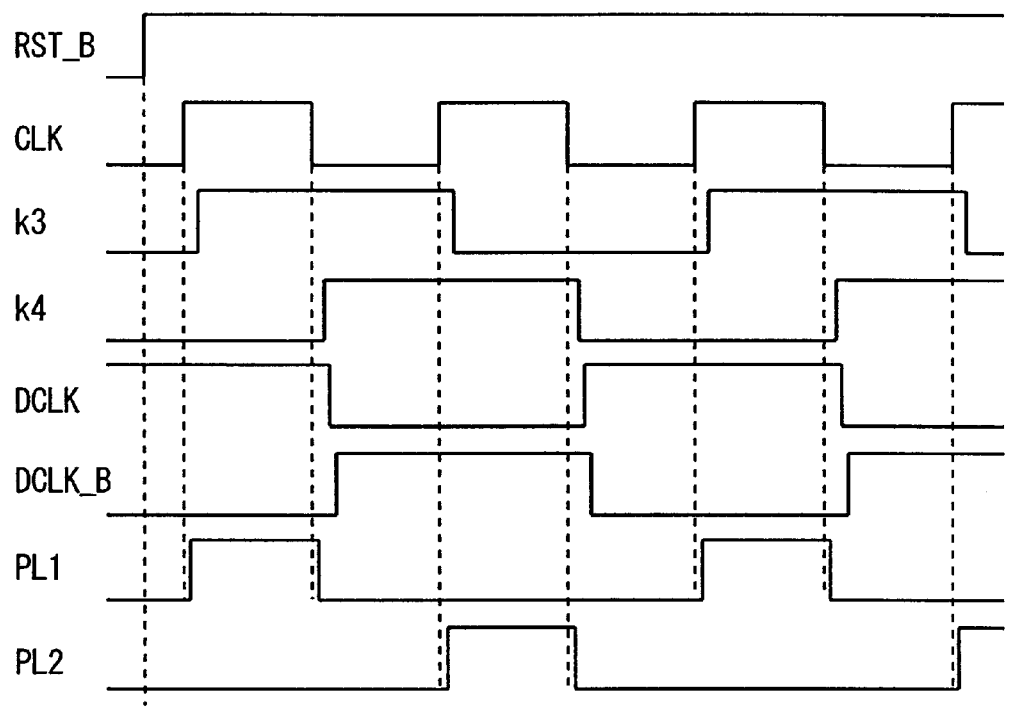
FIG. 9 is a timing chart representing an operation of the transfer clock generating circuit shown in FIG. 7.

FIG. 9 is a signal waveform diagram representing an operation of transfer clock generating circuit 13 shown in FIG. 7. Referring to FIG. 9, an operation of transfer clock generating circuit 13 shown in FIG. 7 will now be described below.

When reset signal RST_B is at L-level, the output signal of NAND circuit 30 in D-latch 22 is at H-level, and output signal k3 of D-latch 22 is at L-level. While original clock signal CLK is at L-level, D-latch 23 is in the through state (see FIG. 8B), and the output signal k4 of D-latch 23 is also at L-level. Therefore, frequency-divided clock signal DCLK is at H-level, and complementary frequency-divided clock signal DCLK_B is at L-level.

When reset signal RST_B attains H-level after the power-on, D-latch 22 is released from the reset state, and NAND circuit 30 shown in FIG. 8A operates as an inverter circuit. When original clock signal CLK attains H-level, D-latch 22 attains the through state to take in and output the output signal k4 of D-latch 23 received via inverter 26. Therefore, the output signal k3 of D-latch 22 rises to H-level in response to the rising of original clock signal CLK. In this state, D-latch 23 attains the latch state, and keeps its output signal k4 at L-level so that frequency-divided clock signal DCLK maintains H-level, and complementary frequency-divided clock signal DCLK_B maintains L-level. When original clock signal CLK attains H-level, transfer clock signal PL1 generated from AND circuit 27 rises to H-level, and transfer clock signal PL2 maintains L-level.

When original clock signal CLK falls to L-level, D-latch 22 attains the latch state, and keeps its output signal k3 at H-level. D-latch 23 attains the through state, and raises its output signal k4 to H-level in accordance with the output signal k3 of D-latch 22. In response to the rising of the output signal k4 of D-latch 23, frequency-divided clock signal DCLK generated from inverter circuit 24 falls from H-level to L-level, and complementary frequency-divided clock signal DCLK_B rises from L-level to H-level. In response to this falling of original clock signal CLK, transfer clock signal PL1 falls to L-level.

When original clock signal CLK rises to H-level again, D-latch 22 takes in the signal at L-level applied via inverter circuit 26, to drive the output signal k3 thereof to L-level. When original clock signal CLK rises, transfer dock signal PL2 generated from AND circuit 28 rises to H-level because complementary frequency-divided clock signal DCLK_B is at H-level. When original clock signal CLK falls to L-level, the transfer clock signal PL2 falls to L-level again. In response to the falling of original clock signal CLK, D-latch 23 attains the through state, and the output signal k4 of D-latch 23 falls to L-level in accordance with the output signal k3 of D-latch 22. Accordingly, frequency-divided clock signal DCLK attains H-level, and complementary frequency-divided clock signal DCLK_B attains L-level.

Thereafter, the above operations are repeated while the original clock signal CLK is being generated. More specifically, D-latches 22 and 23 produce the signal by bi-dividing the frequency of original clock signal CLK, and transfer clock signals PL1 and PL2 are alternately generated in accordance with frequency-divided clock signals DCLK and DCLK_B at a doubled period of original clock signal CLK. Transmitting circuit 7b (see FIG. 3) in the LT link portion serially transmits the LT information, and the transfer control circuit converts the serially transferred LT information to the parallel information.

Figure 10:
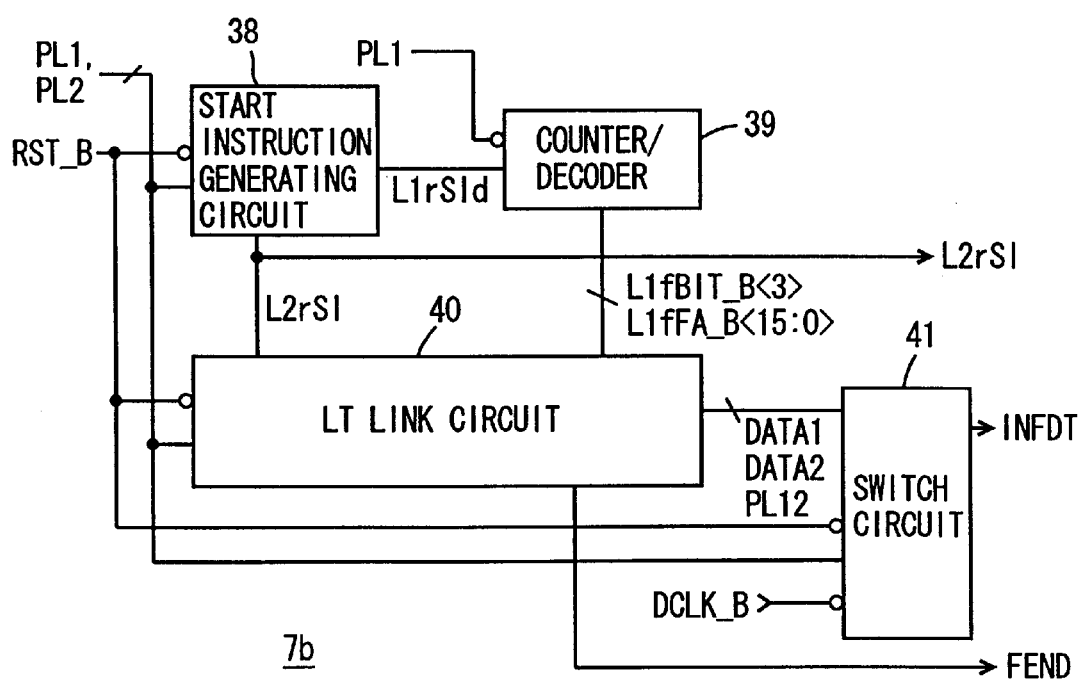
FIG. 10 schematically shows a structure of a transmitting circuit shown in FIG. 3.

FIG. 10 schematically shows a structure of transmitting circuit 7b shown in FIG. 3. In FIG. 10, transmitting circuit 7b includes: a start instruction generating circuit 38 that receives transfer clock signals PL1 and PL2 as well as reset signal RST_B, and produces LT information transfer start instructing signal L2rSI and count operation start instructing signal L1rSId; a counter/decoder 39 that counts transfer clock signal PL1 in accordance with count operation start instructing signal L1rSId received from start instruction generating circuit 38, and decodes the count; an LT link circuit group 40 that successively outputs the LT information in accordance with transfer clock signals PL1 and PL2 in response to transfer start instructing signal L2rSI generated from start instruction generating circuit 38; and a switch circuit 41 that converts LT information DATA1 and DATA2 output from LT link circuit group 40 to serial data (LT information) INFDT in accordance with a combined transfer clock signal PL12.

LT link circuit group 40 includes, for example, 16 fuse blocks. These 16 fuse blocks are successively selected for successively outputting the respective program data. Each fuse block has two sub-fuse blocks each including 16 LT link circuits, and thus includes 32 LT links in total. The program information of these 32 LT link circuits is successively read in parallel with two data of program information DATA1 and DATA2 being a unit, and is transferred to the transfer control circuit after being converted to serial information INFDT by switch circuit 41.

Counter/decoder 39 decodes the count of the counter to produce a select signal N1fFA_B<15:0> of 16 bits for selecting 16 (i.e., even-numbered or odd-numbered) fuses (link elements) in one fuse block. Counter/decoder 39 applies a highest count bit L1fBIT_B<3> of the count of 4 bits to LT link circuit group 40, and this highest count bit L1fBIT_B<3> is successively transferred through the fuse blocks, and a read end instructing signal FEND is output upon completion of reading of the LT information in the final fuse block.

In this transmitting circuit 7b, LT link circuit group 40 stores the information indicating the internal state of DRAM macro DMR by programming the link elements of LT link circuits. When transfer clock signals PL1 and PL2 are generated after power-on, start instruction generating circuit 38 produces start instructing signals L1rSId and L2rSI to activate counter/decoder 39 and LT link circuit group 40. In accordance with transfer clock signal PL1, select signals L1fFA_B<15:0> generated from counter/decoder 39 are successively activated, and the LT link circuits in the fuse blocks of LT link circuit group 40 are successively selected, and internal LT information DATA1 and DATA2 are read out in parallel. After the power-on, counter/decoder 39 performs the count/decode operation to produce the LT link select signal, and responsively, the program information of the LT link circuits is successively read out, and is successively transferred. Completion of the reading of LT link information from the final fuse block is detected by successively transferring the highest count bit L1fBIT_B<3> from counter/decoder 39 through the fuse blocks. Transfer end instructing signal FEND stops generation of original clock signal CLK, as will be described later, and thereby a current consumption due to internal generation of the clock is reduced. Structures of each part will now be briefly described.

Figure 11:
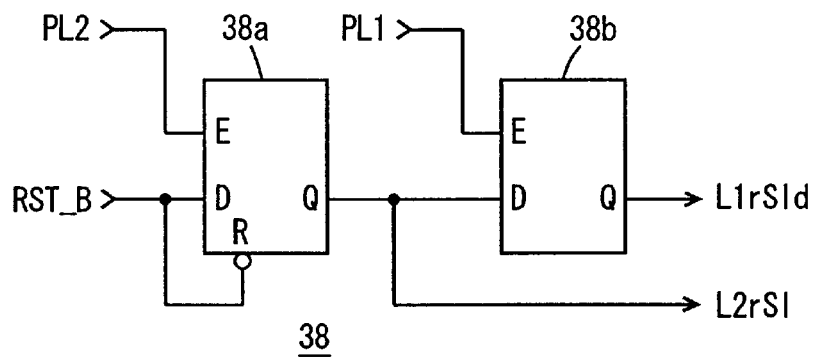
FIG. 11 schematically shows a structure of a start instruction generating circuit shown in FIG. 10.

FIG. 11 schematically shows a structure of start instruction generating circuit 38 shown in FIG. 10. In FIG. 11, start instruction generating circuit 38 includes: a D-latch 38a which takes in and latches reset signal RST_B in accordance with transfer clock signal PL2, and outputs transfer start instructing signal L2rSI from its output Q; and a D-latch 38b which takes in and latches transfer start instructing signal L2rSI output from D-latch 38a in accordance with transfer clock signal PL1, and produces count operation start instructing signal L1rSId. D-latch 38a has the same structure as D-latch 22 shown in FIG. 8A, and attains the through state when transfer clock signal PL2 applied to its clock input E is at H-level. When transfer dock signal PL2 is at L-level, D-latch 38a attains the latch state.

Figure 12:
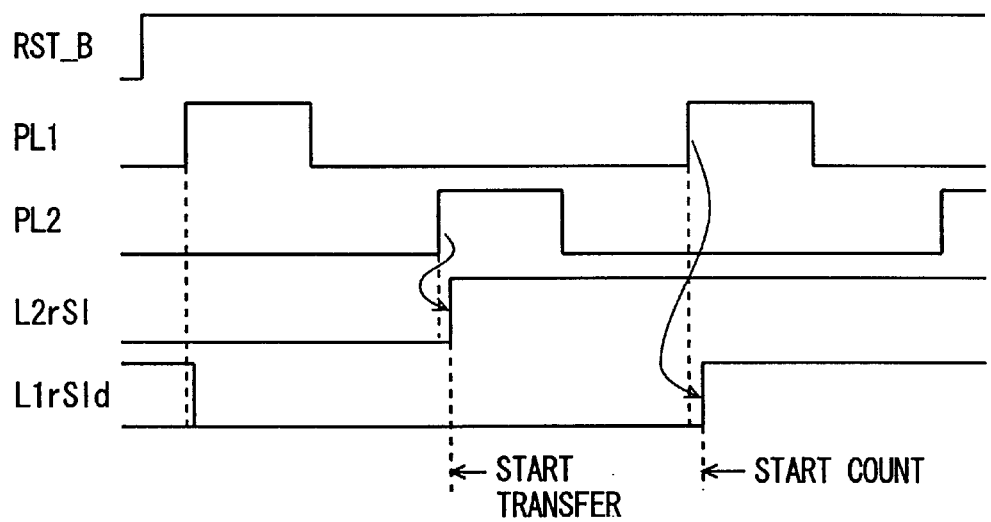
FIG. 12 is a timing chart representing an operation of the start instruction generating circuit shown in FIG. 11.

D-latch 38b has a structure equivalent to that of D-latch 23 shown in FIG. 8E, except for that inverter 33 is not employed. D-latch 38b attains the through state when transfer clock signal PL1 attains H-level, and attains the latch state when transfer clock signal PL1 attains L-level. Then, an operation of start instruction generating circuit 38 shown in FIG. 11 will now be described with reference to a signal waveform diagram of FIG. 12.

When the power supply voltage becomes stable after power-on, externally applied reset signal RST_B rises from L-level to H-level (e.g., in response to power-on detection signal POR). When reset signal RST_B is at L-level, D-latch 38a is in the reset state, and transfer start instructing signal L2rSI maintains L-level.

When reset signal RST_B rises to H-level, original clock signal CLK is generated, as already described with reference to FIGS. 3 to 9, and transfer clock signals PL1 and PL2 are alternately generated. First, transfer clock signal PL1 rises to H-level. Responsively, D-latch 38b attains the through state to pass transfer start instructing signal L2rSI at L-level so that count operation start instructing signal L1rSId is reset to L-level. In this state, since transfer clock signal PL2 maintains L-level, D-latch 38a is in the latch state. Also, transfer start instructing signal L2rSI maintains the reset state at L-level.

When transfer clock signal PL2 rises to H-level, D-latch 38a attains the through state, and reset signal RST_B is at H-level so that transfer start instructing signal L2rSI attains H-level, and the transfer operation starts in LT link circuit group 40. In this state, transfer clock signal PL1 is at L-level, D-latch 38b is in the latch state, and count operation start instructing signal L1rSId maintains L-level.

After transfer operation start instructing signal L2rSI rises to H-level, transfer clock signal PL1 rises to H-level again. Responsively, D-latch 38b attains the through state and count operation start instructing signal L1rSId attains H-level. In response to this activation (H-level) of operation start instructing signal L1rSId, counter/decoder 39 starts counting of transfer clock signal PL1. More specifically, in accordance with an initial value of counter/decoder 39, the program information of the LT link is read out in LT link circuit group 40. Then, counter/decoder 39 performs the count operation, and the program information of the subsequent LT link is read out. Thereafter, the above operation is repeated while transfer clock signals PL1 and PL2 are generated. When transfer of all the LT information is completed, transfer clock signals PL1 and PL2 are no longer generated, and D-latches 38a and 38b attain the latch state.

Although not shown clearly in FIG. 11, these D-latches 38a and 38b may be structured to be reset to the initial state in response to transfer end instructing signal FEND upon completion of the transfer operation.

Figure 13:
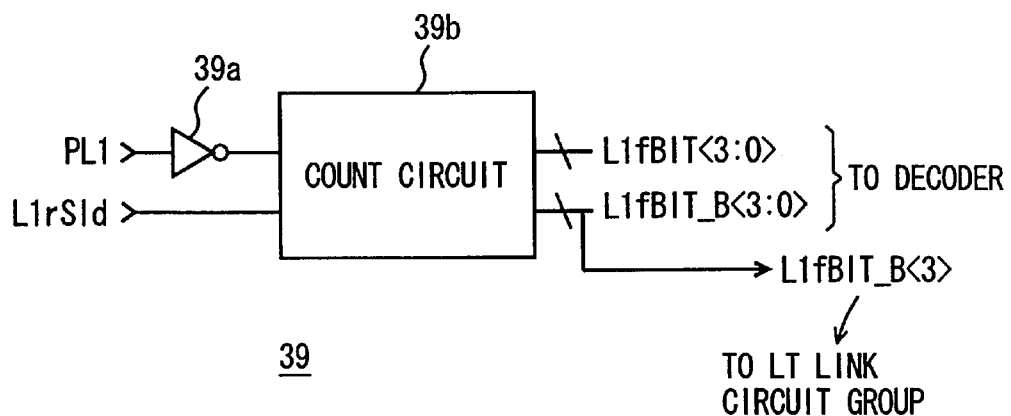
FIG. 13 schematically shows a structure of a count portion of a counter/decoder shown in FIG. 10.

FIG. 13 schematically shows a structure of a portion of the counter in counter/decoder 39 shown in FIG. 10. In FIG. 13, the counter of counter/decoder 39 includes an inverter circuit 39a for inverting transfer clock signal PL1, and a count circuit 39b activated in response to activation of count operation start instructing signal L1rSId, for performing the count operation in synchronization with the rising of the output signal of inverter circuit 39a. This count circuit 39b is a 4-bit counter, and outputs count bits L1fBIT<3:0> and complementary count bits L1fBIT_B<3:0>. Thus, count circuit 39b produces the count value of 4 bits (8 normal and complementary bits in total). This is because LT link circuit group 40 shown in FIG. 10 includes two sub-fuse blocks each having 16 link elements, and 16-to-1 selection must be performed in each fuse block for simultaneously selecting the LT link element in each respective sub-fuse block.

Highest count bit L1fBIT_B<3> of count circuit 39b is successively transferred through the LT link circuit group as a data transfer control signal for one fuse block so that the fuse blocks can be successively activated.

Count circuit 39b performs the count operation in accordance with transfer clock signal PL1, and count circuit 39b increments its count by one after two pieces of LT information are read out in parallel from one fuse block in response to transfer clock signals PL1 and PL2. By utilizing count circuit 39b, the program information of the LT link circuits in the LT circuit group is successively selected and transferred to the DRAM core.

Figure 14:
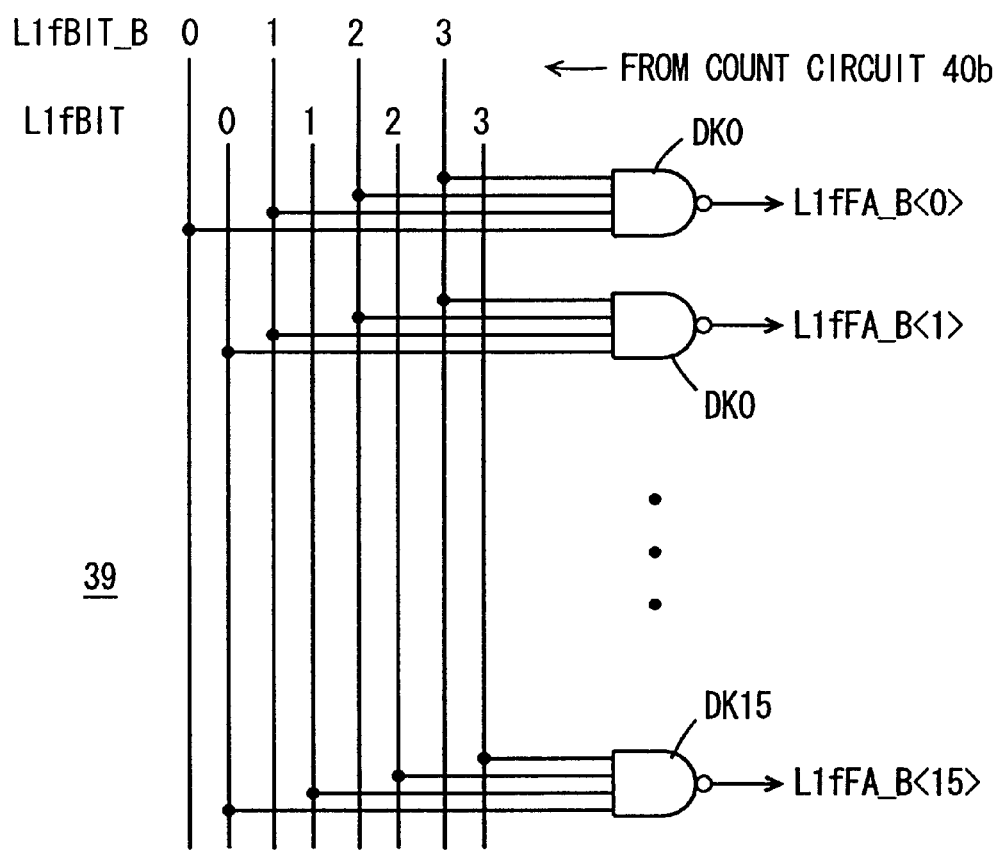
FIG. 14 schematically shows a structure of a decode portion of a counter/decoder shown in FIG. 10.

FIG. 14 shows an example of the structure of the decoder portion included in counter/decoder 39 shown in FIG. 10. In FIG. 14, NAND circuits DK15–DK0 are arranged for decode signals L1fFA_B<15:0> of 16 bits, respectively. Each of NAND circuits DK15–DK0 receives a predetermined combination of four bits in counts L1fBIT<3:0> and L1fBIT_B<3:0> generated from count circuit 39b. In FIG. 14, NAND circuit DK0 receives count bits L1fBIT_B<3:0>, and produces decode signal L1fFA_B<0>. NAND circuit DK1 receives count bits L1fBIT<0> and L1fBIT_B<3: 1>, and produces decode signal L1fFA_B<l>. NAND circuit DK15 receives count bits L1fBIT<3:0>, and produces decode signal L1fFA_B<15>. The decode signals output from these NAND circuits DK0–DK15 are active low (L-level) signals.

Figure 15:
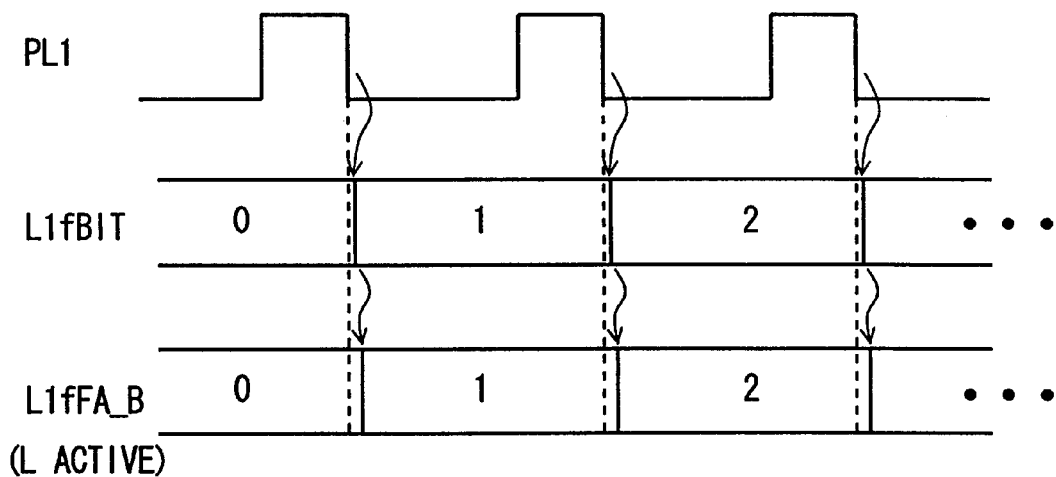
FIG. 15 is a timing chart representing an operation of the decode portion shown in FIG. 14.

As shown in FIG. 15, count circuit 39b shown in FIG. 13 performs the count operation in synchronization with the falling of transfer clock signal PL1, and in this case, its count successively changes from 0 to 1, 2, . . . . In this decode circuit, decode signals L1fBIT_B<15:0> are driven successively to the selected state (L-level) in the order from the number 0 toward the number 15 in accordance with the count bits. In accordance with transfer clock signal PL1, decode signals L1fFA_B<15:0> of 16 bits are successively driven to the selected state so that 16 sets of the LT link elements are successively selected. One decode signal L1fFA_B<i> simultaneously selects two LT link elements included in the fuse block, one from one sub-fuse block, and another from another sub-fuse block.

Figure 16:
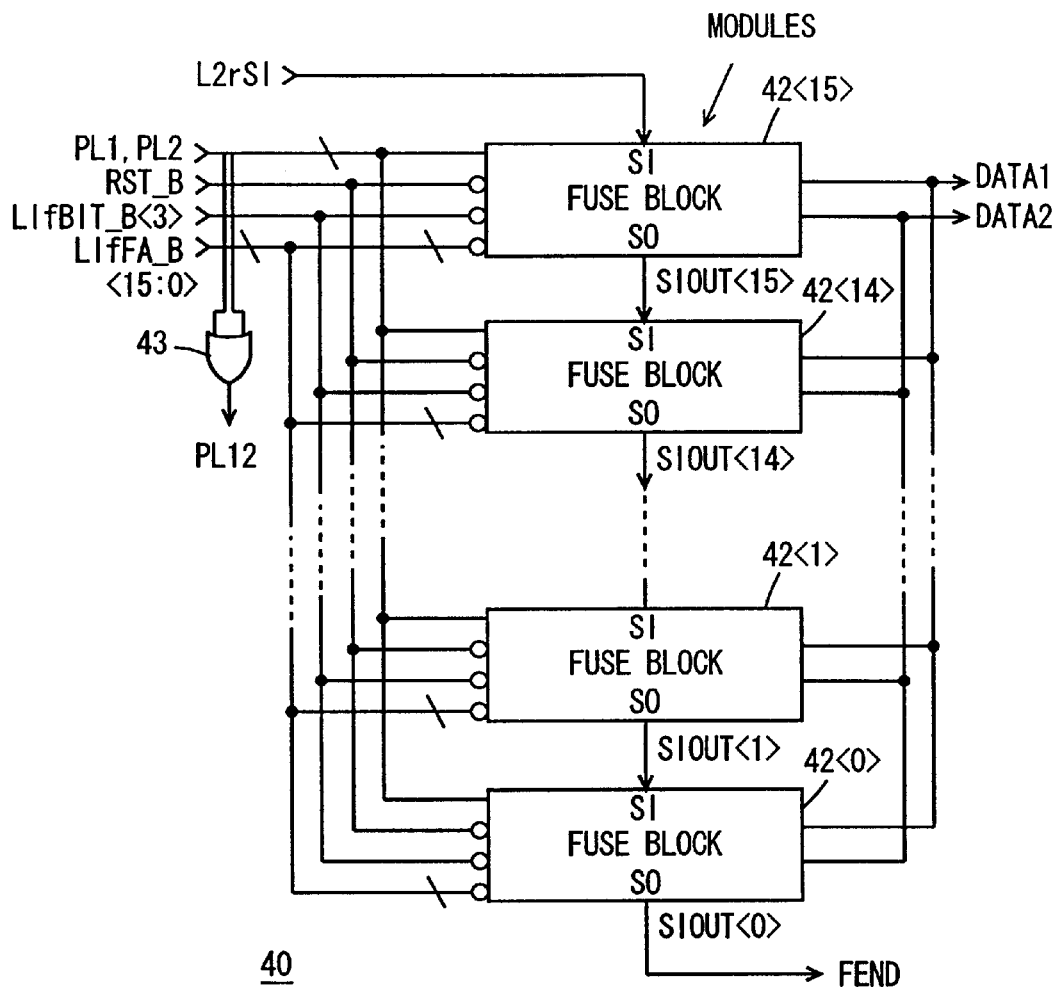
FIG. 16 schematically shows a structure of an LT link circuit group shown in FIG. 10.

FIG. 16 schematically shows a structure of LT link circuit group 40 shown in FIG. 10. In FIG. 16, LT link circuit group 40 includes 16 fuse blocks 42<0>–42<15>. Each of these fuse blocks 42<15>–42<0> is supplied with transfer clock signals PL1 and PL2, reset signal RST_B, highest count bit L1fBIT_B<3> from count circuit 40 shown in FIG. 13 and decode signals L1FA_B(15:0> generated from the decode circuit shown in FIG. 14. The fuse block is formed into a module or modularized, and the structure thereof is optimized in advance, and is already prepared in library. Owing to the module structure, the LT program circuit for storing an intended number pieces of LT link information can be easily achieved by cascading an appropriate number of unit fuse blocks.

Fuse blocks 42<15>–42<0> are cascaded via serial inputs SI and serial outputs SO. Fuse blocks 42<15>–42<1> send from its outputs SO data transfer enable signals SIOUT<15>–SIOUT<1> to the subsequent fuse blocks, respectively. Data transfer enable signal SIOUT<0> output from last fuse block 42<0> is utilized as transfer end instructing signal FEND.

This LT circuit group 40 is further provided with an OR circuit 43 which receives transfer clock signals PL1 and PL2, and produces a serial transfer clock signal PL12. Data DATA1 and DATA2 are serially transferred in accordance with serial transfer clock signal PL12 sent from OR circuit 43.

Figure 17:
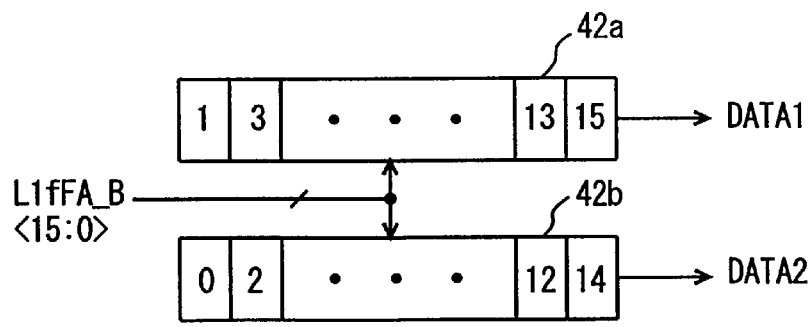
FIG. 17 schematically shows data reading of a fuse block shown in FIG. 16.

FIG. 17 schematically shows a structure of fuse blocks 42<15>–42<0>. Each of fuse blocks 42<15>–42<0> includes sub-fuse blocks 42a and 42b each having 16 LT link elements. Odd-numbered LT link elements are arranged in sub-fuse block 42a. Even-numbered LT link elements are arranged in sub-fuse block 42b. These odd numbers and even numbers are merely assigned for easy description of serial/parallel transfer operations. In each of sub-fuse blocks 42a and 42b, the program information of one LT link element is read in accordance with decode signals L1fFA_B<15:0>. Therefore, two data DATA1 and DATA2 are output in parallel upon transference of the LT information of fuse blocks 42<15>–42<0>.

According to the structures of fuse blocks 42<15>–42<0>, when all the program information of LT links (link elements) is read out in accordance with decode signals L1fFA_B<15:0> in one fuse block 42<i>, the signal applied to serial input SI is transferred to the subsequent fuse block via serial output SO in response to the rising of highest count L1fBIT<3> generated from count circuit 39b. Accordingly, after all the information of links is read out in one fuse block 42<i>, transfer of the program information of LT links in subsequent fuse block 42<i-1> is performed.

When fuse block 42<15> is supplied, on its serial input SI, with transfer start instructing signal L2rSI to enable the transfer operation, fuse blocks 42<15>–42<0> successively execute the transfer of the program information of LT link elements in accordance with signal L2rSI applied via their respective serial inputs SI.

By cascading the fuse blocks as shown in FIG. 16, it is possible to easily adapt to the increase in number of the fuse blocks due to increase in number of the LT links. Thereby, the LT link circuits can have high versatility. These fuse blocks 42<15>–42<0> have the same structure, and one fuse block is registered in library and is modularized (formed into a module). Even when the fuse blocks are increased or decreased in number in accordance with the number of LT information pieces, it is possible to ensure the reliability of the LT information transfer of LT link circuit group 40 because the fuse block is designed optimally as library.

Figure 18:
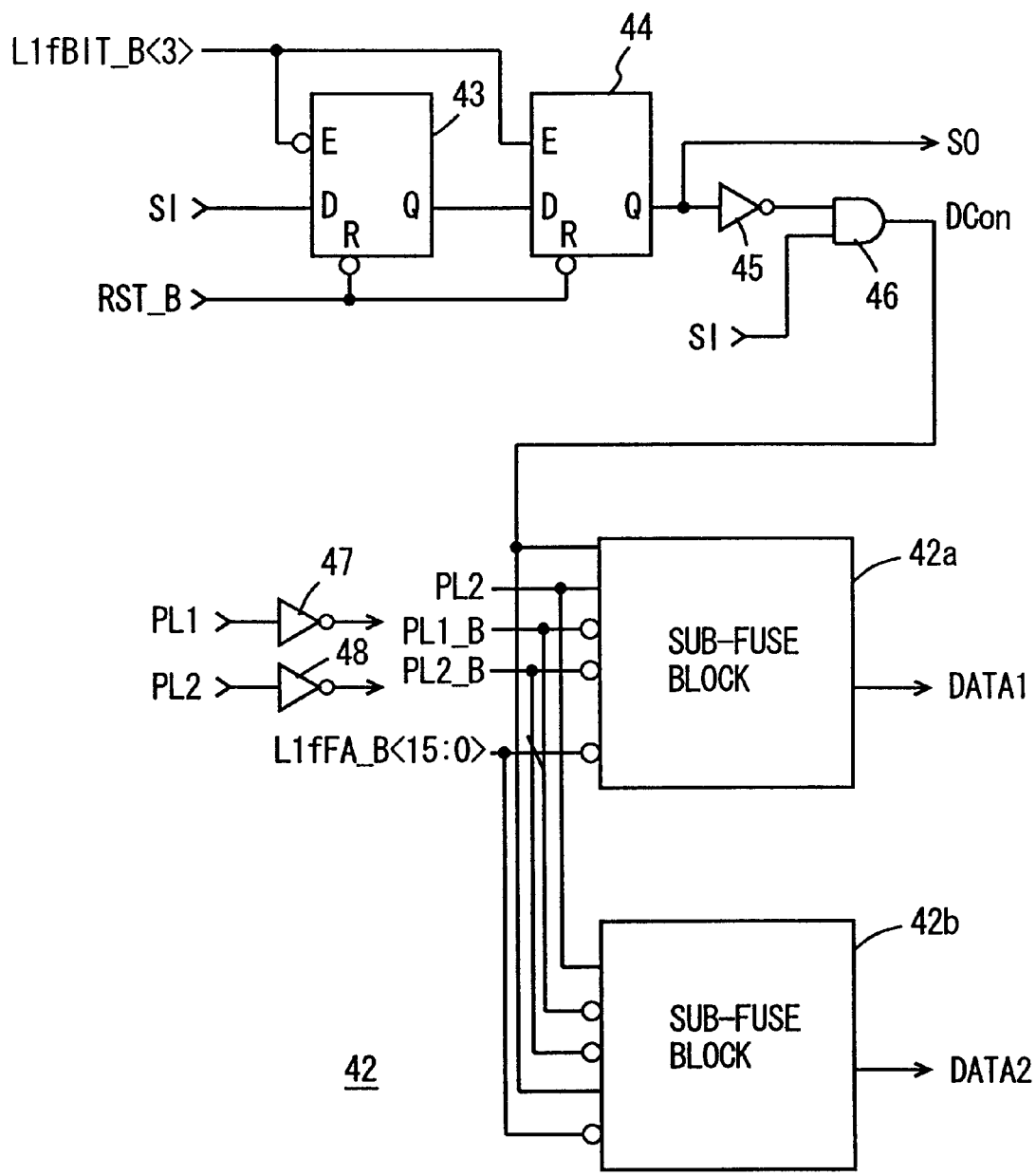
FIG. 18 schematically shows a structure of a fuse block shown in FIG. 16.

FIG. 18 schematically shows a structure of fuse blocks 42<15>–42<0>shown in FIG. 16. Since fuse blocks 42<15>–42<0> have the same structure with each other, FIG. 18 shows the structure of only one fuse block 42 as a representative example.

In FIG. 18, fuse block 42 includes: a D-latch 43 which enters the through state for passing the signal applied via serial input SI to input D when highest count bit L1fBIT_B<3> sent from counter/decoder 39 is at L-level, and enters the latch state when complementary count bit L1fBIT_B<3> attains H-level; a D-latch 44 which enters the through and latch states complementarily to D-latch 43, and transmits the signal received from output Q of D-latch 43; an inverter 45 which inverts the output signal of D-latch 44; and an AND circuit 46 which receives the output signal of inverter 45 and the signal applied to serial input SI, and produces transfer activating signal DCon. D-latch 44 also outputs a signal from its output Q to serial output SO. D-latches 43 and 44 each further receive reset signal RST_B on a reset input R thereof.

Fuse block 42 further includes inverter circuits 47 and 48 for inverting transfer clock signals PL1 and PL2, respectively, and sub-fuse blocks 42a and 42b which are arranged in parallel with each other, and transmit the program information of LT link elements in accordance with transfer clock signal PL2, inverted transfer dock signals PL1_B and PL2_B sent from inverter circuits 47 and 48, and decode signals L1fFA_B<15:0> when transfer activating signal DCon is active.

Each of sub-fuse blocks 42a and 42b includes 16 LT link elements as already described and shown schematically in FIG. 17, and the program information of one of these LT link elements is selected in each of sub-fuse blocks 42a and 42b in accordance with decode signals L1fFA_B<15:0>. In accordance with transfer clock signals PL2, PL1_B and PL2_B, LT information DATA1 and DATA2 are transferred serially.

FIG. 19 is a timing chart representing the operation of fuse block shown in FIG. 18. FIG. 19 representatively shows the operation of fuse block 42<15> in the upstream stage. Referring to FIG. 19, description will now be given of the operation of fuse block 42 (42<15>) shown in FIG. 18.

When reset signal RST_B is at L-level, D-latches 43 and 44 are in the reset state, and the signal from its output Q is at L-level. Even if the output signal of inverter circuit 45 is at H-level, transfer activating signal DCon maintains L-level to inhibit the transfer operations of sub-fuse blocks 42a and 42b while the signal applied to serial input SI is at L-level.

When reset signal RST_B rises to H-level, transfer clock signals PL1 and PL2 are alternately generated in synchronization with original clock signal CLK, as already described with reference to FIG. 7. When transfer clock signal PL1 rises to H-level, count operation start instructing signal L1rSId attains L-level to inhibit the count operation of counter/decoder 39. When transfer clock signal PL2 rises to H-level, transfer start instructing signal L2rSI rises to H-level, and the signal applied to serial input SI of fuse block 42<15> attains H-level. In this state, counter/decoder 39 is not performing the counting. Therefore, highest count bit L1fBIT_B<3> maintains H-level, and D-latch 43 maintains the latch state.

When transfer start instructing signal L2rSI applied to serial input SI rises to H-level, transfer activating signal DCon generated from AND circuit 46 rises to H-level, and the transfer operations of sub-fuse blocks 42a and 42b are activated. In sub-fuse blocks 42a and 42b, of which internal operations will be described later in greater detail, the program information of internal LT link elements is read in accordance with transfer clock signals PL1_B and PL2_B, and output LT information DATA1 and DATA2 are transferred in synchronization with the falling of transfer clock signal PL2. In each of sub-fuse blocks 42a and 42b, the program information of the first stage LT link element is read out. Decode signals L1fFA_B<15:0> change in synchronization with falling of transfer clock signal PL1, and the program information of the selected LT link elements is successively read out from sub-fuse blocks 42a and 42b in synchronization with the falling of transfer clock signal PL2.

This operation is repeated. When the count bit L1fBIT_B<3> falls from H-level to L-level and the count attains the value of "8 (decimal)", decode signal L1fFA_B<8> is driven to the selected state. In this state, D-latch 43 is in the through state, and D-latch 44 is in the latch state and receives on its input D the signal at H-level. However, D-latch 44 still outputs the signal at L-level to serial output node SO because D-latch 44 is in the latch state.

Again, reading of the program information of LT link elements is repeated in accordance with transfer clock signals PL1 and PL2, and final decode signal L1fFA_B<15> in decode signals L1fFA_B<15:0> is driven to the selected state. Responsively, the program data of the last LT link element in each of sub-fuse blocks 42a and 42b is read out in synchronization with falling of transfer clock signal PL2. When transfer clock signal PL1 falls to L-level, counter/decoder 39 performs the count and decode operations, and count bit L1fBIT_B<3> rises to H-level again, and decode signal L1fFA_B<0> corresponding to the count "0" is driven to the selected state. When count bit L1fBIT_B<3> rises to H-level, D-latch 43 attains the latch state, and D-latch 44 attains the through state. Responsively, the output signal of inverter 45 attains L-level in accordance with the signal at H-level applied from D-latch 43, and the transfer activating signal DCon attains L-level so that reading of the program information (LT information) of fuse block 42(42<15>) stops.

Since the output signal of D-latch 44 is at H-level, the signal at H-level is applied to serial input SI of fuse block (42<14>) in the next stage, and selection of the LT link elements according to decode signals L1fFA_B<15:0> and transfer of read LT information according to transfer clock signals PL1 and PL2 are executed in next fuse block (42<14>).

Thereafter, the above operations are successively executed in the subsequent fuse blocks. When reading of the LT link information in final fuse block 42<0> is completed, signal SIOUT<0> sent out from its serial output SO attains H-level, and signal FEND indicating the completion of reading of the LT link information attains H-level.

In fuse blocks 42<15>–42<0> shown in FIG. 16, when the signal applied to serial input SI attains H-level, the reading of LT information is first executed. Even when the signal applied to serial input SI is at H-level after the end of reading of LT information, the output signal of inverter circuit 45 attains L-level. Therefore, transfer activating signal DCon is kept at the inactive state of L-level, and the reading of LT information from the fuse block, in which the LT information reading is already completed, is inhibited reliably.

The fuse blocks 42<15>–42<0>, which have module structures and are cascaded, are successively activated to read the program information of the LT link elements. The information of LT link elements can be successively read in accordance with transfer clock signals PL1 and PL2. Further, by increasing the number of fuse blocks, it becomes easy to adapt to the increase in LT link information pieces.

Figure 20A:
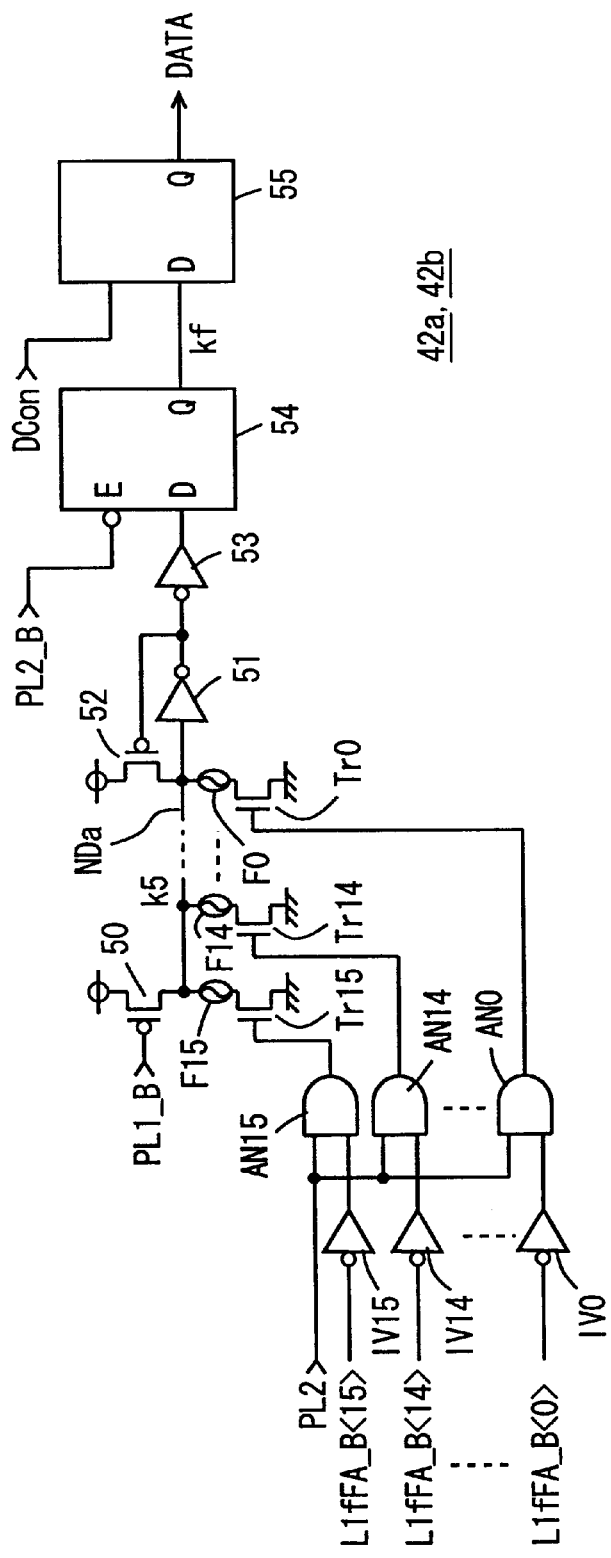
FIG. 20A shows a structure of a sub-fuse block shown in FIG. 18.

FIG. 20A shows a structure of sub-fuse blocks 42a and 42b shown in FIG. 18. Since these sub-fuse blocks 42a and 42b have the same structure with each other, FIG. 20A representatively shows only one of these sub-fuse blocks. In FIG. 20A, the sub-fuse block includes: inverters IV15–IV0 receiving decode signals L1fFA_B<15>–L1fFA_B<0>, respectively; AND circuits AN15–AN0 arranged corresponding to inverters IV15–IV0 for passing the output signals of corresponding inverters IV15–IV0 when transfer clock signal PL2 is at L-level; LT link elements F15–F0 coupled in parallel to an internal node NDa; N-channel MOS transistors Tr15–Tr0 connected between respective LT link elements F15–F0 and the ground node and receiving, on their respective gates, the output signals of AND circuits AN15–AN0; a precharge P-channel MOS transistor 50 rendered conductive to precharge node NDa to the power supply voltage level when complementary transfer clock signal PL1_B is at L-level; an inverter 51 inverting a signal k5 on node NDa; a P-channel MOS transistor 52 rendered conductive to transmit the power supply voltage to node NDa when the output signal of inverter 51 is at L-level; an inverter 53 inverting the output signal of inverter 51; a D-latch 54 for passing the output signal of inverter 53 when complementary transfer clock signal PL2_B is at H-level and entering the latch state when transfer clock signal PL2_B is at L-level; and a bus driver 55 activated, when transfer activating signal DCon is at H-level, to produce LT information DATA in accordance with the output signal of D-latch 54. Bus driver 55 enters the output high-impedance state when transfer activating signal DCon is in the inactive state of L-level.

LT link elements F15–F0 are selectively blown/non-blown (programmed) depending on the states of corresponding internal nodes in the DRAM macro. MOS transistors Tr15–Tr0 are selectively turned on in accordance with decode signals L1fFA_B<15:0>, respectively. Thus, the signal k5 on node NDa is set to the state corresponding to the programmed state of the corresponding LT link elements, and the LT link information is read out in accordance with signal k5 on node NDa.

Figure 20B:
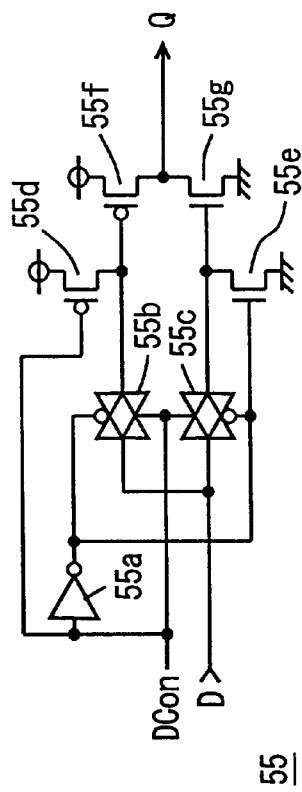
FIG. 20B shows a structure of a bus driver shown in FIG. 20A.

FIG. 20B shows a structure of bus driver 55 shown in FIG. 20A. In FIG. 20B, bus driver 55 includes: an inverter 55a receiving transfer activating signal DCon; CMOS transmission gates 55b and 55c selectively turned on in accordance with transfer activating signal DCon and the output signal of inverter 55a, to selectively pass the signal applied to input node D; a P-channel MOS transistor 55f selectively turned on in accordance with the signal passing through CMOS transmission gate 55b, to drive output node Q to the power supply voltage level; an N-channel MOS transistor 55g selectively turned on in accordance with the signal passing through CMOS transmission gate 55c, to drive output node Q to the ground voltage level; a P-channel MOS transistor 55d turned on, when transfer activating signal DCon is at L-level, to drive the gate of MOS transistor 55f to the power supply voltage level; and an N-channel MOS transistor 55e for driving the gate of MOS transistor 55g to the ground voltage level in accordance with the output signal of inverter 55a.

CMOS transmission gates 55b and 55c are turned on when transfer activating signal DCon is H-level, and thereby pass the output signal of D-latch 54 applied to input node D. When transfer activating signal DCon is at H-level, both MOS transistors 55d and 55e are off, and therefore MOS transistors 55f and 55g drive output node Q in accordance with the signal applied via input node D.

When transfer activating signal DCon is at L-level, CMOS transmission gates 55b and 55c are off, and MOS transistors 55d and 55e are on. In this state, therefore, the gate voltage on MOS transistor 55f attains the power supply voltage level, and the gate voltage on MOS transistor 55g attains the ground voltage level so that these MOS transistors 55f and 55g are off, and bus driver 55 is in the output high-impedance state.

In sub-fuse blocks 42a and 42b, the internal programmed LT information can be read out in accordance with the transfer clock signals only when transfer activating signal DCon is kept active.

FIG. 21 is a timing chart representing the data transfer operation of the sub-fuse block shown in FIG. 20A. Referring to FIG. 21, brief description will now be given on the operation of sub-fuse blocks 42a and shown in FIGS. 20A and 20B. Transfer clock signals PL1 and PL1_B are complementary to each other, and transfer clock signals PL2 and PL2_B are also complementary to each other. Transfer clock signals PL1 and PL1 are two phase, non-overlapping clock signals.

In the initial state, all decode signals L1fFA_B<15:0> are at L-level. When transfer activating signal DCon attains the active state at H-level, bus driver 55 is enabled to produce LT information DATA in accordance with a signal kf outputted from output Q of D-latch 54. When transfer clock signal PL2 rises to H-level, AND circuits AN15–AN0 are enabled and drive their output signals to H-level in accordance with decode signals L1fFA_B<15:0>, respectively. Initially, decode signal L1fFA_B<0> is in the selected state, the output signal of AND circuit AN0 attains H-level, and MOS transistor Tr0 is turned on. Node NDa is already precharged to the power supply voltage level by complementary transfer clock signal PL1_B before transfer clock signal PL2 rises to H-level. Therefore, the state of signal k5 on node NDa is determined in accordance with blowing/non-blowing of LT link element F0.

When LT link element F0 is not blown off, node NDa is discharged to the ground voltage level, and the signal k5 attains L-level. If LT link element F0 is already blown, a discharging path for node NDa is not present (because all MOS transistors Tr1–Tr15 are off), and the signal k5 maintains the precharged voltage level. Therefore, node NDa is set to the state indicating the programmed state of the selected LT link element. In parallel with this operation of deciding the voltage level on node NDa, D-latch 54 attains the through state in accordance with complementary transfer clock signal PL2_B, and passes the signal k5 transferred via inverters 51 and 53. In this case, complementary transfer clock signal PL2_B has a delay time with respect to transfer clock signal PL2, and D-latch 54 attains the through state when the voltage level on node NDa is made definite and stabilized. Bus driver 55 is already enabled in accordance with output transfer activating signal DCon, and LT information DATA is produced in accordance with the signal kf output from D-latch 54.

When transfer clock signal PL2 falls to L-level, the output signals of all AND circuits AN15–AN0 attain L-level, and all MOS transistors Tr0–Tr15 are turned off. Also, complementary transfer clock signal PL2_B attains H-level, and D-latch 54 attains the latch state to maintain the state of the last taken-in signal. The latched signal is output via bus driver 55 until complementary transfer clock signal PL2_B subsequently falls to L-level. In the latch period of D-latch 54, transfer clock signal PL1 attains H-level again, and complementary transfer clock signal PL1_B attains L-level. Responsively, node NDa is charged to the power supply voltage level again via precharging MOS transistor 50. During this charging period, transfer clock signal PL2 is at L-level, and node NDa is reliably precharged to the power supply voltage level. Also, inverter 51 and MOS transistor 52 latch the precharged voltage level on node NDa.

After completion of the precharge operation, node NDa does not enter the floating state, and is reliably held at the power supply voltage level by inverter 51 and MOS transistor 52. When this precharge operation is completed, the decode signal applied from the counter/decoder changes, and the next decode signal is driven to the selected state. The state of the signal k5 is determined in accordance with the next decoding signal, and the LT information is transferred via D-latch 54 and bus driver 55. Thereafter, the above operations are repeated, and the LT information is transferred in accordance with transfer clock signal PL2_B.

After the state (program information) of final LT link element F15 is read out, the count of counter/decoder returns to the initial value of "0", and responsively transfer activating signal DCon falls to L-level (see FIG. 18). While bus driver 55 is in the output high-impedance state, the LT information corresponding to the programmed information of this fuse element F15 is output until data of the following fuse block is read out. When transfer clock signal PL2 attains L-level, the LT information FB corresponding to the programmed state of the LT link element in the next fuse block is transferred. This is because the transfer start instructing signal for the subsequent fuse block is outputted from output node SO when transfer activating signal DCon falls to L-level, and the transfer activating signal for the subsequent fuse block is activated.

Therefore, even when the program information of the final LT link element F15 in one fuse block attains a high-impedance state (Hi-Z) for a predetermined period, this period is relatively short, and the LT information can be transferred stably.

LT information DATA is read out in parallel from the two sub-fuse blocks, and is applied to switch circuit 41 shown in FIG. 10.

Figure 22:
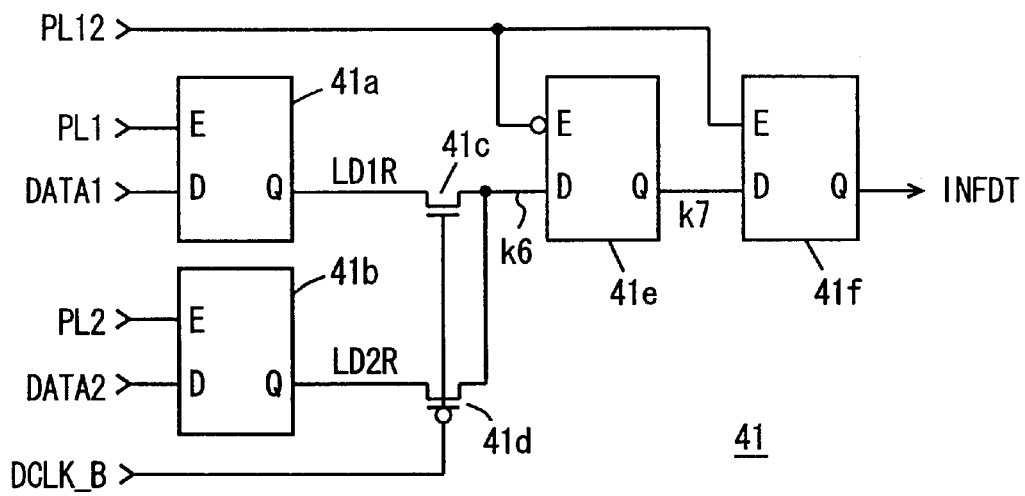
FIG. 22 schematically shows a structure of a switch circuit shown in FIG. 10.

FIG. 22 schematically shows a structure of switch circuit 41 shown in FIG. 10. In FIG. 22, switch circuit 41 includes: a D-latch 41a which takes in and latches LT information DATA1 in accordance with transfer clock signal PL1; a D-latch 41b which takes in and latches LT information DATA2 in accordance with transfer clock signal PL2; an N-channel MOS transistor (transfer gate) 41c which is turned on to pass LT information LD 1R received from output Q of D-latch 41a when complementary frequency-divided clock signal DCLK_B is at H-level; a P-channel MOS transistor 41d which is turned on to pass LT information LD2R received from output Q of D-latch 41b when complementary frequency-divided clock signal DCLK_B is at L-level; a D-latch 41e which takes in and latches the data applied from MOS transistors 41c and 41d in accordance with combined transfer clock signal PL12; and a D-latch 41f which enters the latch state complementarily to D-latch 41e in accordance with combined transfer clock signal PL12, and takes in and latch output information k7 on output Q of D-latch 41e for outputting transfer LT information INFDT.

D-latch 41a enters the through state when transfer clock signal PL1 is at H-level, to pass received program (LT) information DATA1. Also, D-latch 41a enters the latch state when transfer clock signal PL1 is at L-level. D-latch 41b enters the through state when transfer dock signal PL2 is at H-level, to pass program information DATA2 transferred from sub-fuse block 42b shown in FIG. 18. Also, D-latch 41b attains the latch state when transfer clock signal PL2 is at L-level.

MOS transistors 41c and 41d are turned on complementarily to each other, and D-latch 41e alternately receives output data LD1R and LD2R of D-latches 41a and 41b.

Figure 23:
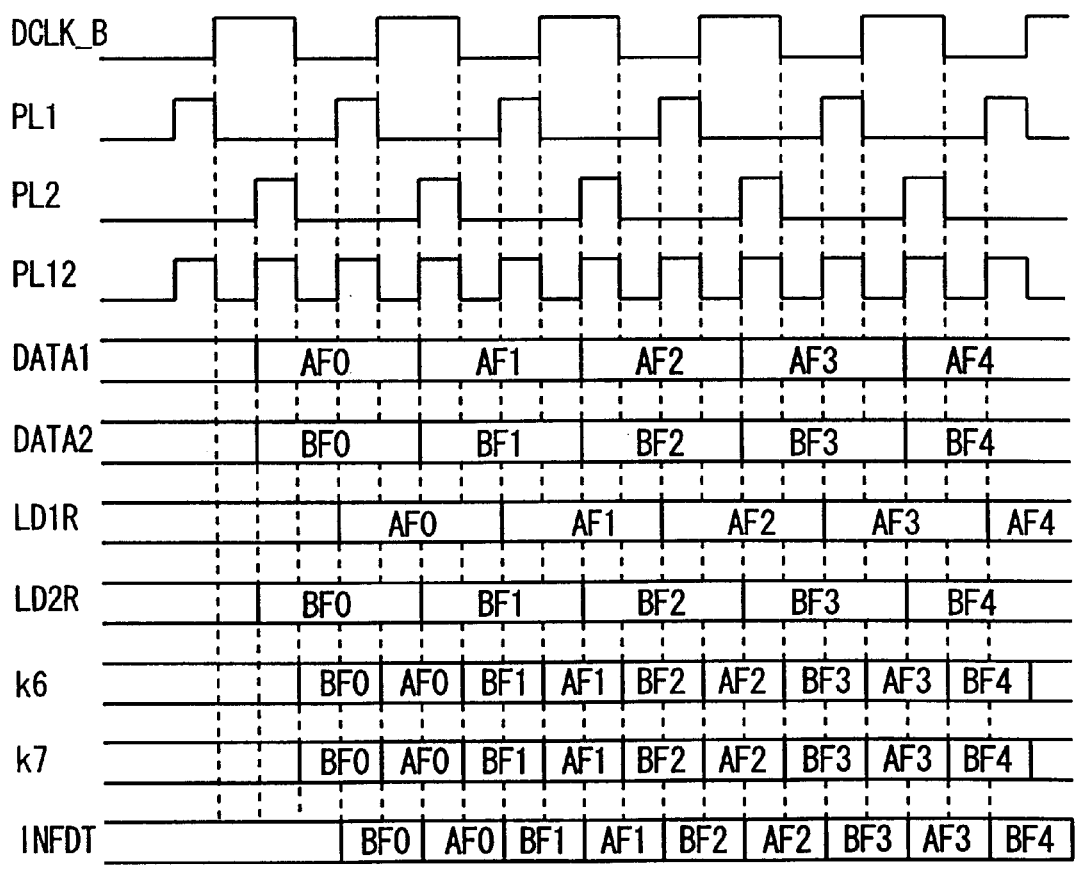
FIG. 23 is a timing chart representing an operation of the switch circuit shown in FIG. 22.

D-latch 41e attains the through state when combined transfer clock signal PL12 is at L-level, and attains the latch state when combined transfer clock signal PL12 is at H-level. D-latch 41f attains the through state when combined transfer clock signal PL12 is at H-level, and attains the latch state when combined transfer clock signal PL12 is at L-level. An operation of switch circuit 41 shown in FIG. 22 will now be described with reference to a timing chart of FIG. 23.

D-latches 41a and 41b are supplied with program (LT) information DATA1 and DATA2 in accordance with transfer clock signal PL2 (see FIG. 21). D-latch 41a attains the through state in synchronization with the rising of transfer clock signal PL1, to take in LT information DATA1 and produce data LD1R. When transfer clock signal PL2 attains H-level, D-latch 41b takes in LT information DATA2 and produces data LD2R. Therefore, LT data LD2R output from D-latch 41b changes in synchronization with the rising of transfer clock signal PL2, and LT data LD1R output from D-latch 41a changes in synchronization with the rising of transfer clock signal PL1.

Frequency-divided clock signal DCLK_B has the same cycle period as transfer clock signals PL1 and PL2. When transfer clock signal PL1 is at H-level, complementary frequency-divided clock signal DCLK_B is at L-level. When transfer clock signal PL2 is at H-level, frequency-divided clock signal DCLK_B is at H-level (see FIG. 9). Therefore, when D-latch 41b attains the latch state, MOS transistor 41d is turned on to transfer LT data LD2R output from D-latch 41b. When D-latch 41a attains the latch state, MOS transistor 41c is turned on to transfer LT data LD1R output from D-latch 41a.

As data k6, therefore, data LD2R and LD1R are alternately applied to input D of D-latch 41e at every half cycle of frequency-divided clock signal DCLK_B.

D-latch 41e attains the through state when combined transfer clock signal PL12 attains L-level. Combined transfer clock signal PL12 is a combined (ORed) signal of transfer clock signals PL1 and PL2, and has a cycle equal to double the cycle of each of transfer clock signals PL1 and PL2. Therefore, D-latch 41e enters the through state for half a period of the on state of MOS transistors 41c and 41d, and enters the latch state for the remaining half period. Therefore, data k7 applied from output Q of D-latch 41e is formed of the same signal/data as data k6 applied to its input node D.

D-latch 41f attains the through state when combined transfer clock signal PL12 is at H-level. Therefore, internal LT information INFDT generated from D-latch 41f is formed of signal/data delayed by half a cycle period of combined transfer clock signal PL12 with respect to data k7 output from D-latch 41e.

When D-latches 41a and 41b are in the latch state, MOS transistors 41c and 41d are in the on state, and D-latch 41e takes in and latches the transferred data for half a period of the on state of MOS transistors 41d and 41c. Thereby, serial data DATA1 and DATA2, which are internally applied via two separate paths can be converted into one serial data sequence, to be successively transferred in accordance with transfer clock signal PL12.

In LT link portion 7, as described above, the program information of the LT link elements is successively read and serially transferred, whereby the transfer signal interconnection lines for the LT information can be reduced in number. By providing the two separate serial data transfer paths, and transforming the separate paths into the one serial information transfer path by the switch circuit, the decode signals for selection of the LT link elements can be reduced in number. Further, by reading the program information of the LT link elements at half a cycle of an actual serial transfer speed of the LT information, the program information of the LT link elements can be accurately read out, and the LT information can be transferred fast.

[Structure of Transfer Control Circuit]

Figure 24:
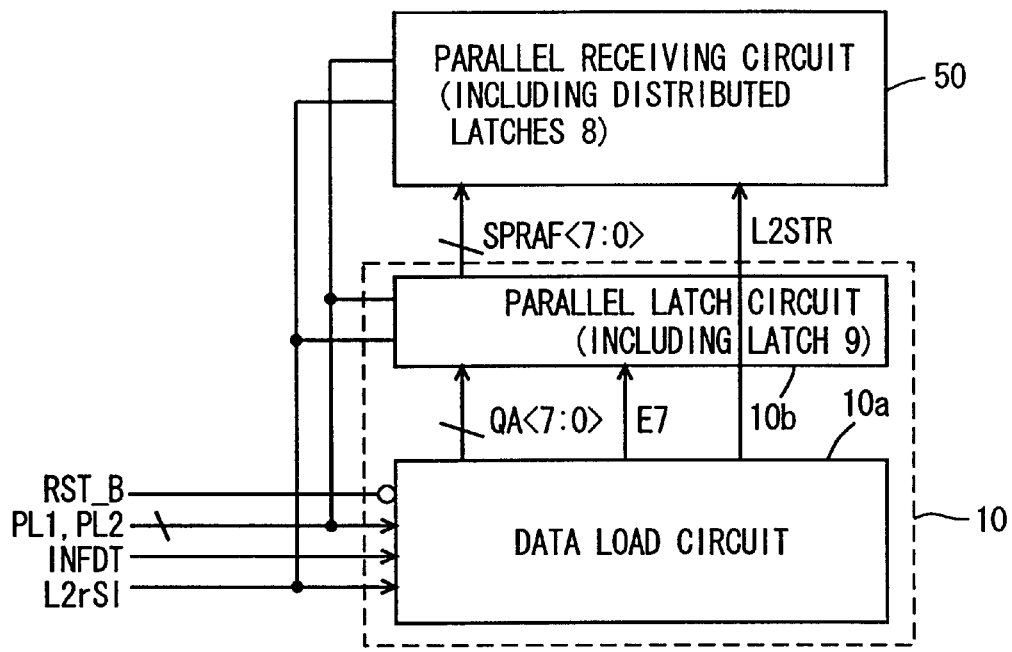
FIG. 24 schematically shows structures of a transfer control circuit and a latch group shown in FIG. 1.

FIG. 24 schematically shows a structure of transfer control circuit 10 arranged in the DRAM macro shown in FIG. 1. Transfer control circuit 10 includes a data load circuit 10a which serially receives LT information INFDT from LT link portion 7 and coverts the received serial LT information to parallel LT information, and a parallel latch circuit 10b which temporarily latches the parallel LT information produced by data load circuit 10a. Data load circuit 10a receives reset signal RST_B, transfer clock signals PL1 and PL2, and transfer start instructing signal L2rSI. FIG. 24 shows, by way of example, a case in which data load circuit 10a produces LT data Q<7:0> of 8 bits.

Data load circuit 10a includes shift latch DL shown in FIG. 1. When data load circuit 10a receives serial data of 8 bits, it applies a latch instructing signal E7 to parallel latch circuit 10b. Responsively, LT information INFDT, which is serially transferred, is converted into parallel LT information of 8 bits. Parallel latch circuit 10b includes latch circuit 9 shown in FIG. 1 for each data bit. Parallel latch circuit 10b receives transfer start instructing signal L2rSI and transfer clock signals PL1 and PL2, and executes the latching and transferring operations in accordance with transfer clock signals PL1 and PL2 when the LT information is to be transferred.

The LT information latched by parallel latch circuit 10b is applied, in parallel, to a parallel receiving circuit 50. The parallel receiving circuit 50 includes latch circuits 8, which are arranged distributedly corresponding to the predetermined internal circuits within a DRAM macro DMR, and receive the parallel LT information at portions near the corresponding internal circuits. In FIG. 24, spare row address SPRAF<7:0> is shown as an example of the LT information. Parallel receiving circuit 50 is also supplied with a load instructing signal L2STR from data load circuit 10a, and latches parallel LT information SPRAF<7:0> applied from parallel latch circuit 10b in accordance with load instructing signal L2STR. In parallel receiving circuit 50, therefore, latch circuits 8 are arranged in groups so that latch circuits 8 can latch the corresponding LT information in parallel.

In this data load circuit 10a, the serial LT information is converted into the parallel LT information, and it is not necessary to provide a D-latch and a transfer D-latch (i.e., D-latch for information transfer) for each LT information piece. Thus, an area occupied by data transfer control circuit 10 can be reduced.

Figure 25:
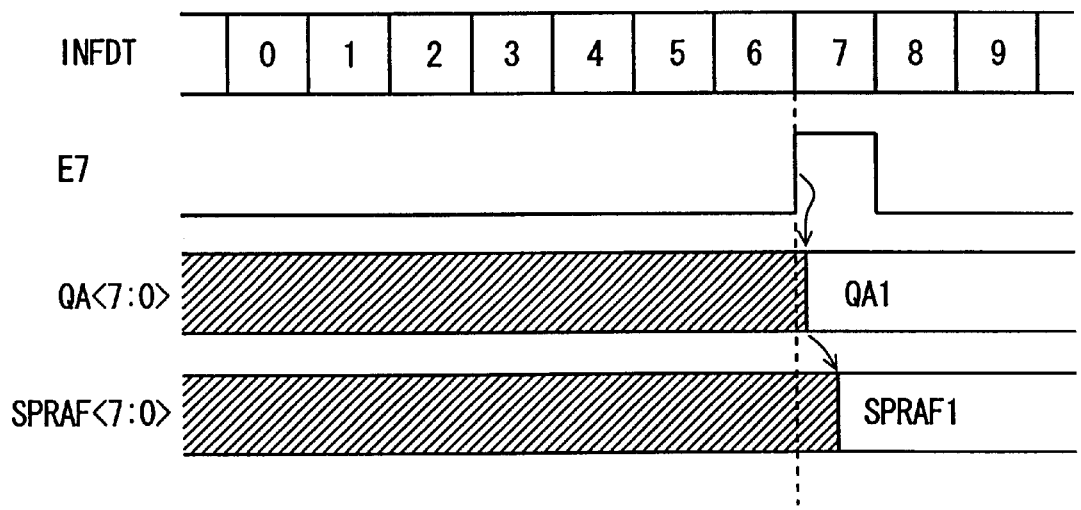
FIG. 25 is a timing chart representing an operation of a transfer control circuit shown in FIG. 24.

FIG. 25 is a timing chart representing an operation of transfer control circuit 10 shown in FIG. 24. As shown in FIG. 25, data are transferred to data load circuit 10a in synchronization with transfer clock signals PL1 and PL2, as already described. In data load circuit 10, when the serially transferred LT information is successively latched and the LT information of a required number of bits (i.e., 8 bits) is latched, the latched data are transferred to parallel latch circuit 10b at a time in parallel with the latch operation. Therefore, when data load circuit 10a latches LT information QA1 of multiple bits, parallel latch circuit 10b takes in the latched data, and transfers parallel LT information SPRAF1 to parallel receiving circuit 50.

In data load circuit 10a, when the LT information is transferred to latch circuits 8 included in parallel receiving circuit 50, the serial-parallel conversion is performed using the data latch circuits 10b provided commonly to the groups of latch circuits 8, so that the data latch circuits can be reduced in number, and the area occupied by the data transfer control circuit is reduced.

Figure 26:
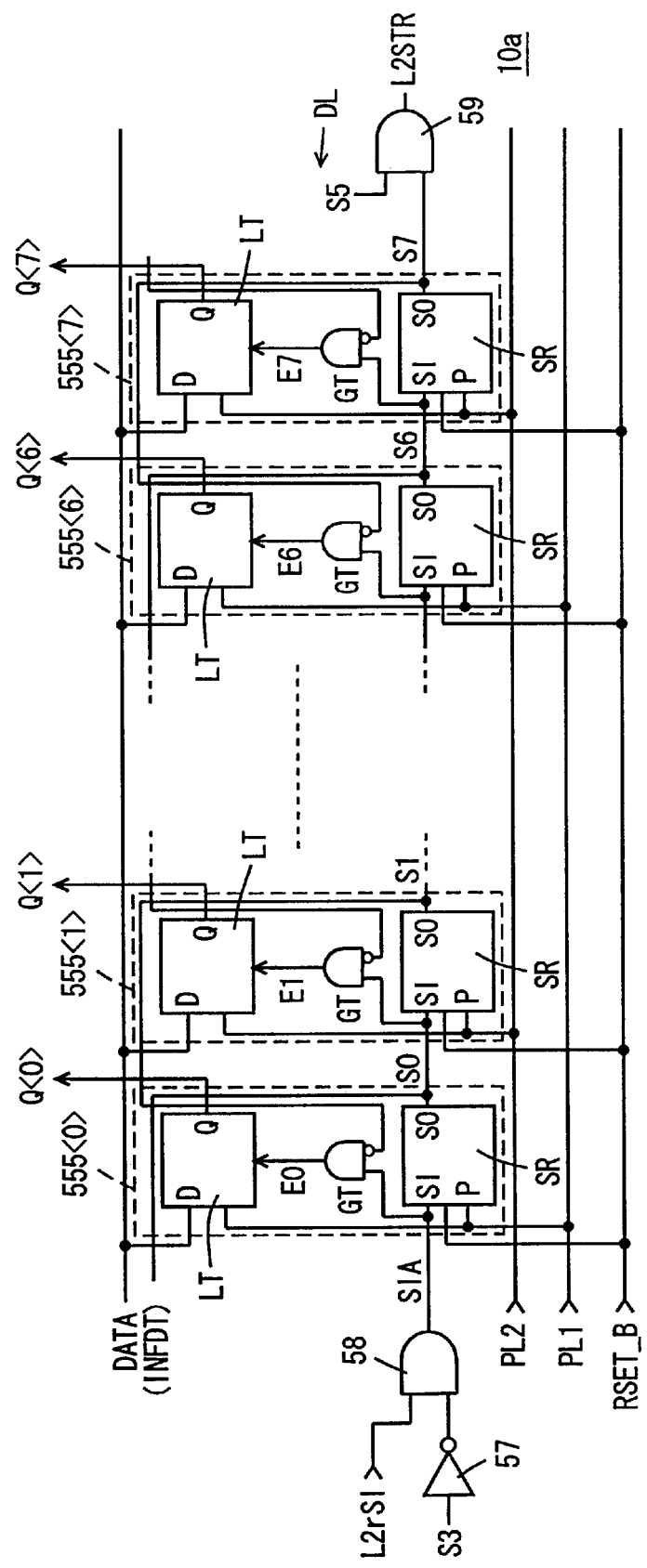
FIG. 26 shows a structure of a data load circuit shown in FIG. 24.

FIG. 26 schematically shows a structure of data load circuit 10a shown in FIG. 24. In FIG. 26, data load circuit 10a includes cascaded serial receiving circuits 555<0>–555<7>, an inverter 57 receiving a serial output signal S3 of serial receiving circuit 555<3>, and an AND circuit 58 receiving the output signal of inverter 57 and transfer start instructing signal L2rSI, and an AND circuit 59 receiving serial output signals S5 and S7 of serial receiving circuits 555<5> and 555<7> and producing load instructing signal L2STR.

Serial receiving circuits 555<0>–555<7> receive LT information DATA(INFDT), and successively latch the data in accordance with transfer clock signals PL1 and PL2. These serial receiving circuits 555<0>-555<7> are coupled to alternately receive transfer dock signals PL1 and PL2.

Each of serial receiving circuits 555<0>–555<7> includes: a shift circuit SR which takes in and transfers a signal (i.e., the output signal of a preceding stage serial receiving circuit or AND circuit 58) applied to input SI in accordance with the corresponding clock signal (PL1 or PL2) applied to dock input P; a gate circuit GT which receives the input signal of shift circuit SR and inverted signal S of the output signal of the shift circuit included in the subsequent serial receiving circuit, and a D latch LT which takes in transfer LT information DATA(INFDT) when output signal E(i) (E0–E7) of gate circuit GT and corresponding clock signal PL1 or PL2 are both at H-level. Latch circuit LT and shift circuit SR correspond to latches 9 and DL in FIG. 1, respectively.

As for AND circuit 58, when transfer start instructing signal L2rSI becomes active, its output signal SIA attains H-level, and output signal SIA of AND circuit 58 is successively transferred via shift circuits SR of serial receiving circuits 555<0>–555<7> in accordance with transfer clock signals PL1 and PL2 because the serial output signal S3 of the serial receiving circuit 555<3> is in a reset state. In each serial receiving circuit, D-latch LT attains the latch state when the subsequent serial receiving circuit takes in LT information DATA(INFDT). Transfer clock signals PL1 and PL2 are two phase, non-overlapping clock signals, and the data, which is serially transferred, can be successively stored in D-latches LT.

Figure 27:
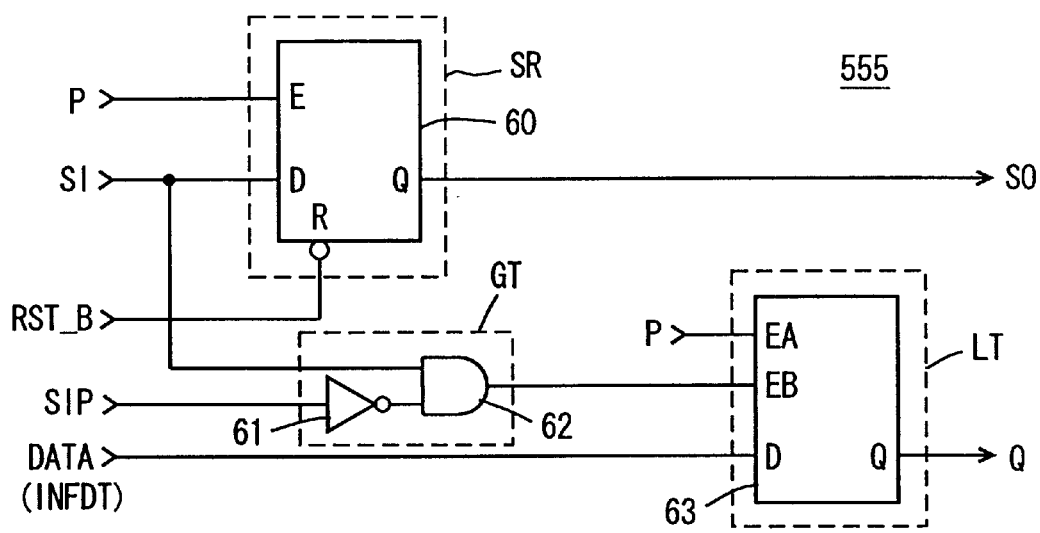
FIG. 27 schematically shows a structure of one stage of a serial receiving circuit shown in FIG. 26.

FIG. 27 shows more specifically the structure of serial receiving circuits 555<0>–555<7> shown in FIG. 26. Shift circuit SR includes a D-latch 60, which attains the through state, when the signal applied to a dock input P thereof attains H-level, to pass the signal applied to a serial input SI thereof through a data input D to an output Q thereof, and attains the latch state when the signal applied to the clock input P attains L-level. D-latch 60 outputs the signal at L-level from its output Q when reset signal RST_B is at L-level.

Gate circuit GT includes an inverter 61 receiving the output signal of shift circuit SR of the subsequent serial receiving circuit via input node SIP, and an AND circuit 62 receiving the output signal of inverter 61 and the signal applied to the serial input SI.

Latch circuit LT includes a D-latch 63, which attains the through state when both the transfer clock signal (PL1 or PL2) applied to its input EA and the output signal of AND circuit 62 attain H-level, and attains the latch state when one of the signals applied to inputs EA and EB attains L-level. D-latch 63 latches LT information DATA(INFDT).

Figure 28:
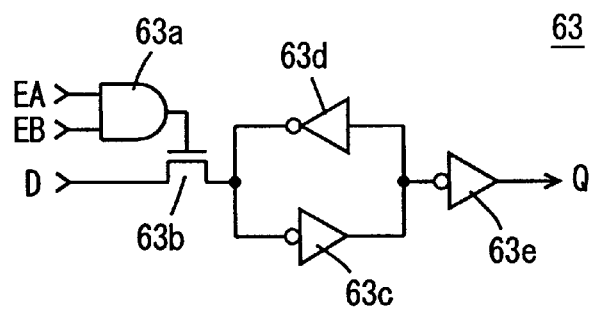
FIG. 28 shows a structure of a 3-input D-latch shown in FIG. 27.

FIG. 28 shows, by way of example, a structure of D-latch 63 shown in FIG. 27. In FIG. 28, D-latch 63 includes: an AND circuit 63a receiving signals applied to inputs EA and EB; an N-channel MOS transistor 63b made conductive to pass the signal applied to data input node D when the output signal of AND circuit 63a is at H-level; an inverter 63c inverting the signal transmitted through MOS transistor 63b; an inverter 63d inverting the output signal of inverter 63c for transmission to the input of inverter 63c; and an inverter 63e inverting the output signal of inverter 63c to produce latch data Q. In D-latch 63 shown in FIG. 28, inverters 63c and 63d form the latch circuit. D-latch 63 attains the through state when MOS transistor 63b is on, and attains the latch state when MOS transistor 63b is off.

Figure 29:
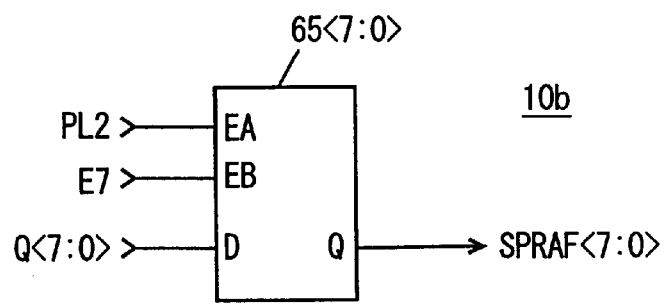
FIG. 29 schematically shows a structure of a parallel latch circuit shown in FIG. 24.
Figure 30:
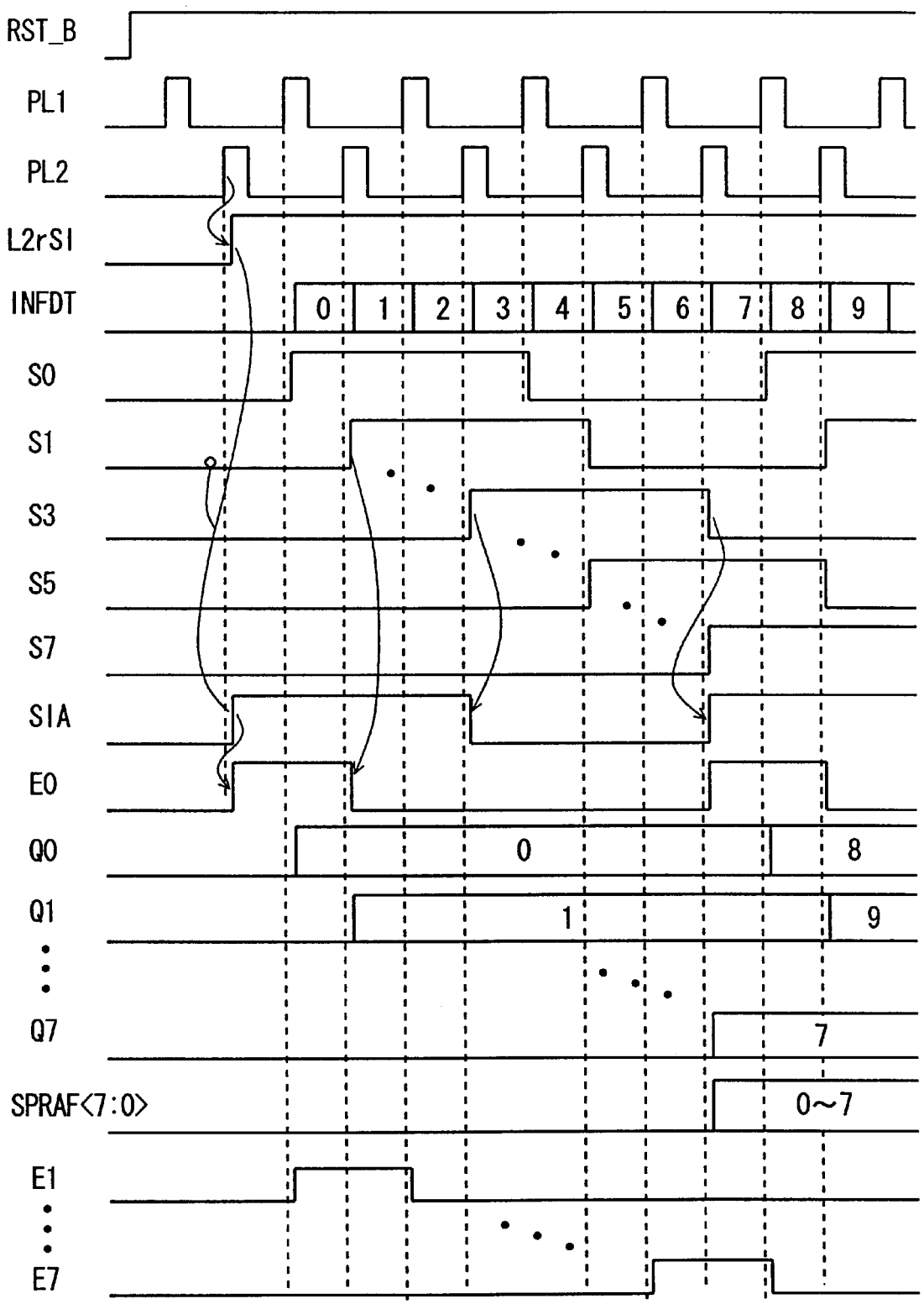
FIG. 30 is a timing chart showing an operation of a transfer control circuit shown in FIG. 26.

FIG. 29 schematically shows a structure of parallel latch circuit 10b shown in FIG. 24. In FIG. 29, parallel latch circuit 60b includes D-latches 65<7:0> provided corresponding to output bits Q<7:0>> applied from data load circuit 10a. D-latches 65 <7:0> attain the through state, when signals PL2 and E7 applied to respective clock inputs EA and EB are at L-level, to take in LT information Q<7:0> and produce parallel LT information SPRF<7:0>. Operations of the circuits shown in FIGS. 26–29 will now be described with reference to a timing chart of FIG. 30.

When reset signal RST_B is at L-level, all serial receiving circuits 555<0>–555<7> are in the reset state, and all output signals S0–S7 of shift circuits SR are at L-level. When reset signal RST_B rises to H-level after power-on, transfer clock signals PL1 and PL2 are alternately generated. In response to the first rising of transfer clock signal PL2, transfer instructing signal L2rSI rises to H-level, and the signal SIA generated from AND circuit 58 shown in FIG. 26 rises to H-level. Serial receiving circuit 555<0> performs the latch operation in accordance with transfer clock signal PL1, and produces output signal S0 at L-level when transfer clock signal PL1 is at L-level. Therefore, output signal S1 of subsequent serial receiving circuit 555<1> is at L-level, and output signal E0 of gate circuit GT rises to H-level in response to the rising of output signal SIA of AND circuit 58. Responsively, D-latch 63 in serial receiving circuit 555<0> attains the through state in response to the rising of transfer clock signal PL1, and takes in transferred LT information DATA(INFDT). When transfer clock signal PL1 falls to L-level, serial receiving circuit 555<0> attains the latch state.

After output signal SO of serial receiving circuit 555<0> rises to H-level, transfer clock signal PL2 attains H-level in subsequent serial receiving circuit 555<1>. Responsively, D-latch 60 of shift circuit SR in serial receiving circuit 555<1> attains the through state, and raises its output signal S1 to H-level. Output signal E0 of gate circuit GT in serial receiving circuit 555<0> falls to L-level, and serial receiving circuit 555<0> attains the latch state regardless of the state of transfer dock signal PL1.

In the subsequent serial receiving circuit 555<1>, when signal SO and transfer clock signal PL2 attain H-level, D-latch 63 attains the through state for taking in transferred LT information DATA(INFDT). Also, D-latch 63 attains the latch state in response to the falling of transfer clock signal PL2. In serial receiving circuit 555<1>, output signal E1 of gate circuit GT attains L-level when output signal S2 of subsequent serial receiving circuit 555<2> (not shown) attains H-level, and serial receiving circuit 555<1> attains the latch state regardless of the state of transfer dock signal PL2.

When output signal S3 of serial receiving circuit 555<3> (not shown) rises to H-level, output signal SIA of AND circuit 58 falls to. L-level. Output signal SIA of AND circuit 58 maintains L-level until next falling of shift signal S3 to L-level. This signal SIA is successively shifted to serial receiving circuits 555<0>–555<7>. This signal SIA has a period equal to four clock cycles of transfer clock signals PL1 and PL2, and corresponding to a transfer period of eight LT information pieces. Accordingly, by successively shifting the signal SIA via serial receiving circuits 555<0>555<7>, serial receiving circuits 555<0>–555<7> can perform the latch operation in a cycle corresponding to eight LT information pieces, and the LT information, which is serially transferred, can be converted into parallel data in a unit of eight LT information pieces.

In serial receiving circuits 555<0>–555<7>, output signals E0–E7 of the gate circuits GT are already in the active state at H-level before rising of the corresponding transfer clock signals, respectively, and therefore latch circuit LT (D-latch 63) can accurately take in the corresponding data in each of serial receiving circuits 555<0>–555<7>.

In serial receiving circuit 555<7>, when output signal E7 of gate circuit GT attains H-level, latch circuit LT attains the through state in response to the rising of transfer clock signal PL2, and thereby takes in the transfer LT information. At the same time, parallel latch circuit 10b shown in FIG. 29 attains the through state, and takes in 8-bit data Q<7:0> transferred from latch circuits LT of serial receiving circuits 555<0>555<7>. When transfer dock signal PL2 attains L-level, parallel latch circuit 10b attains the latch state. During a period of the latch state of parallel latch circuit 10b, load instructing signal L2STR is produced in accordance with shift signals S5 and S7 sent from shift receiving circuits 555<0>–555<7>, and eight LT information items are latched in corresponding parallel receiving circuits.

When latching and transferring of the eight LT information pieces are performed, serial receiving circuit 555<0> in the initial stage takes in and latches LT information DATA (INFDT) applied thereto in accordance with transfer dock signal PL1. Thereafter, the above operation is repeated. Eight pieces of LT information DATA(INFDT), which are serially transferred in accordance with transfer dock signals PL1 and PL2, are converted at a time to parallel LT data for transference in accordance with transfer dock signal PL2.

For gate circuit GT of serial receiving circuit 555<7> in the last stage, the H- and L-levels of enable signal E7 are controlled by shift signal SO, which in turn is output from serial receiving circuit 555<0> in the first stage. More specifically, by applying shift signal SO to gate circuit GT provided for serial receiving circuit 555<0>, enable signal E7 generated from gate circuit GT attains H-level when shift signals S0 and S6 are at L- and H-levels, respectively. Alternatively, a dummy serial receiving circuit may be arranged, and the H- and L-levels of enable signal E7 may be controlled by an output signal S8 of this dummy serial receiving circuit or dummy shift circuit SR.

The number of data of the parallel LT information is not restricted to eight, and may be larger or smaller than eight. By adjusting the number of serial receiving circuits shown in FIG. 26, an arbitrary number of LT information pieces can be produced.

Figure 31:
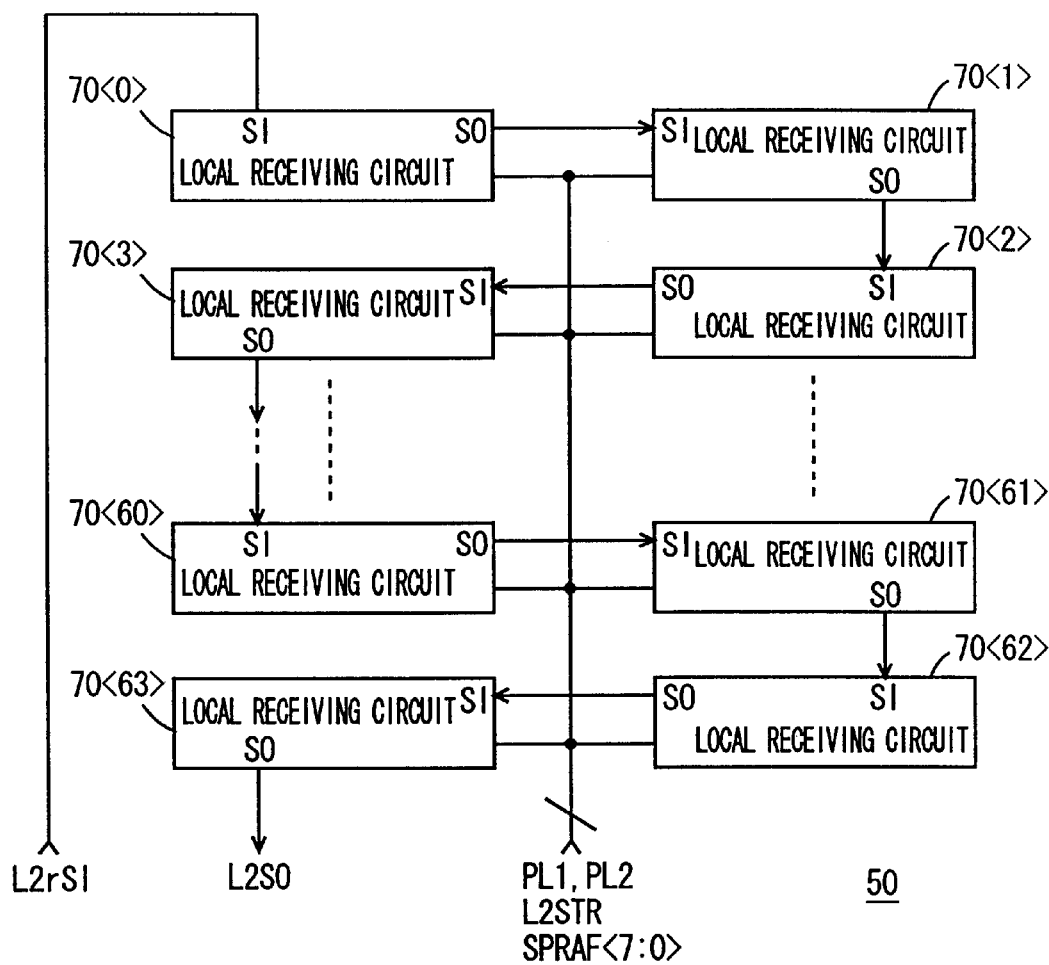
FIG. 31 schematically shows a structure of a parallel receiving circuit shown in FIG. 24.

FIG. 31 schematically shows a structure of parallel receiving circuit 50 shown in FIG. 24. In FIG. 31, parallel receiving circuit 50 includes local receiving circuits 70<0>–70<63>, which are arranged corresponding to the internal circuits each requiring the LT information. These local receiving circuits 70<0>–70<63> are commonly supplied with transfer clock signals PL1 and PL2, load instructing signal L2STR and LT information SPRF<7:0>.

In the structure shown in FIG. 31, transfer start instructing signal L2rSI is successively applied to local receiving circuits 70<0>–70<63> in a meandering manner. More specifically, each of local receiving circuits 70<0>–70<63> is activated, when the transfer start instructing signal applied to a serial input SI thereof attains L-level, to latch parallel LT information SPRAF<7:0> in accordance with load instructing signal L2STR. As shown in FIG. 31, local receiving circuits 70<0>–70<63> are successively activated in a meandering sequence, whereby the LT information for the respective internal circuits is set along one side toward the other side in the DRAM core. If local receiving circuits 70<0>70<63> are associated with different kinds of internal circuits, the LT information for the same kind of internal circuits can be successively set by storing the LT information in the meandering fashion as shown in FIG. 31.

Figure 32:
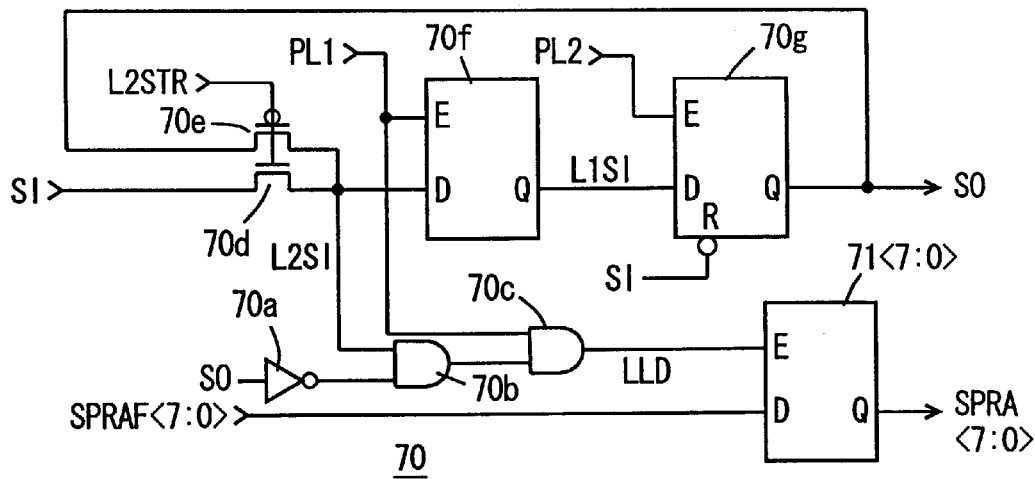
FIG. 32 schematically shows a structure of a local receiving circuit shown in FIG. 31.

FIG. 32 schematically shows a structure of local receiving circuits 70<0>–70<63> shown in FIG. 31. Local receiving circuits 70<0>–70<63> have the same structure, and FIG. 32 representatively shows only one local receiving circuit 70.

In FIG. 32, local receiving circuit 70 includes: an inverter 70a for inverting the signal on serial output SO, an N-channel MOS transistor 70d rendered conductive to transmit the transfer start instructing signal applied via serial input SI when load instructing signal L2STR is active at H-level; a P-channel MOS transistor 70e rendered conductive to pass the signal on serial output node SO when load instructing signal L2STR is at L-level; an AND circuit 70b receiving signals transmitted through MOS transistors 70d and 70e as well as the output signal of inverter 70a; an AND circuit 70c receiving transfer clock signal PL1 and the output signal of AND circuit 70b; a D-latch 71<7:0> entering the through state to pass parallel LT information SPRAF<7:0> applied from the parallel latch circuit (see FIG. 24) when output signal LLD of AND circuit 70c is at H-level, and entering the latch state when the output signal of AND circuit 70c attains L-level; a D-latch 70f entering the through state to pass the signal transmitted through one of MOS transistors 70d and 70e when transfer clock signal PL1 is at H-level; and D-latch 70g entering the through state to pass the signal generated at an output Q of D-latch 70f and transmit it to output node SO when transfer clock signal PL2 is at H-level.

Figure 33:
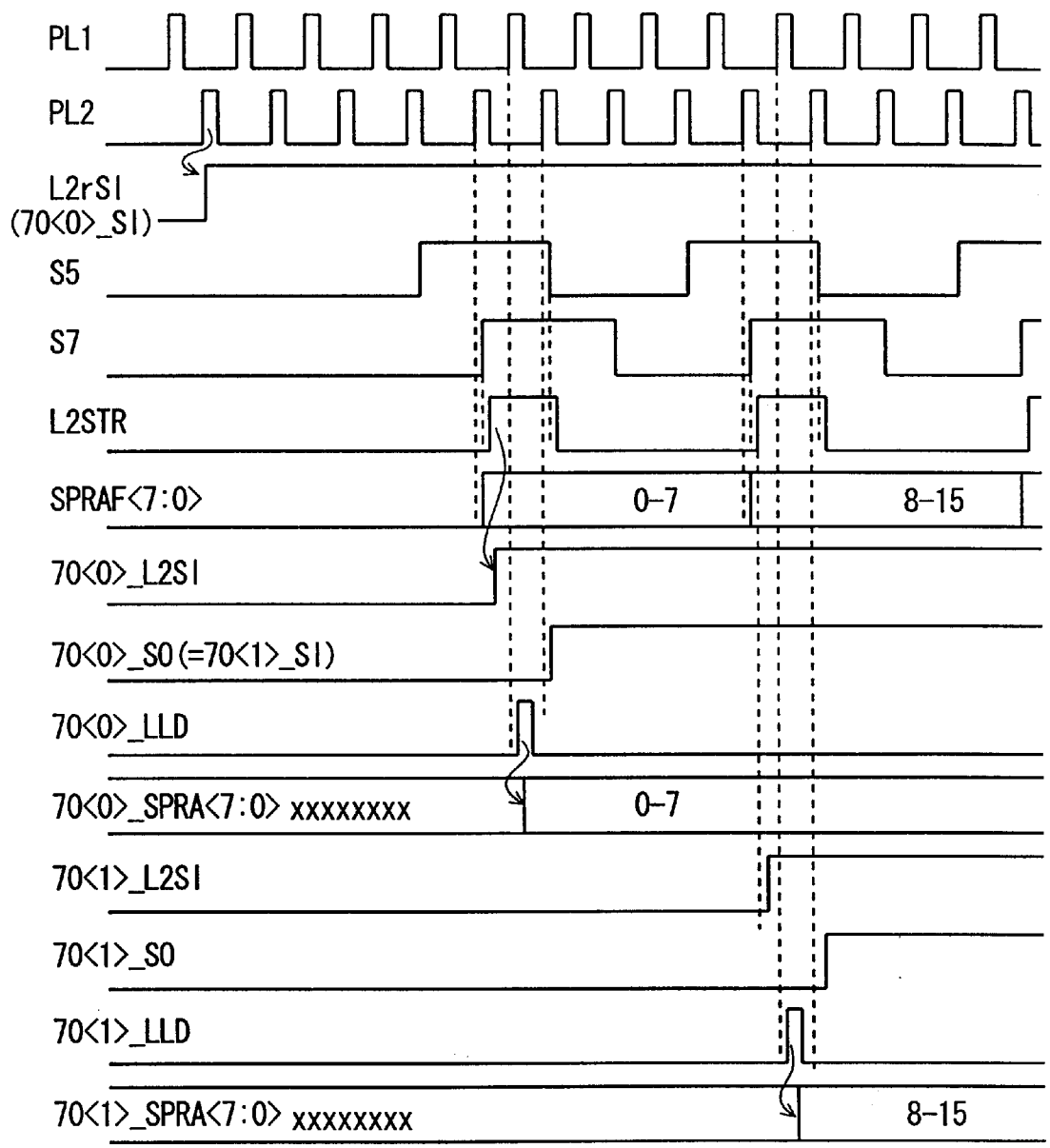
FIG. 33 is a timing chart representing an operation of the local receiving circuit shown in FIGS. 31 and 32.

D-latch 71<7:0> outputs eight bits of LT information SPRA<7:0> in parallel. Thus, D-latch 71<7:0> includes D-latches provided corresponding to the respective LT information bits. In the structure shown in FIG. 32, LT information SPRA<7:0> is applied to a spare row redundant circuit provided for repairing a defective word line. More specifically, LT information SPRA<7:0> is applied to a defective row address program circuit. Operations of parallel receiving circuit 50 and local receiving circuit 70 shown in FIGS. 31 and 32 will now be described with reference to a timing chart shown in FIG. 33.

Transfer clock signals PL1 and PL2 are successively and alternately generated in response to activation (H-level) of the reset signal (not shown). In response to the rising of transfer clock signal PL2, transfer start instructing signal L2rSI is activated, and is applied from the transmitting circuit in the LT link portion to parallel receiving circuit 50. The data load circuit performs the data load operation in accordance with transfer start instructing signal L2rSI and transfer clock signals PL1 and PL2. When shift output signals S5 and S7 of the serial receiving circuit attain H-level, the data load circuit produces load instructing signal L2STR, which is active for a period of the H-level of these shift output signals S5 and S7.

In local receiving circuit 70<0>, when transfer start instructing signal L2rSI applied to its serial input SI is at H-level, and load instructing signal L2STR attains H-level, MOS transistor 70d shown in FIG. 32 is turned on to apply the signal at H-level to data input D of D-latch 70f D-latch 70f enters the through state in response to the rising of transfer clock signal PL1, to pass the signal at H-level and raise an internal latch signal LISI to H-level. AND circuit 70b receives signal L2SI at H-level through MOS transistor 70d. Since serial output SO of local receiving circuit 70<0> is at L-level, the output signal of inverter 70a is at H-level, and the output signal of AND circuit 70b is also at H-level. When transfer clock signal PL1 attains H-level, an output signal LLD of AND circuit 70c attains H-level, and D-latch 71<7:0> attains the through state. D-latch 71<7:0> is already supplied with parallel LT information SPRAF<7:0> on its data input D before the rising of load instructing signal L2STR, and output LT information SPRA<7:0> of D-latch <7:0> changes accordingly.

When transfer clock signal PL2 then rises to H-level, D-latch 70g shown in FIG. 32 enters the through state to pass signal LISI generated from D-latch 70f to raise the signal on serial output SO to H-level, and the output signal of inverter 70a attains L-level. Responsively, the output signals of AND circuits 70b and 70c attain L-level, and D-latch 71<7:0> attains the latch state. When load instructing signal L2STR falls to L-level, MOS transistor 70e shown in FIG. 32 is turned on to pass the signal at H-level on serial output SO. Thus, D-latches 70f and 70g transfer the signal at H-level on serial input SO in accordance with transfer clock signals PL1 and PL2 until load instructing signal L2STR attains H-level again. While the signal on serial output SO is at H-level, the output signal of inverter 70a is at L-level, and D-latch 71<7:0> maintains the latch state.

If parallel LT information is first loaded in this local receiving circuit 70<0>, the parallel LT information is then loaded in local receiving circuit 71<1>. More specifically, if the output signal on serial output SO of local receiving circuit 70<0> attains H-level, the signal on serial input SI of local receiving circuit 70<1> then attains H-level. While load instructing signal L2STR is at L-level, latching of the parallel LT information is not performed in local receiving circuit 70<1> because MOS transistor 70d therein is off so that the signal on its serial output SO is at L-level, and signals L2SI and LSD are at L-level.

When load instructing signal L2STR rises to H-level again, and parallel LT information SPRAF<7:0> is applied, MOS transistor 70d in local receiving circuit 70<1> is turned on so that signal L2SI applied to D-latch 70f rises to H-level. In local receiving circuit 70<0>, serial shift output SO is at H-level, and the latch state is kept so that the parallel LT information which is currently applied is not loaded. When output signal of inverter 70a is at H-level, and internal load instructing signal L2SI attains H-level in accordance with activation of load instructing signal L2STR, output signal LLD of AND circuit 70c attains H-level in response to the rising of transfer clock signal PL1, and D-latch 71<7:0> attains the through state. Therefore, D-latch 71<7:0> takes in following parallel LT information SPRAF<7:0> (8–15) applied simultaneously with load instructing signal L2STR, and attains the latch state when transfer clock signal PL1 attains the L-level.

In local receiving circuit 70<1>, when transfer clock signal PL2 attains H-level, D-latch 70g takes in output signal L1SI of D-latch 70f, and raises the signal on serial output SO to H-level, to enable subsequent local receiving circuit 70<2>. When this serial shift output SO attains H-level, the output signal of inverter 70a attains L-level so that D-latch 71<7:0> attains the latch state.

Thereafter, the load operation of parallel LT information described above is successively performed in accordance with activation of load instructing signal L2STR in local receiving circuits 70<2>–70<63> shown in FIG. 31. Finally, signal L2SO sent from serial output SO of local receiving circuit 70<63> attains H-level. Responsively, it is determined that loading of the necessary parallel LT information is completed in all local receiving circuits 70<0>–70<63>.

In LT link portion 7, therefore, the program information of the LT link elements is read out in the same sequence as the load sequence of LT information of local receiving circuits 70<0>–70<63> in this parallel receiving circuit, whereby the state (LT information) of LT link elements programmed in LT link portion 7 can be loaded in the respected local receiving circuits.

[Specific Example of Local Receiving Circuit]

Figure 34:
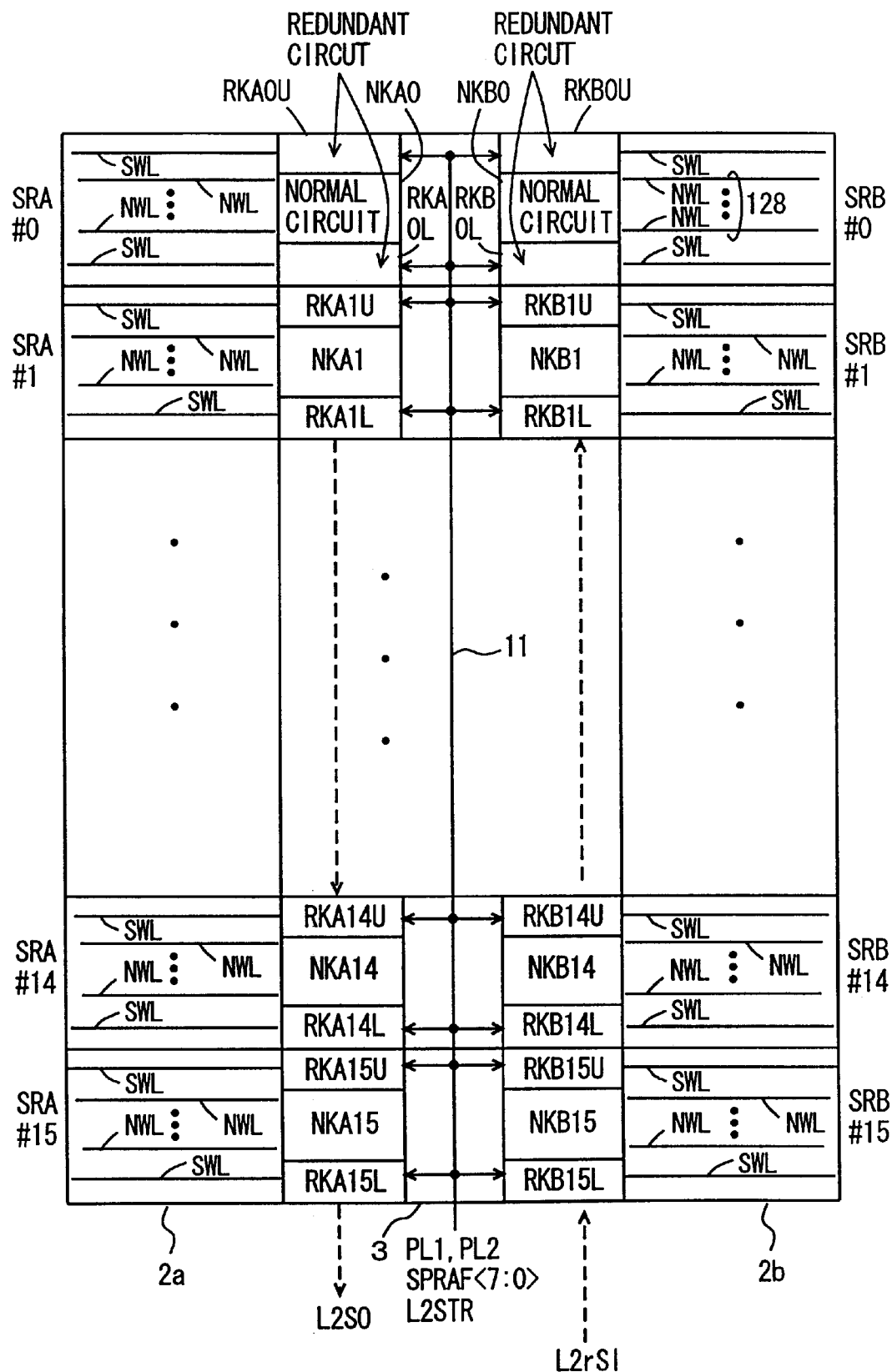
FIG. 34 shows a specific example of the local receiving circuit shown in FIG. 31.

FIG. 34 schematically shows a specific example of the local receiving circuit shown in FIG. 31. As shown in FIG. 1, row control portion 3 is arranged between memory cell arrays 2a and 2b. Each of memory cell arrays 2a and 2b is divided, as shown in FIG. 34, into 16 sub-row blocks SRA#0–SRA#15 or SRB#0–SRB#15. Each of sub-row blocks SRA#0 SRA#15 or SRB#0–SRB#15 includes two spare word lines SWL and 128 normal word lines NWL. Thus, two defective normal word lines can be repaired by the spare word lines in each of sub-row blocks SRA#0–SRA#15 or SRB#0–SRB#15.

In row control portion 3, normal circuits NKA0–NKA15 and NKB0–NKB15 are arranged for selecting normal word lines NWL in sub-row blocks SRA#0–SRA#15 and SRB#0–SRB#15, respectively.

Redundant circuits RKA0U and RKA0L–RKA15U and RKA15L are arranged corresponding to spare word lines SWL in sub-row blocks SRA#0–SRA#15. Each of these redundant circuits RKA0U and RKA0L–RKA15U and RKA15L stores a defective row address, and drives a corresponding spare word line SWL to the selected state when corresponding defective row address is designated.

Redundant circuits RKB0U and RKB0L–RKB15U and RKB15L are arranged corresponding to spare word lines in sub-row blocks SRB#0–SRB#15. Each of these redundant circuits RKB0U and RKB0L–RKB15U and RKB15L likewise stores a defective row address, and drives a corresponding spare word line SWL to the selected state when corresponding defective row address is designated. These redundant circuits execute repairing of the defective normal row on a sub-row block basis.

Redundant circuits RKA0U and RKA0L–RKA15U and RKA15L, and RKB0U and RKB0L–RKB15U and RKB15L are provided 64 in total number. In the corresponding sub-row block, 128 normal word lines NWL are arranged, and a row address is designated by the row address signal of 7 bits. Further, information of one bit is required for indicating use/nonuse of the spare word line. Therefore, each of redundant circuits RKA0U and RKA0L–RKA15U and RKA15L, and RKB0U and RKB0L–RKB15U and RKB15L latches and stores the LT information of 8 bits in total.

These redundant circuits RKA0U and RKA0L–RKA15U and RKA15L, and RKB0U and RKB0L–RKB15U and RKB15L are commonly supplied with transfer dock signals PL1 and PL2, parallel LT information SPRAF<7:0> and load instructing signal L2STR via control bus 11 extending in the column direction through row control portion 3. Parallel LT information SPRAF<7:0> is loaded, in a zigzag (meandering) fashion shown in FIG. 31, into corresponding redundant circuits RKA (generically indicating RKA0U and RKA0L–RKA15U and RKA15L) and RKB (generically indicating RKB0U and RKB0L–RKB15U and RKB15L). As depicted by broken lines in FIG. 34, however, transfer instructing signal L2rSI may be transmitted successively in the column direction to the redundant circuits RKB for memory cell array 2b aligned in the sequence starting from circuit RKB 15L to circuit RLB0U, and then the transfer instructing signal may be successively transferred to redundant circuits RKA0U–RKA15L provided for memory cell array 2a in this sequence. Thus, redundant circuits RKB and RKA may be configured to receive the shift instructing signal (transfer start instructing signal L2rSI) in the sequence of U-shape to be successively activated.

Figure 35:
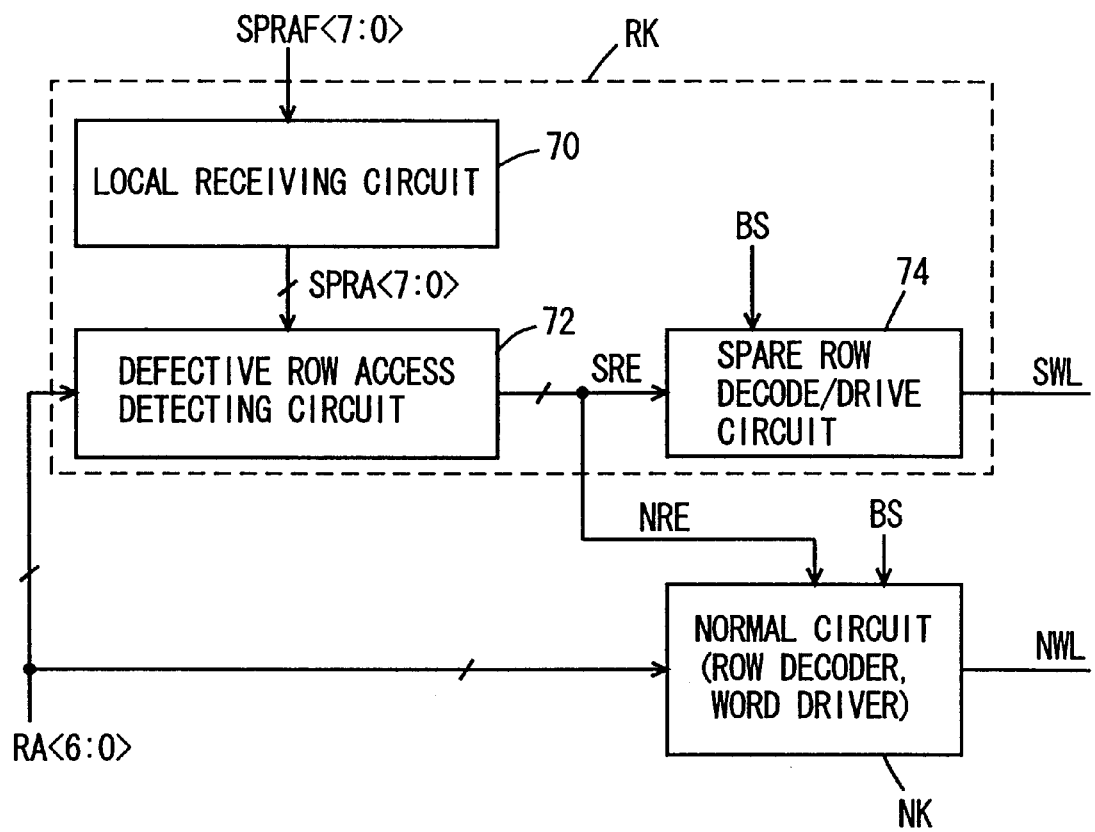
FIG. 35 schematically shows a structure of a redundant circuit shown in FIG. 34.

FIG. 35 schematically shows a structure of redundant circuits RKA and RKB shown in FIG. 34. Since redundant circuits RKA0U–RKA15U and RKA15L, and RKB0U–RKB15U and RKB15L have the same structure, FIG. 35 representatively shows only one redundant circuit RK.

In FIG. 35, redundant circuit RK includes: a local receiving circuit 70 for receiving and latching parallel LT information SPRAF<7:0>; a defective row access detecting circuit 72 receiving latch LT information SPRA<7:0> from local receiving circuit 70 and row address bits RA<6:0>, for detecting whether an address of a defective row is designated or not; and a spare row decode/drive circuit 74 for driving spare word line SWL to the selected state when block select signal BS designates the corresponding sub-row block while spare row enable signal SRE generated from defective row access detecting circuit 72 is active.

Normal circuit NK includes a row decoder which decodes row address bits RA<6:0>, and a word driver which drives a normal word line NWL to the selected state in accordance with the output signal of the row decoder. Normal circuit NK is activated to drive the corresponding addressed normal word line NWL to the selected state when normal row enable signal NRE is at H-level, and block select signal BS designates the corresponding sub-row block.

Local receiving circuit 70 latches and maintains the address corresponding to the defective row address, for which spare word line SWL is to be used, in this sub-row block. Defective row access detecting circuit 72 detects match/mismatch between the row address bits RA<6:0> of 7 bits and latched defective row address SPRA<6:0> sent from local receiving circuit 70. When match is detected, defective row access detecting circuit 72 drives spare row enable signal SRE to H-level, and drives normal row enable signal NRE to the inactive state at L-level. Highest bit SPRA<7> in latched defective row address SPRA<7:0> is used for representing whether a spare word line SWL is in use or not. In defective row access detecting circuit 72, match/mismatch between spare row address bits SPRA<6:0> and row address bits RA<6:0> is detected.

Figure 36:
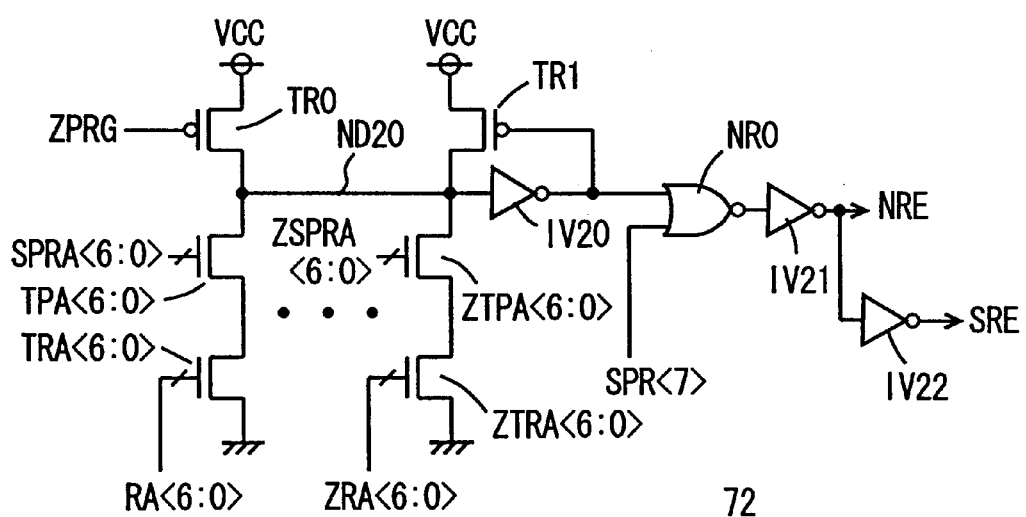
FIG. 36 shows an example of a spare row decode/drive circuit structure shown in FIG. 35.

FIG. 36 shows an example of the structure of the defective row access detecting circuit 72 shown in FIG. 35. In FIG. 36, defective row access detecting circuit 72 includes: a P-channel MOS transistor TR0 which is turned on to precharge a node ND20 to the power supply voltage level when precharge instructing signal ZPRG is at L-level; an inverter IV20 which inverts the signal on node ND20; a P-channel MOS transistor TR1 which is turned on to transmit power supply voltage VCC to node ND20 when the output signal of inverter IV20 is at L-level; N-channel MOS transistors TPA<6:0> and TRA<6:0> which are connected in series between node ND20 and the ground node, and receive spare row address bits SPRA<6:0> and row address bits RA<6:0> on their respective gates; and N-channel MOS transistors ZTPA<6:0> and ZTRA<6:0> which are connected in series between node ND20 and the ground node, and receive complementary spare row address bits ZSPRA<6:0> and row address bits ZRA<6:0> on their respective gates.

MOS transistor TPA<i> receives row address bit SPRA<i> on its gate, and MOS transistor TRA<i> receives row address bit RA<i> on its gate. MOS transistor ZTPA<i> receives complementary row address bit ZSPRA<i> on its gate, and MOS transistor ZTRA<i> receives complementary row address bit ZRA<i> on its gate.

Defective row access detecting circuit 72 further includes: an NOR gate NR0 which receives LT information bit SPR<7> and the output signal of inverter IV20; an inverter IV21 which inverts the output signal of NOR gate NR0, to produce normal row enable signal NRE; and an inverter IV22 which receives the output signal of inverter 21, and produces spare row enable signal SRE.

In the structure of defective row access detecting circuit 72 shown in 36, spare row address bits SPRA<6:0> and ZSPRA<6:0> are set to inverted values of the respective bit values of a defective row address. Thus, the state in which the LT link element is blown off corresponds to the state in which the defective row address bit is "1".

When the defective row address is not present, LT information bit SPR<7> is fixed to H-level, spare row enable signal SRE generated from inverter IV22 is fixed to L-level, and normal row enable signal NRE generated from inverter IV21 is fixed to H-level. When a defective row address is present, LT information bit SPR<7> is set to the state of "0", and NOR circuit NR0 operates as an inverter circuit. When the defective row address is designated, any one of the MOS transistors on the serial path is off in each of the sets of MOS transistors TPA<6:0> and TRA<6:0> as well as ZTPA<6:0> and ZTRA<6:0>. Therefore, a discharging path for node ND20 is not present, and node ND20 maintains the precharged state of H-level when this defective row address is designated. Even when precharge instructing signal ZPRG rises to H-level, the output signal of inverter IV20 is kept at L-level, so that node ND20 is held at H-level by MOS transistor TR1. Thereby, spare row enable signal SRE generated from inverter IV22 maintains H-level. Spare row decode/drive circuit 74 shown in FIG. 35 drives the corresponding spare word line SWL to the selected state. Normal row enable signal NRE generated from inverter W21 is at the L-level to inhibit the operation of driving a normal word line by normal circuit NK.

When a normal row address is designated, the MOS transistors connected in series are turned on in any of the sets of the serial paths of MOS transistors TPA<6:0> and TRA<6:0> and the serial paths of MOS transistors ZTPA<6:0> and ZTRA<6:0>. In this case, therefore, node ND20 is discharged to the ground voltage level, and the spare row enable signal SRE falls to L-level. Also, normal row enable signal NRE rises to H-level. In this case, normal circuit NK is activated to perform the row selection in accordance with row address bits RA<6:0> and drive the normal word line NWL corresponding to the addressed row to the selected state.

Each of normal row enable signal NRE and spare row enable signal SRE is logically operated with precharge instructing signal PRG, and normal row enable signal NRE and spare row enable signal SRE in the precharged state may be set to H- and L-levels, respectively.

Defective row access detecting circuit 72 may be provided with circuits, which detects match/mismatch of respective row address bits RA<6:0> and respective row address bits SPRA<6:0>, to activate/deactivate spare row enable signal SRE and normal row enable signal NRE in accordance with the output signals of these detection circuits.

The structure of defective row access detecting circuit 72 shown in FIG. 36 is merely an example, and may be appropriately determined in accordance with the structure of the defective row address program circuit used in this DRAM macro.

In row control portion 3, since the LT link element is not present, the area occupied by the redundant circuit can be reduced, and a margin for an interconnection layout area can be ensured, so that the layout efficiency can be optimized.

The local receiving circuit included in parallel receiving circuit may be not only the redundant circuit for defective row address repairing, but also be the redundant circuit for repairing the defective column address repairing, and also may be another circuit such as a circuit for adjusting the delay time of the sense amplifier activation timing or a circuit for adjusting the voltage level of a reference voltage.

According to the first embodiment of the invention, as described above, the LT link portion is arranged concentratedly outside the DRAM core, and the program information of the respective LT link elements in this LT link portion is successively transferred to the respective local receiving circuits in the DRAM macro for setting the states of the corresponding internal circuits. Therefore, an upper layer metal interconnection lines can be arranged in the DRAM core so that the flexibility in interconnection layout is improved.

In accordance with the position of the LT link portion, the interconnections between the macro blocks can be easily determined in the semiconductor integrated circuit device including the DRAM core. Further, by serially producing the LT information, it is possible to reduce the number of interconnection lines for transmitting the LT information from the LT link portion to the DRAM macro, and therefore increase in area occupied by the interconnection lines can be suppressed. In the LT link portion, fuse blocks are cascaded and the respective fuse blocks are formed with modules (library). Accordingly, even if the LT link elements are increased or decreased in number, this change can be easily coped with by increasing or decreasing the number of fuse blocks. By employing module structures, the LT link elements within any of the fuse blocks are arranged in an optimum fashion so that the reliability of the fuse blocks can be ensured.

Since the LT information which is serially transferred from the LT link portion is converted into the parallel LT information by the transfer control circuit, it is not necessary to provide the latch circuit and the signal transfer latch circuit for each LT information bit, so that increase in area occupied by the circuits can be suppressed.

Although the eRAM has been discussed as an example of DRAM core, the first embodiment can be applied to another kind of integrated circuit device subjected to the laser trimming, and this is true for any embodiments described below.

Second Embodiment

Figure 37:
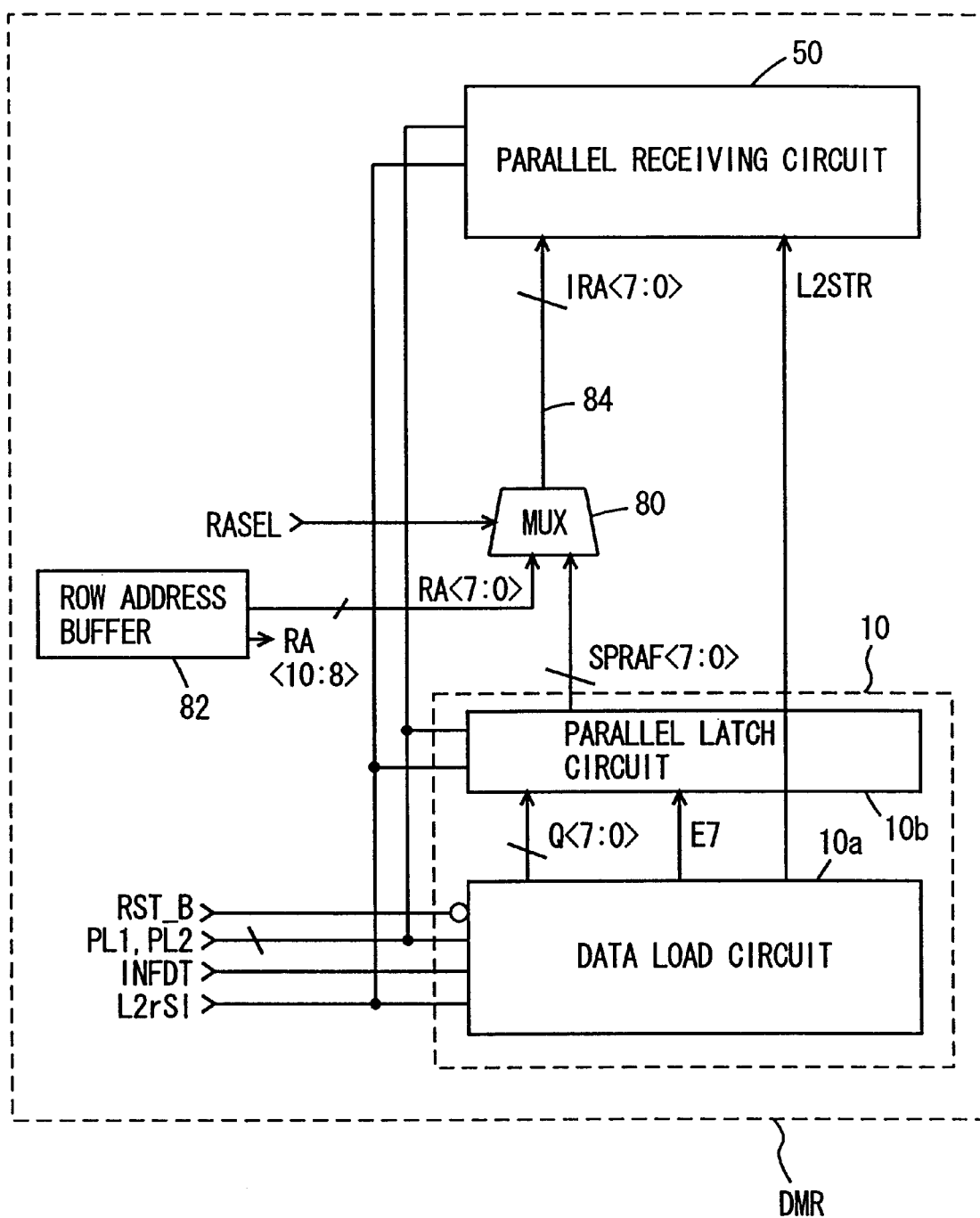
FIG. 37 schematically shows a structure of a main portion of a semiconductor integrated circuit device according to a second embodiment of the invention.

FIG. 37 schematically shows a structure of a main portion of a semiconductor integrated circuit device according to a second embodiment of the invention. In the structure shown in FIG. 37, a select circuit 80 is arranged between parallel receiving circuit 50 and transfer control circuit 10 for selecting row address bits RA<7:0> sent from row address buffer 82 or parallel LT information SPRAF<7:0> sent from parallel latch circuit 10*b* included in transfer control circuit 10.

Address bits sent from row address buffer 82 include seven row address bits for designating a word line and four block address bits for designating a sub-row block. Therefore, row address buffer 82 outputs at least an address RA<10:0>> of 11 bits. The LT information is transferred via an address bus 84, which transmits an row address of 8 bits among 11 bits of the row-related address. If parallel receiving circuit 50 includes redundant circuits, normal circuits are arranged near the respective redundant circuits. For transferring the LT information via address bus 84, therefore, address bus 84 is connected commonly to these redundant circuits, and the spare row address bits can be set, as the LT information, in each respective redundant circuit. By transferring the LT information via address bus 84, it is not necessary to additionally arrange signal interconnection lines for transferring the parallel LT information, and increase in area occupied by the interconnection lines can be prevented.

A select signal RASEL applied to select circuit 80 is required to be activated in response to activation of transfer start instructing signal L2rSI and to be deactivated when the transfer ends. The detection of end of the transfer can be performed by detecting that an output L2SO shifted out from final local receiving circuit 70<63> shown in FIG. 31 attains H-level.

In the case where parallel receiving circuit 50 is formed of a delay circuit or an internal voltage generating circuit, appropriate signal lines neighboring thereto needs only to be utilized.

Third Embodiment

Figure 38:
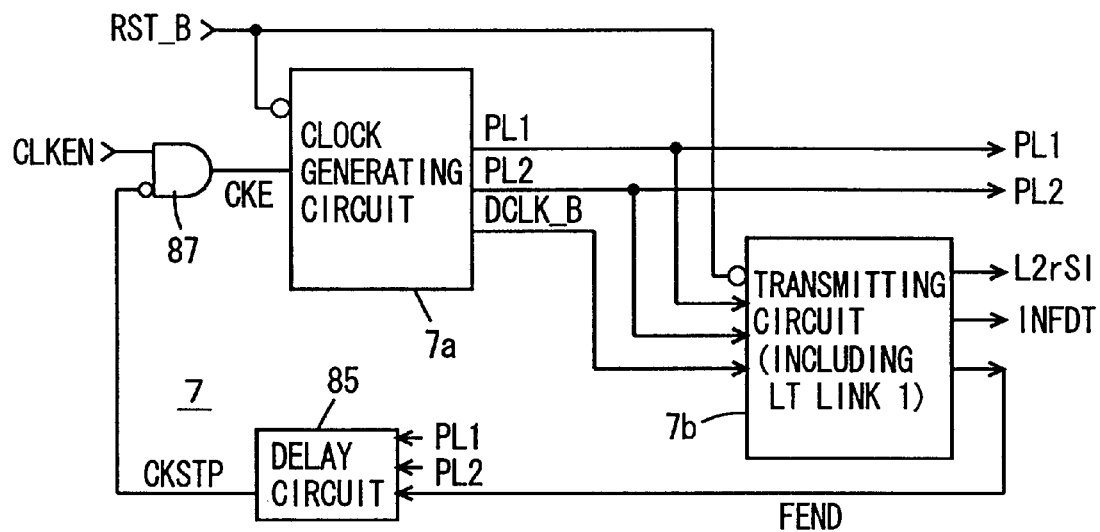
FIG. 38 schematically shows a structure of an LT link portion according to a third embodiment of the invention.

FIG. 38 schematically shows a structure of LT link portion 7 according to a third embodiment of the invention. In FIG. 38, LT link portion 7 includes: a delay circuit 85 which receives transfer end instructing signal FEND sent from transmitting circuit 7*b* as well as transfer clock signals PL1 and PL2, and produces a clock generation stop instructing signal CKSTP; and a gate circuit 87 which receives clock generation stop instructing signal CKSTP generated from delay circuit 85 and externally applied clock enable signal CLKEN, to generate clock control signal CKE to clock generating circuit 7*a*.

Clock generating circuit 7*a* performs an oscillation operation to produce transfer clock signals PL1 and PL2 as well as frequency-divided clock signal DCLK_B when clock control signal CKE is at H-level and reset signal RST_B is at L-level. Transmitting circuit 7*a* operates in accordance with clock signals PL1, PL2 and DCLK_B generated from clock generating circuit 7*a* when reset signal RST_B is at H-level, and serially transfers the program information (LT information) of LT link elements included therein.

Delay circuit 85 drives clock generation stop instructing signal CKSTP to the active state according to transfer end instructing signal FEND when a predetermined period elapses after transmitting circuit 7*b* transfers all the program information (LT information) of the LT link elements included therein.

Gate circuit 87 sets clock control signal CKE applied to clock generating circuit 7*a* to the inactive state at L-level regardless of the state of externally applied dock enable signal CLKEN when clock generation stop instructing signal CKSTP attains H-level. Clock generating circuit 7*a* stops the clock generating operation even when reset signal RST_B is at H-level. The operation of LT link portion 7 shown in FIG. 38 will now be described with reference to a timing chart of FIG. 39.

When reset signal RST_B rises to H-level, and externally applied clock enable signal CLKEN is driven to the active state, clock control signal CKE generated from gate circuit 87 first rises to H-level, and clock generating circuit 7*a* starts the oscillation operation. Transmitting circuit 7*b* serially transfers the program information (LT information) of the LT link elements arranged therein. When the information of the LT link elements of the final fuse block is transferred, transfer end instructing signal FEND attains H-level in response to the falling of transfer clock signal PL1 in accordance with serial shift output SIOUT<0> sent from the final fuse block shown in FIG. 16.

When transfer end instructing signal FEND rises to H-level, the transfer control circuit ends the transfer/latch operation in the DRAM macro, and latch end instructing signal L2SO shifted out from final local receiving circuit 70<63> shown in FIG. 31 attains H-level in response to the rising of transfer clock signal PL2. After transfer clock signals PL1 and PL2 are both activated subsequently to completion of latching of the LT information in the parallel receiving circuit, clock generation stop instructing signal CKSTP generated from delay circuit 85 attains H-level, and responsively, clock control signal CKE generated from gate circuit 87 attains L-level. Accordingly, clock generating circuit 7a stops the oscillation, and clock signals PL1, PL2 and DCLK_B are fixed to L-, L- and H-levels, respectively.

Clock generating circuit 7a operates only during a necessary period for the transfer operation, whereby the current consumption is reduced.

Figure 39:
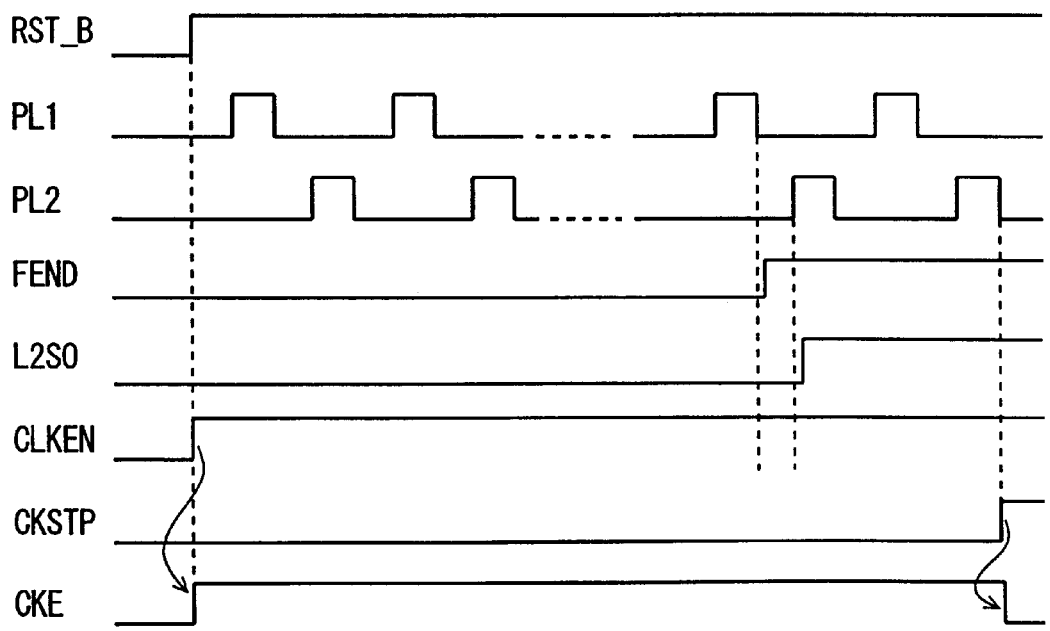
FIG. 39 is a timing chart representing an operation of the LT link portion shown in FIG. 38.

In the operation shown in FIG. 39, delay circuit 85 delays transfer end instructing signal FEND by one cycle period of transfer clock signals PL1 and PL2. The length of this delay time in delay circuit 85 merely required to be appropriately determined in view of the signal propagation delay in the transfer control circuit and the parallel receiving circuit. In any case, it is merely required to ensure a period required for such an operation that transmitting circuit 7b of LT link portion 7 transfers the LT information to transfer control circuit 10 in FIG. 37, and then parallel receiving circuit 50 latches the corresponding LT information.

Figure 40:
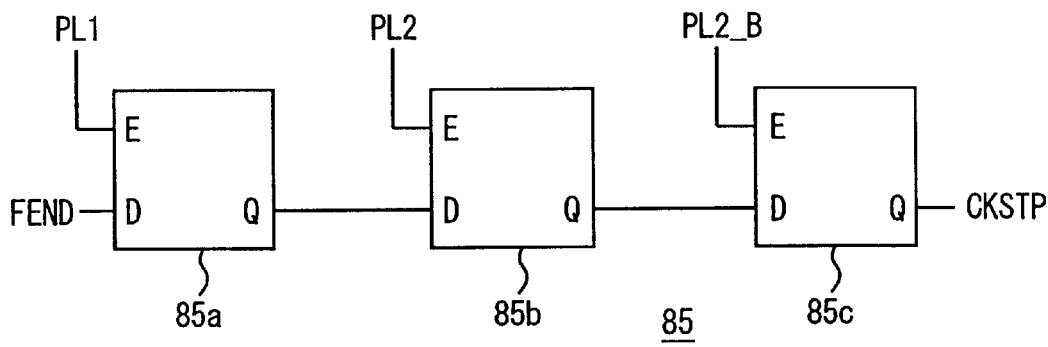
FIG. 40 shows, by way of example, a structure of a delay circuit shown in FIG. 38.

FIG. 40 shows an example of the structure of delay circuit 85 shown in FIG. 38. In FIG. 40, delay circuit 85 includes: a D-latch 85a which enters the through state in accordance with transfer dock signal PL1, to pass transfer end instructing signal FEND; a D-latch 85b which enters the through state when transfer clock signal PL2 is at H-level, to pass a signal generated at output Q of D-latch 85a; and D-latch 85c which enters the through state when transfer clock signal PL2_B is at H-level, to pass a signal generated at output Q of D-latch 85b for producing dock generation stop instructing signal CKSTP.

In the structure of delay circuit 85 shown in FIG. 40, D-latch 85a takes in transfer end instructing signal FEND in synchronization with the rising of transfer dock signal PL1. Transfer end instructing signal FEND attains H-level in response to the falling of transfer clock signal PL1, as shown in FIGS. 21 and 39. Therefore, transfer end instructing signal FEND is taken into D-latch 85a in response to the rising of transfer clock signal PL1 subsequently to activation of transfer end instructing signal FEND. Transfer end instructing signal FEND taken into D-latch 85a is successively transferred in accordance with transfer clock signals PL2 and PL2_B. Therefore, clock generation stop instructing signal CKSTP becomes active, when complementary transfer clock signal PL2_B attains H-level, in synchronization with the falling of transfer clock signal PL2.

The structure of delay circuit 85 shown in FIG. 40 may be replaced with a structure, in which transfer clock signals PL1 and PL2 are counted after transfer end instructing signal FEND attains the active state of H-level, and clock generation stop instructing signal CKSTP is activated when the count reaches a predetermined value. In either case, it is at least required that clock generating circuit 7a stops the clock generating operation after all the necessary LT information is loaded in the parallel receiving circuit.

According to the third embodiment of the invention, as described above, the clock generating circuit for generating the clock signal for transfer is driven to the active state only for a period required for transferring and loading the LT information, and operates only when required so that the current consumption can be reduced.

Fourth Embodiment

Figure 41:
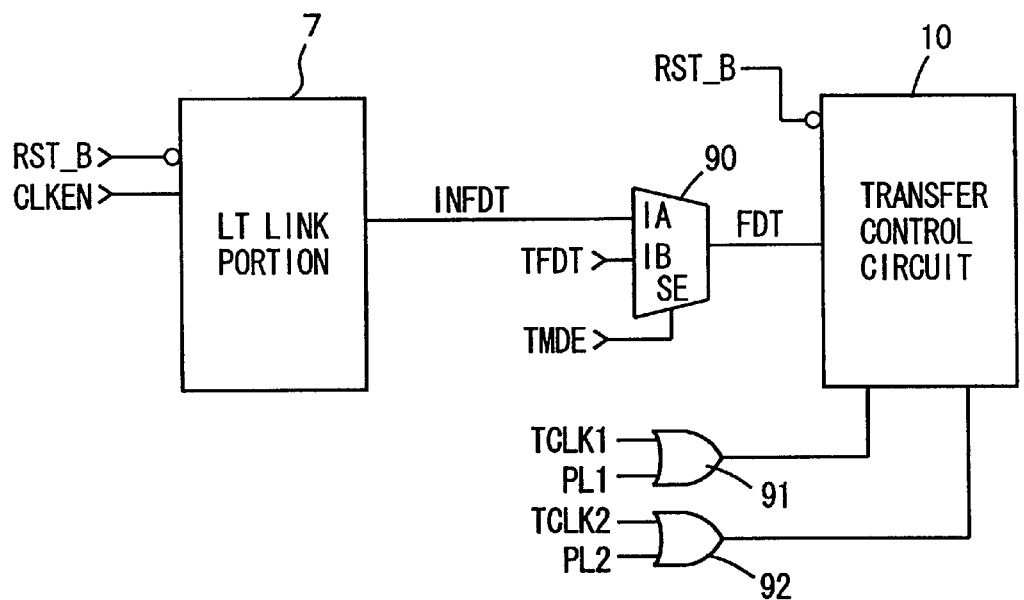
FIG. 41 schematically shows a structure of a main portion of a semiconductor integrated circuit device according to a fourth embodiment of the invention.

FIG. 41 schematically shows a structure of a main portion of a semiconductor integrated circuit device according to a fourth embodiment of the invention. In the structure shown in FIG. 41, a select circuit 90 is arranged between LT link portion 7 and transfer control circuit 10, and selects one of serial LT information INFDT sent from LT link portion 7 and externally applied test link information TFDT in accordance with a test mode instructing signal TMDE. Transfer control circuit 10 is provided with: an OR circuit 91 which receives test clock signal TCLK1 and clock signal PL1, and applies its output signal to transfer control circuit 10; and an OR circuit 92 which receives test clock signal TCLK2 and transfer clock signal PL2, and applies its output signal to transfer control circuit 10.

During the operation of transferring the LT link information, test mode instructing signal TMDE is inactive, and select circuit 90 selects serial link information INFDT sent from LT link portion 7, and applies it to transfer control circuit 10. In this case, OR circuits 91 and 92 produce transfer control signals in accordance with transfer clock signals PL1 and PL2, and apply the produced transfer control signals to transfer control circuit 10. Therefore, the operations already described in connection with the first to third embodiments are achieved.

In the test mode, test mode instructing signal TMDE becomes active, and externally applied test link information TFDT is applied to transfer control circuit 10 via select circuit 90. In this case, externally applied test link information TFDT is transferred in accordance with test dock signals TCLK1 and TCLK2. OR circuits 91 and 92 apply the transfer clock signal synchronized with this test link information TFDT to transfer control circuit 10. Thus, transfer control circuit 10 can accurately take in externally applied test link information TFDT, to convert it into parallel link information to be transferred to and latched by each local receiving circuit.

In the case where transfer control circuit 10 is externally supplied with test link information TFDT, each latch information of the local receiving circuit in the parallel receiving circuit can be set in accordance with the externally applied test information. Therefore, with a delay time, a reference voltage level and others being set in accordance with the externally applied link information, the DRAM macro can be operated to test the operation margin and others of the DRAM macro. Before fixedly programming the program information of the LT link elements with laser, the spare row address bits or the like can be set in accordance with the externally applied test link information, and thus the test can be accurately performed for determining whether a defective bit can be repaired or not.

Test link information TFDT may be applied via a test interface circuit (TIF), which in turn is provided for externally and directly testing the eRAM not through a logic, or may be applied via a dedicated pin terminal.

For externally setting the LT information, the test before the laser trimming step is the one at the wafer level, and therefore, the test mode instructing signal TMDE and test link information may be applied via specific pads.

Select circuit 90 can be arranged inside or outside the DRAM macro.

Figure 42:
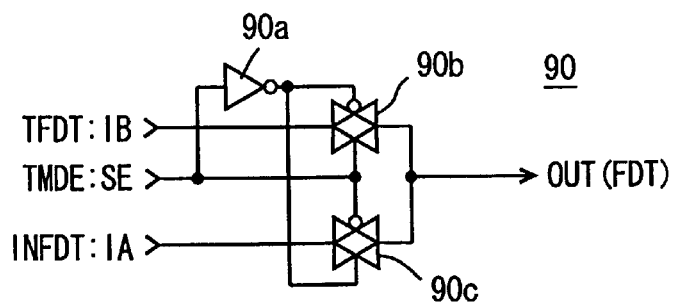
FIG. 42 shows, by way of example, a structure of a select circuit shown in FIG. 41.

FIG. 42 shows an example of the structure of select circuit 90 shown in FIG. 41. In FIG. 41, select circuit 90 includes: an inverter 90a for inverting test mode instructing signal TMDE applied to a select input SE; a CMOS transmission gate 90b that is selectively turned on, in accordance with the output signal of inverter 90a and test mode instructing signal TMDE, to select test link information TFDT for application to a node IB; and a CMOS transmission gate 90c which is turned on complementarily to CMOS transmission gate 90b in response to test mode instructing signal TMDE and the output signal of inverter 90a, and passes serial link information INFDT applied to its input node IA when turned on. Serial information FDT for transfer control circuit 10 is produced on output node OUT. For test dock signals TCLK1 and TCLK2, the two clock transfer paths may not be employed. A structure similar to that of transfer dock generating circuit 13 shown in FIG. 4 may be utilized for producing two test clock signals TCLK1 and TCLK2 from one test dock signal TCLK. In this case, test link information TFDT is externally and serially applied in accordance with test clock signal TCLK.

According to the fourth embodiment of the invention, as described above, the link information of the local receiving circuit can be set based on the externally applied information, and therefore change and set of the accurate LT information can be performed.

Fifth Embodiment

Figure 43:
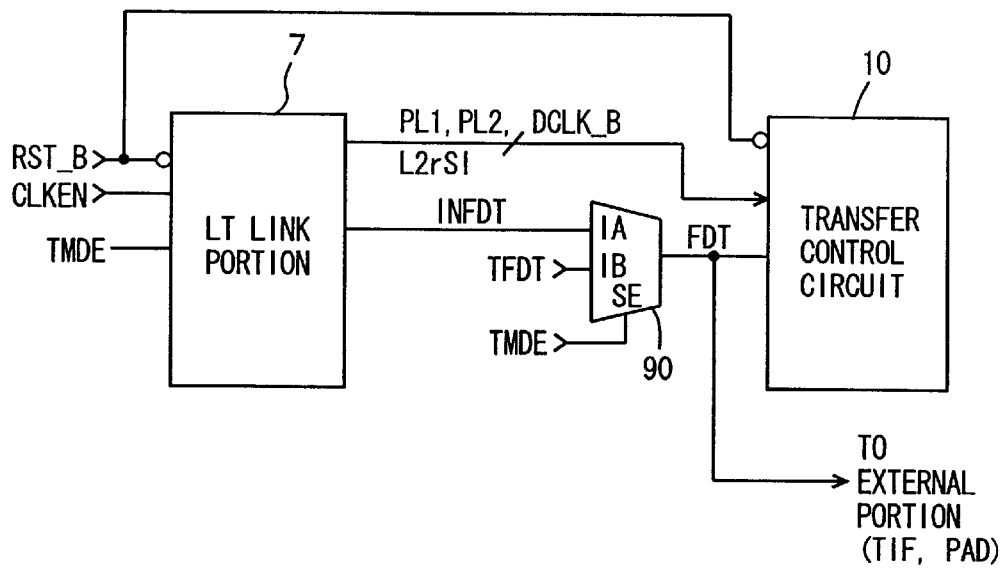
FIG. 43 schematically shows a structure of a main portion of a semiconductor integrated circuit device according to a fifth embodiment of the invention.

FIG. 43 schematically shows a structure of a main portion of a semiconductor integrated circuit device according to a fifth embodiment of the invention. In the structure shown in FIG. 43, LT link information FDT output from select circuit 90, which selects either serial LT information INFDT sent from LT link portion 7 or externally applied test link information TFDT, is transfer externally. LT link information FDT outputted from select circuit 90 is externally transferred via a test interface circuit TIF), which is provided for testing a timing margin or the like of the DRAM macro, or is transferred to a specific pad (pin terminal).

The LT link information transferred from LT link portion 7 includes chip management information, and the LT link information for each chip can be externally held. The chip management information includes an identification number (e.g., a manufacturing number) assigned to each respective chip as well as a specification value (e.g., I/O data bit width, operation frequency and operation power supply voltage). By externally holding the LT link information for each chip, it is possible to determine a distribution of variations in operation characteristic among chips or wafers. Data of this distribution can be fed back to a floor plan or the like depending on the characteristics of the manufactured chips, to improve the operation margin and others.

In external monitoring of LT link information FDT, transfer clock signals PL1 and PL2 generated from the clock generating circuits included in LT link portion 7 are likewise output externally, and an external testing apparatus executes sampling of LT link information FDT in accordance with transfer clock signals PL1 and PL2. In this case, it is necessary to output externally transfer clock signals PL1 and PL2, or a logical-ORed signal of transfer clock signals PL1 and PL2. Alternatively, the LT link information may be externally transferred in accordance with test clock signal TCLK.

Figure 44A:
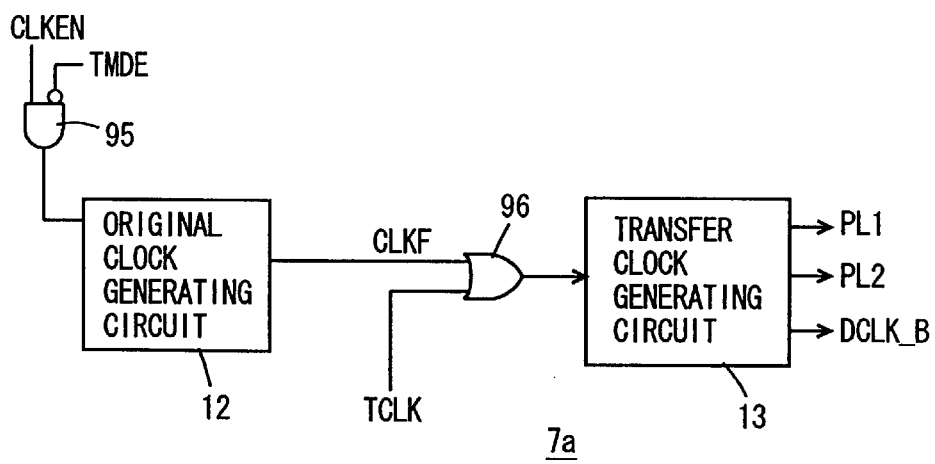
FIG. 44A schematically shows a structure of a dock generating circuit of an LT link portion shown in FIG. 43.

FIG. 44A schematically shows a structure of the clock generating circuit included in LT link portion 7 shown in FIG. 43. The structure shown in FIG. 44A corresponds to the structure shown in clock generating circuit 7a shown in FIG. 7. Clock generating circuit 7a includes: a gate circuit 95 which receives test mode instructing signal TMDE and clock control signal CLKEN; an original clock generating circuit 12 which is activated, when the output signal of gate circuit 95 is at H-level, to perform an oscillation at a predetermined cycle to produce an original clock signal CLKF; an OR circuit 96 which receives original clock signal CLKF generated from original clock generating circuit 12 and test clock signal TCLK; and a transfer clock generating circuit 13 which generates clock signals PL1, PL2 and DCLK_B in accordance with the output clock signal of OR circuit 96. Original clock generating circuit 12 and transfer clock generating circuit 13 have structures similar to those already described with reference to FIGS. 5 and 7.

Figure 44B:
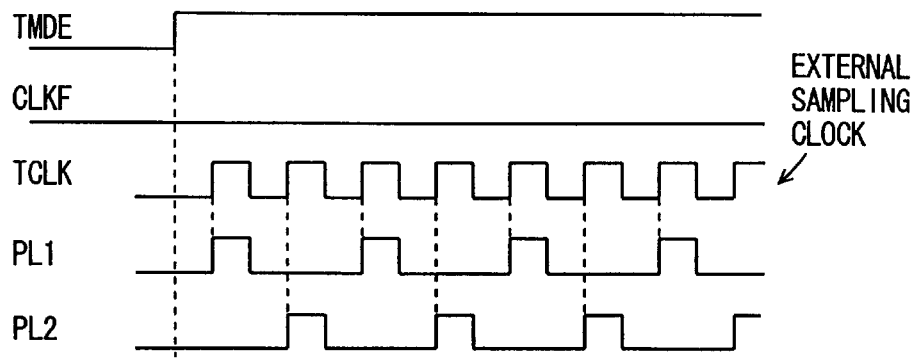
FIG. 44B is a timing chart representing an operation of the clock generating circuit shown in FIG. 44A.

In the structure of clock generating circuit 7a shown in FIG. 44A, when test mode instructing signal TMDE attains H-level as shown in FIG. 44B, original clock generating circuit 12 stops the oscillation operation. In the test mode, test clock signal TCLK is externally applied, and OR circuit 96 outputs, as the original clock signal, the signal corresponding to test clock signal TCLK. Transfer clock signals PL1 and PL2 as well as frequency-divided clock signal DCLK_B which are sent from transfer clock generating circuit 13 are produced in accordance with externally applied test clock signal TCLK. Accordingly, in the case where serial LT link information INFDT sent from LT link portion 7 is selected and is externally transferred as link information FDT in the test mode, the transfer cycle of link information FDT can be set in accordance with test clock signal TCLK, and therefore the LT link information can be externally transferred in accordance with the operation speed of the external testing apparatus.

As shown in FIG. 44A, test clock signal TCLK is used for producing transfer clock signals PL1 and PL2, and the external testing apparatus can perform sampling of LT link information FDT applied from select circuit 90 in accordance with test clock signal TCLK, and without reading externally transfer clock signals PL1 and PL2, the sampling can be performed at accurate timing.

Alternatively, such a structure may be employed that reset signal RST_B is applied from an external testing apparatus, and transfer clock signals PL1 and PL2 are externally output. Although test clock signal TCLK is not generated in the external testing apparatus, LT link information FDT can be sampled at an accurate timing. Any of the foregoing structures can be employed.

Figure 45:
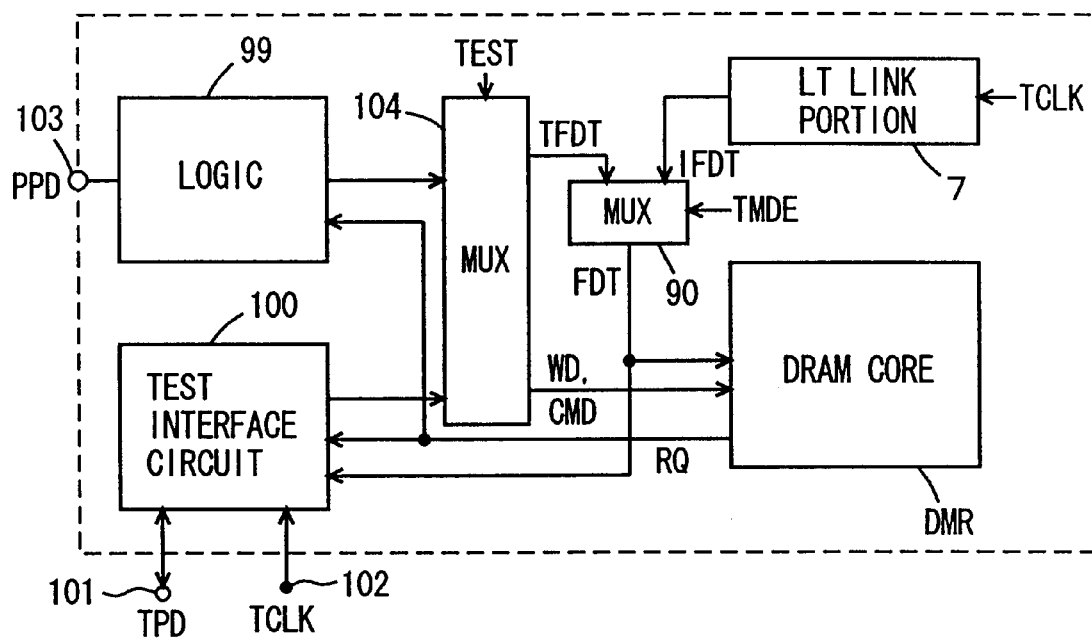
FIG. 45 schematically shows a whole structure of a semiconductor integrated circuit device according to a fifth embodiment of the invention.

FIG. 45 schematically shows, by way of example, a whole structure of the semiconductor integrated circuit device according to the fifth embodiment of the invention. In FIG. 45, the semiconductor integrated circuit device includes a logic 99 and a test interface circuit 100, which are integrated on the same semiconductor chip with DRAM core DMR. Logic 99 performs external input/output of signal/data PPD via a logic pin terminal group 103. Test interface circuit 100 externally inputs and outputs test data/signal TPD with external testing apparatus via a test pin terminal group 101, and receives test clock signal TCLK from the external testing apparatus via a test clock terminal 102.

Logic 99 and test interface circuit 100 are coupled to DRAM core DMR via a select circuit (MUX) 104. Select circuit (MUX) 104 couples test interface circuit 100 to DRAM core DMR in accordance with test mode instructing signal TEST in the test operation mode of DRAM macro DMR. Test interface circuit 100 applies control signal/data required for testing DRAM core DMR, to DRAM core DMR via select circuit 104 in accordance with test clock signal TCLK. Data RQ read from DRAM core DMR is applied to test interface 100 and logic 99 without passing through select circuit 104. This is done for eliminating data delay in select circuit 104 in the data read operation, to achieve fast transfer of read data.

Select circuit (MUX) 90 selects one of serial LT link information IFDT applied from LT link portion 7 and test link information TFDT applied from select circuit 104, and applies the selected information to transfer control circuit 10 in DRAM core DMR. Link information FDT sent through select circuit 90 is also applied to test interface circuit 100. Therefore, serial link information IFDT, which is sent from LT link portion 7 and is selected by select circuit 90, is transferred to test terminal pin group 101 via test interface circuit 100, and is monitored by the external testing apparatus.

Figure 46:
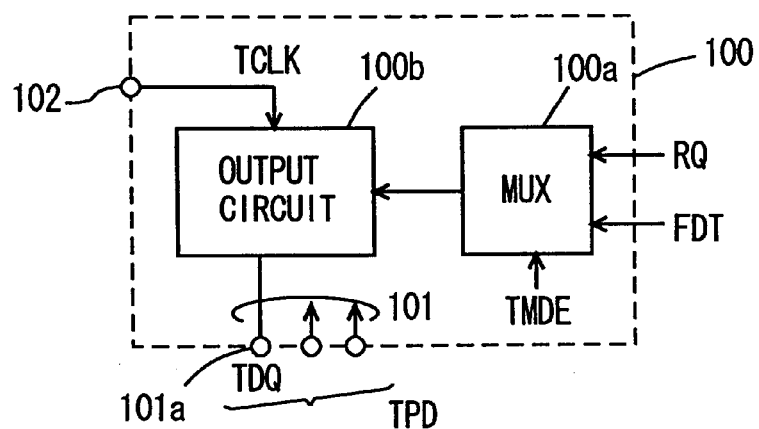
FIG. 46 schematically shows a structure of a test interface circuit shown in FIG. 45.

FIG. 46 schematically shows a structure of the data output portion of test interface circuit 100 shown in FIG. 45. In FIG. 46, test interface circuit 100 includes: a select circuit (MUX) 100a which selects one of read data RQ read from DRAM core DMR and LT link information FDT sent through select circuit (MUX) 90; and an output circuit 100b for transmitting the information, which is selected by select circuit (MUX) 100a, to a specific pin terminal 101a included in test pin terminal group 101 in accordance with test clock signal TCLK applied through a test clock input terminal 102.

Select circuit 100a selects one of read data RQ read from DRAM core DMR and LT link information FDT sent through select circuit 90 in accordance with activation/deactivation of test mode instructing signal TMDE. Output circuit 10b outputs the data applied from select circuit 100a in synchronization with test clock signal TCLK. In accordance with test clock signal TCLK, transfer clock signals PL1 and PL2 are produced, and link information FDT is applied to test interface circuit 100 via select circuit 90. These transfer clock signals PL1 and PL2 are synchronized with test clock signal TCLK, and output circuit 100b outputs LT link information FDT sent through select circuit (MUX) 100a in synchronization with test clock signal TCLK. Thus, the external testing apparatus can accurately sample information TDQ applied to specific pin terminal 101a included in test pin terminal group 101.

While test mode instructing signal TEST is active, various tests are effected on the DRAM macro, and test mode instructing signal TMDE is activated during the period of active state of test mode instructing signal TEST. Test mode instructing signal TMDE is produced in test interface circuit 100, and is applied to select circuit 90 via select circuit 104. Generally, test interface circuit 100 includes a circuit for generating the operation mode instructing signal used for performing the operation designated by a command applied from the testing apparatus. Thus, select circuits 90 and 100 can be easily set to the predetermined state by applying the test mode instructing command to test interface circuit 100.

In the structure of the semiconductor integrated circuit device shown in FIG. 45, the LT link information applied from select circuit 90 is externally read out via test interface circuit 100. However, if the semiconductor integrated circuit device has an unassigned (non-used) pin terminal, select circuit 90 may transmit the LT link information directly to this unassigned pin terminal. If the external monitoring of the LT link information is performed only in the laser trimming step, which is the final step at the wafer level, and is not performed after being packaged, select circuit 90 may be configured to transmit LT link information FDT to a specific pad. In this case, the testing apparatus makes an electrical contact directly with the specific pad for sampling the LT link information.

In the structure shown in FIG. 45, select circuit 90 is arranged outside DRAM core DMR. However, select circuit 90 may be arranged within DRAM core DMR.

According to the fifth embodiment of the invention, as described above, the program information of the LT link elements stored in LT link portion 7 can be externally monitored, so that it is easy to determine whether the programming of the LT link element is correctly performed or not.

Sixth Embodiment

Figure 47:
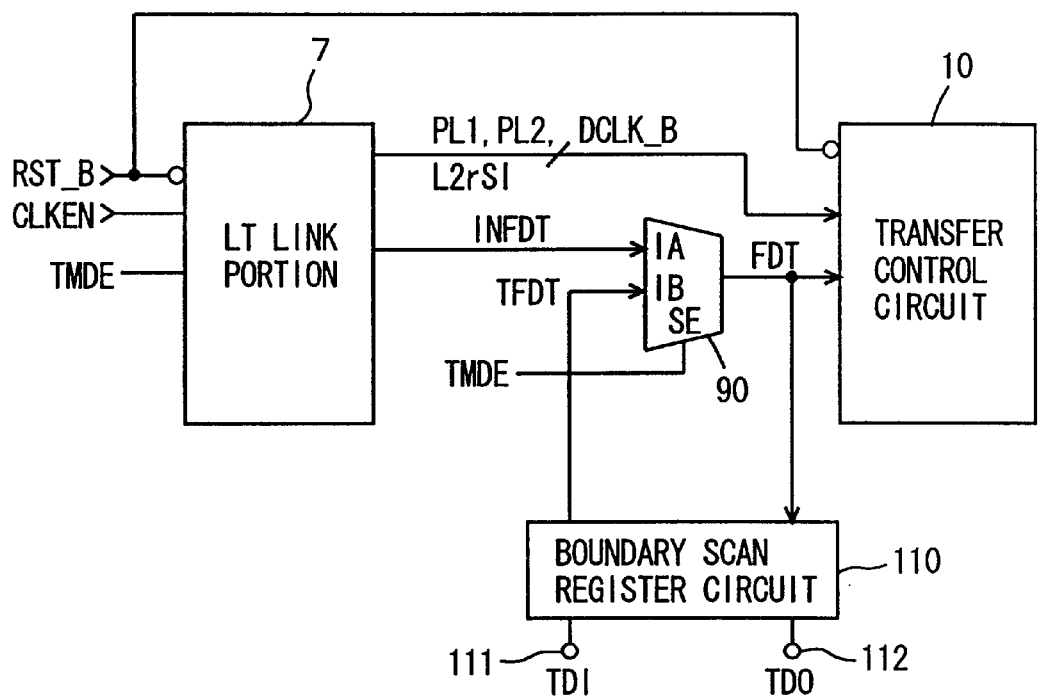
FIG. 47 schematically shows a structure of a main portion of a semiconductor integrated circuit device according to a sixth embodiment of the invention.

FIG. 47 schematically shows a structure of a main portion of a semiconductor integrated circuit device according to a sixth embodiment of the invention. In the structure shown in FIG. 47, a boundary scan register circuit 110 is connected to select circuit 90 arranged between LT link portion 7 and transfer control circuit 10. More specifically, externally applied test LT link information TFDT is applied to input IB of select circuit 90 via boundary scan register 110, and LT link information FDT applied from select circuit 90 is externally transferred via boundary scan register circuit 110. This boundary scan register circuit 110 successively receives and transfers shift-in test data TD1 sent through a test input terminal 111, and outputs shift-out test data TDO via a test output terminal 112.

Generally, the boundary scan register circuit is employed for externally setting the states of internal nodes of the semiconductor integrated circuit device, and for externally monitoring the internal states. Boundary scan register circuit 110 provides a serial scan path formed of a plurality of boundary scan registers. Via this serial scan path, the test data is successively transferred to set the states of the internal nodes, and the data indicating the states of the internal nodes are successively transferred. By utilizing the boundary scan register circuit 110, the test operation can be performed within the DRAM core, and further the external setting and external monitoring of the LT link information can be likewise achieved.

Figure 48:
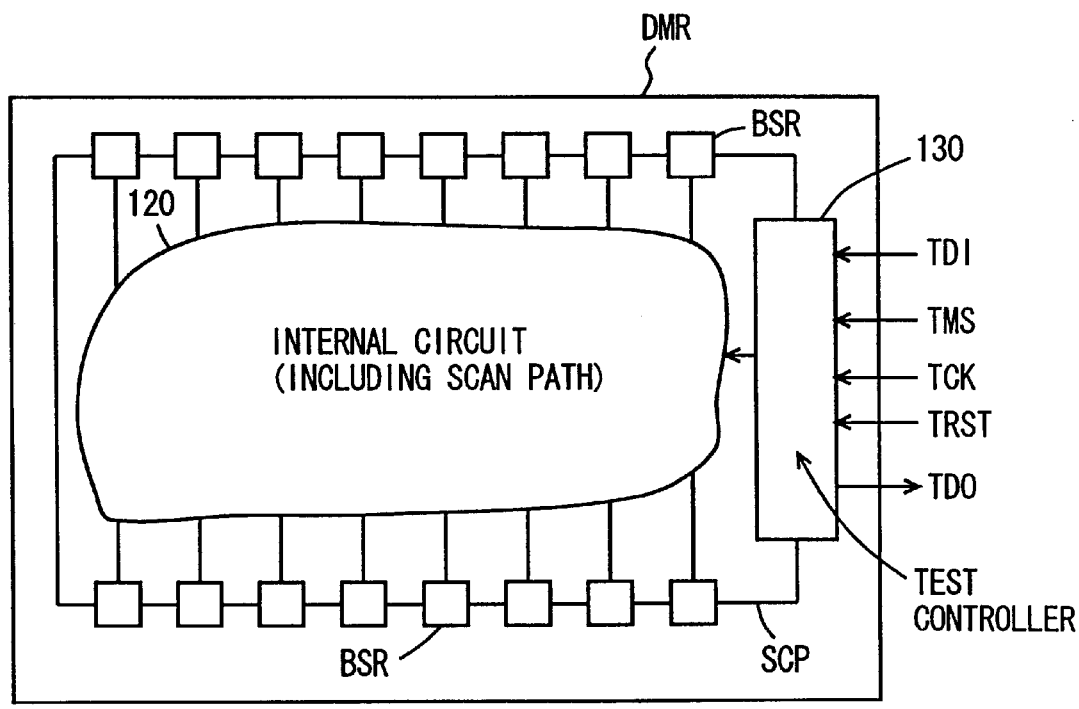
FIG. 48 schematically shows a structure of a boundary scan register circuit shown in FIG. 47.

FIG. 48 schematically shows a structure of boundary scan register circuit 110. In FIG. 48, boundary scan registers BSR are arranged around an internal circuit 120 of the DRAM core. Each boundary scan register BSR can transmit and receive the signal/data to and from internal circuit 120. Boundary scan registers BSR connected in series form a scan path SCP. Scan path SCP is coupled to test controller 130, and the transfer of test data, setting of the states of internal nodes and external reading of the states of internal nodes are performed under the control of test controller 130.

Internal circuit 120 needs only to be a predetermined internal circuit within DRAM core DMR, and boundary scan register BSR is arranged for each signal/data I/O terminal of the DRAM core. By setting boundary scan register BSR for each of the I/O nodes of DRAM core DMR, the predetermined internal state can be easily set in DRAM core DMR.

Test controller 130 controls the transfer of signal/data of boundary scan register BSR. Test controller 130 externally receives an input test data TDI, a test mode select command TMS, a test clock signal TCK and a test reset signal TRST, and successively sets test input data TDI by the shift operation via boundary scan registers BSR for setting the states of boundary scan registers BSR.

Test controller 130 operates internal circuit 120 after test input data TDI are latched by boundary scan registers BSR via scan path SCP formed of boundary scan registers BSR. Subsequently, output test data TDO is output by the shift operation after the states of the respective internal nodes in internal circuit 120 are latched by corresponding boundary scan registers BSR.

Internal circuit 120 may be provided with a scan path for allowing observation of the internal nodes. Select circuit 90 may be arranged within boundary scan register circuit 110.

Figure 49:
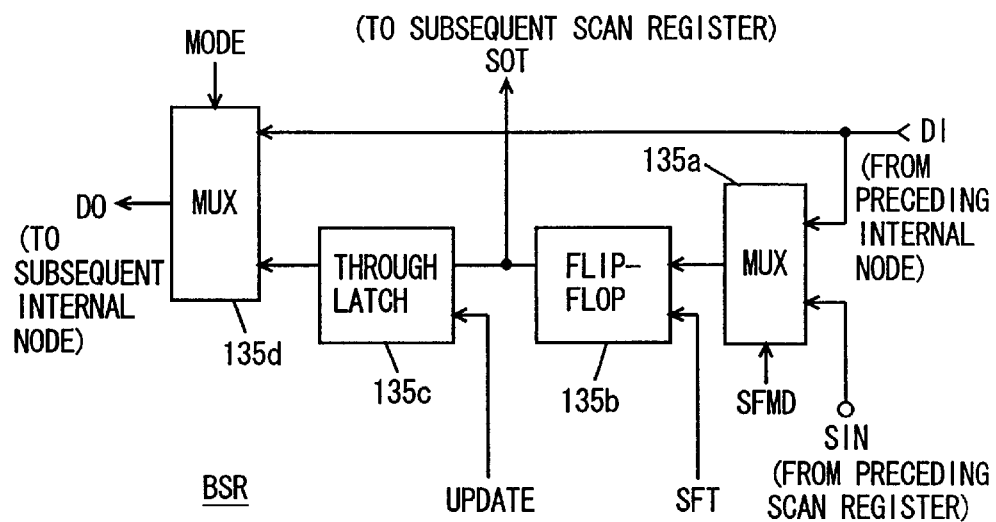
FIG. 49 schematically shows a structure of a boundary scan register circuit shown in FIG. 48.

FIG. 49 schematically shows an example of the structure of boundary scan register BSR shown in FIG. 48. In FIG. 49, boundary scan register BSR includes: a multiplexer (MUX) 135a which selects one of a shift-in signal SIN and an internal signal DI in accordance with a shift mode instructing signal SFMD; a flip-flop (shift register) 135b which takes in and transfers the signal applied from multiplexer 135a in accordance with shift clock signal SFT; a through latch 135c which takes in the output signal of flip-flop 135b in accordance with an update instructing signal UPDATE; and a multiplexer (MUX) 135d which selects and outputs one of internal signal DI and the output signal of through latch 135c in accordance with mode instructing signal MODE.

Shift mode instructing signal SFMD, mode instructing signal MODE, shift clock signal SFT and update instructing signal UPDATE are generated from test controller 130 shown in FIG. 48.

In the scan test mode, shift mode instructing signal SFMD indicates which is selected, the internal signal or the signal (shift-in signal) SIN shifted out from the scan register in the preceding stage in the scan path. Flip-flop 135b forms the shift register in scan path SCP, and shifts the signal applied from multiplexer 135a in accordance with shift clock signal SFT. Flip-flop 135b produces shift-out signal SOT for the subsequent scan register in scan path SCP.

When update instructing signal UPDATE becomes active, through latch 135c enters the through state for passing the output signal of flip-flop 135b therethrough. When update instructing signal UPDATE is inactive, through latch 135c enters the latch state to inhibit passing of the output signal of flip-flop 135b, and is kept in the state of latching output signal SOT of flip-flop 135b.

Multiplexer 135d selects internal signal DI when mode instructing signal MODE designates the normal operation mode, and selects the signal sent from through latch 135c in the test operation mode.

If the boundary scan register BSR is provided for the input buffer, the internal node in the preceding stage provides the output signal of the input buffer, and the internal node on the following stage is the circuit receiving the output signal of this input buffer. If boundary scan register BSR is provided for the output buffer circuit, the preceding internal node is the output node of the circuit applying signal/data to this output buffer, and the succeeding internal node is the input node of the corresponding output buffer.

By utilizing boundary scan register BSR, the voltage level on an internal node of internal circuit 120 is externally set to a desired level. Boundary scan register BSR may be arranged as a scan register, in which case the internal node of the internal circuit can be set to an intended state, and the state of the internal node can be externally monitored.

Figure 50:
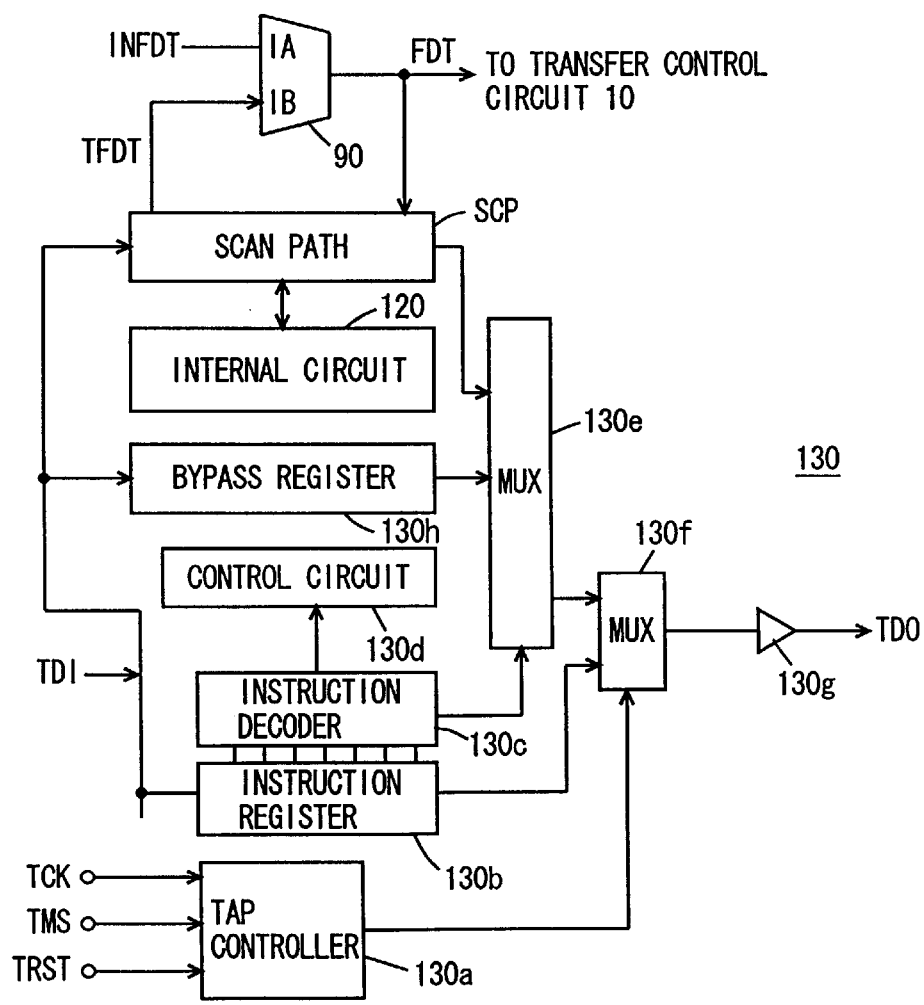
FIG. 50 schematically shows a structure of a test controller shown in FIG. 48.

FIG. 50 schematically shows a structure of test controller 130 shown in FIG. 48. Internal circuit 120 bidirectionally transmits signal/data to and from scan path SCP including boundary scan registers BSR. Scan path CP may include a scan path for allowing observation of the internal node of internal circuit 120.

Test controller 130 includes: a TAP (Test Access Port) controller 130a which receives test clock signal TCK applied in the test mode, test mode select signal TMS for selecting and designating the test mode, and test reset signal TRST for resetting the test mode, and produces the internal clock signal for the boundary scan test; an instruction register 130b which serially receives, bit by bit, test data TDI applied via the test data input terminal; an instruction decoder 130c which decodes the instruction stored in instruction register 130b for producing a control signal required for the test; and a control circuit 130d which produces control signals required for the test in accordance with the decoded signal applied from instruction decoder 130c. Control circuit 130d controls transfer/latch of signal/data of the boundary scan register in scan path SCP, and produces various control signals already described and shown in FIG. 49.

Test controller 130 includes: a multiplexer (MUX) 130e which selects either the output signal/data of scan path SCP or the output signal of a bypass register 130h in accordance with the output signal of instruction decoder 130d; a multiplexer (MUX) 130f which selects the signal/data from either multiplexer 130e or instruction register 130b in accordance with the output signal of TAP controller 130a; and a driver/buffer 130g which buffers and outputs the signal/data received from multiplexer 130f to test data output terminal TDO. In the normal operation mode, test data output terminal TDO is set to the high-impedance state.

Test controller 130 is adapted to a JTAG (Joint Test Action Group) test, and further includes a user-definable register group, of which use is defined by a user, although not shown in FIG. 50. The boundary scan test performed with test controller 130 is standardized according to the IEEE standards, but an instruction for coupling scan path SCP to select circuit 90 is added as an instruction to be applied to instruction decoder 130 in the present embodiment.

In a "pseudo LT test mode", in which the program information of LT link elements are externally set, the LT link information is applied as test input data TDI to select circuit 90 via scan path SCP. This select circuit 90 is set to the state of selecting test LT link information TFDT under the control of control circuit 130, and LT link information FDT output from select circuit 90 is applied to transfer control circuit 10. In another test mode, LT link information FDT output from select circuit 90 is taken into scan path SCP, and LT link information INFDT sent from LT link portion 7 shown in FIG. 47 is taken into scan path SCP via select circuit 90, and subsequently is output as test data output signal TDO by multiplexers 130e and 130f as well as the driver/buffer. 130b According to the IEEE standards, an instruction "Capture-DR" can be used to take data/signal into a boundary scan register, and an instruction "Update-DR" can be used to apply the signal/data stored in the boundary scan register to an internal node in a subsequent stage.

Bypass register 130h is utilized for bypassing the associated semiconductor integrated circuit device. This is because the boundary scan test is usually supposed to be performed at a board level, and is performed by externally monitoring the internal states of semiconductor chips mounted on the board chip by chip.

In the structure shown in FIG. 50, scan path SCP is coupled to select circuit 90. However, such a structure may be employed that select circuit 90 is supplied with test input data TDI, and LT link information FDT received from select circuit 90 is applied to multiplexer (MUX) 130e. In this case, the scan operation in scan path SCP is not performed, and the LT information is transferred to transfer control circuit 10 via select circuit 90, or serial LT link information INFDT is externally read via select circuit 90 and multiplexer 130e. In this case, it is not necessary to perform the scan operation in scan path SCP, and loading and external reading of the LT link information can be performed fast.

In the case of utilizing boundary scan register BSR, transfer clock signals PL1, PL2 and DCLK_B are produced in accordance with test dock signal TCLK. This is for the purpose of performing internal transfer/load of the LT link information in accordance with external input/output of the test data.

In the structure shown in FIG. 48, test controller 130 is arranged in DRAM core DMR. However, test controller 130 may be arranged outside DRAM core DMR. As already described, test controller 130 is standardized in accordance with the IEEE standards, and a test controller registered in a library can be used as test controller 130. In addition to the test controller of standard specifications, an instruction for connecting the select circuit with the scan path must be added for setting and transferring the LT link information.

As described above, according to the sixth embodiment of the invention, the boundary scan register is utilized for externally setting and externally transferring the LT link information. In the case where this boundary scan register is provided for testing the DRAM core, external setting and external monitoring of the LT link information can be easily achieved.

Seventh Embodiment

Figure 51:
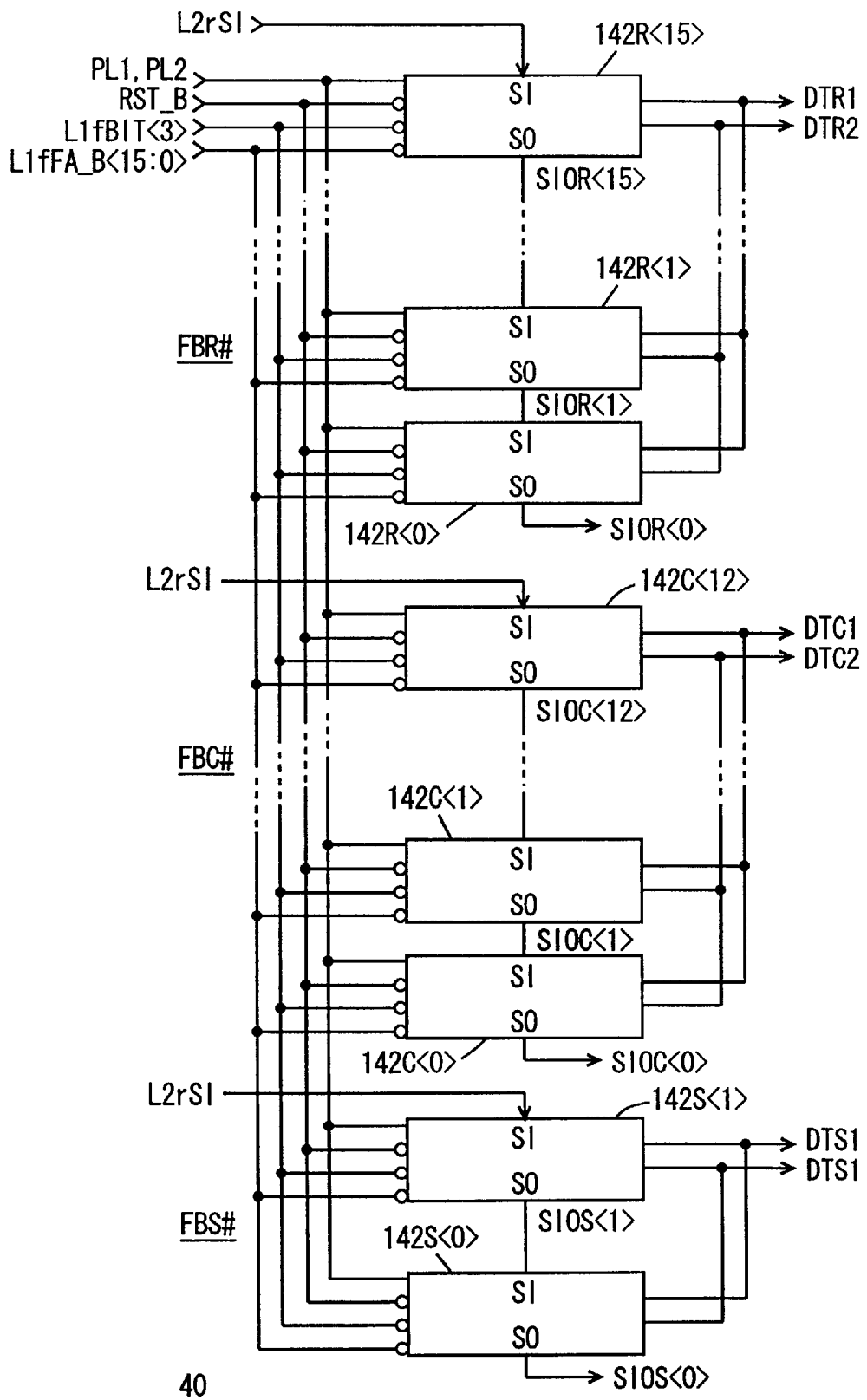
FIG. 51 schematically shows a structure of an LT link portion according to a seventh embodiment of the invention.

FIG. 51 schematically shows a structure of LT link circuit group 40 included in transmitting circuit 7b according to a seventh embodiment of the invention. In FIG. 51, LT link circuit group 40 includes three fuse block groups FBR#, FBC# and FBS#. Fuse block group FBR# stores spare row address bits of a DRAM core, fuse block group FBC# stores spare column address bits of the DRAM core, and fuse block group FBS# stores LT information of an SRAM core. This SRAM core is integrated on the same semiconductor chip with the DRAM core, and forms a system LSI. The LT link information stored in fuse block group FBS# for the SRAM core may be spare row/column address bits of the SRAM core, or may be the LT link information for setting the data bit width.

In FIG. 51, fuse block group FBR# includes cascaded 16 fuse blocks 142R<15>–142R<0>. These fuse blocks 142R<15>–142R<0> have shift inputs SI and shift outputs SO sequentially connected in series. Shift signals SIOR<15>–SIOR<0> sent from shift outputs SO of fuse blocks 142R<15>–142R<1> are applied to the fuse blocks in the subsequent stages, respectively. Fuse blocks 142R<15>–142R<0> are commonly supplied with transfer clock signals PL1 and PL2, and reset signal RST_B as well as highest count bit L1fBIT_B<3> and decode signals L1fFA_B<15:0> sent from counter/decoder 39 shown in FIG. 10. Fuse blocks 142R<15>–142R<0> are successively activated to output in parallel the stored data of their internal LT link information as data DTR1 and DTR2.

Fuse block group FBC# includes cascaded fuse blocks 142C<12>142C<0>. These fuse blocks 142C<12>–142C<0> have shift inputs SI and shift outputs SO connected in series, and fuse blocks 142C<12>142C<1> apply shift signals SIOC<12>–SIOC<1> from their respective fuse outputs SO to the subsequent fuse bocks.

Fuse block group FBS# includes two fuse blocks 142S<1> and 142S<0>. Shift output SO of fuse block 142S<1> is coupled to shift input SI of fuse block 142S<0>, and these are successively activated to output data DTS1 and DTS2 held therein in parallel.

These fuse blocks 142C<12>–142C<0> and 142S<1> and 142S<0> are commonly supplied with transfer clock signals PL1 and PL2, reset signal RST_B, count bit L1fBT_B<3> and decode signals L1fFA_B<15:0>. Fuse blocks 142R<15>, 142C<12> and 142S<1> in the first stages of fuse block groups FBR#, FBC# and FBS# commonly receive transfer start instructing signal L2rSI on their respective shift inputs SI.

Fuse blocks 142R<15>–142R<0>, 142C<12>–142C<0> and 142S<1>–142S<0> have the structures already described and shown in FIG. 18 and FIGS. 20A and 20B.

In LT link circuit group 40 shown in FIG. 51, therefore, fuse block groups FBR#, FBC# and FBS# operate in parallel in accordance with transfer start instructing signal L2rSI, and output the program information in accordance with transfer clock signals PL1 and PL2, respectively. Therefore, LT link circuit group 40 shown in FIG. 51 outputs LT link information DTR1, DTR2, DTC1, DTC2, DTS1 and DTS2 in parallel in accordance with transfer dock signals PL1 and PL2.

Figure 52:
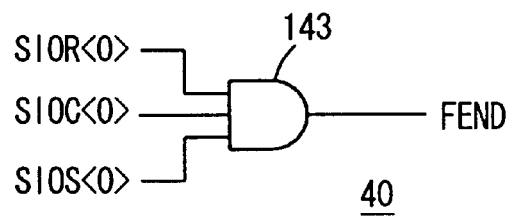
FIG. 52 shows a structure of a transfer end instructing signal generating portion of the LT link portion in the seventh embodiment of the invention.

FIG. 52 shows a structure of a transfer end instructing signal generating portion included in LT link circuit group 40. In FIG. 52, transfer end instructing signal FEND is produced by an AND circuit 143, which receives an output signal SIOR<0> of fuse block 142R<0>, a signal SIOC<0> generated at shift output SO of fuse block 142C<0> and shift-out signal SIOS<0> generated shift output OF of fuse block 142S<0>. Therefore, transfer end instructing signal FEND is driven to the active state when transfer of data of all the fuse blocks is completed in fuse block group FBR# including the largest number of fuse blocks.

Figure 53:
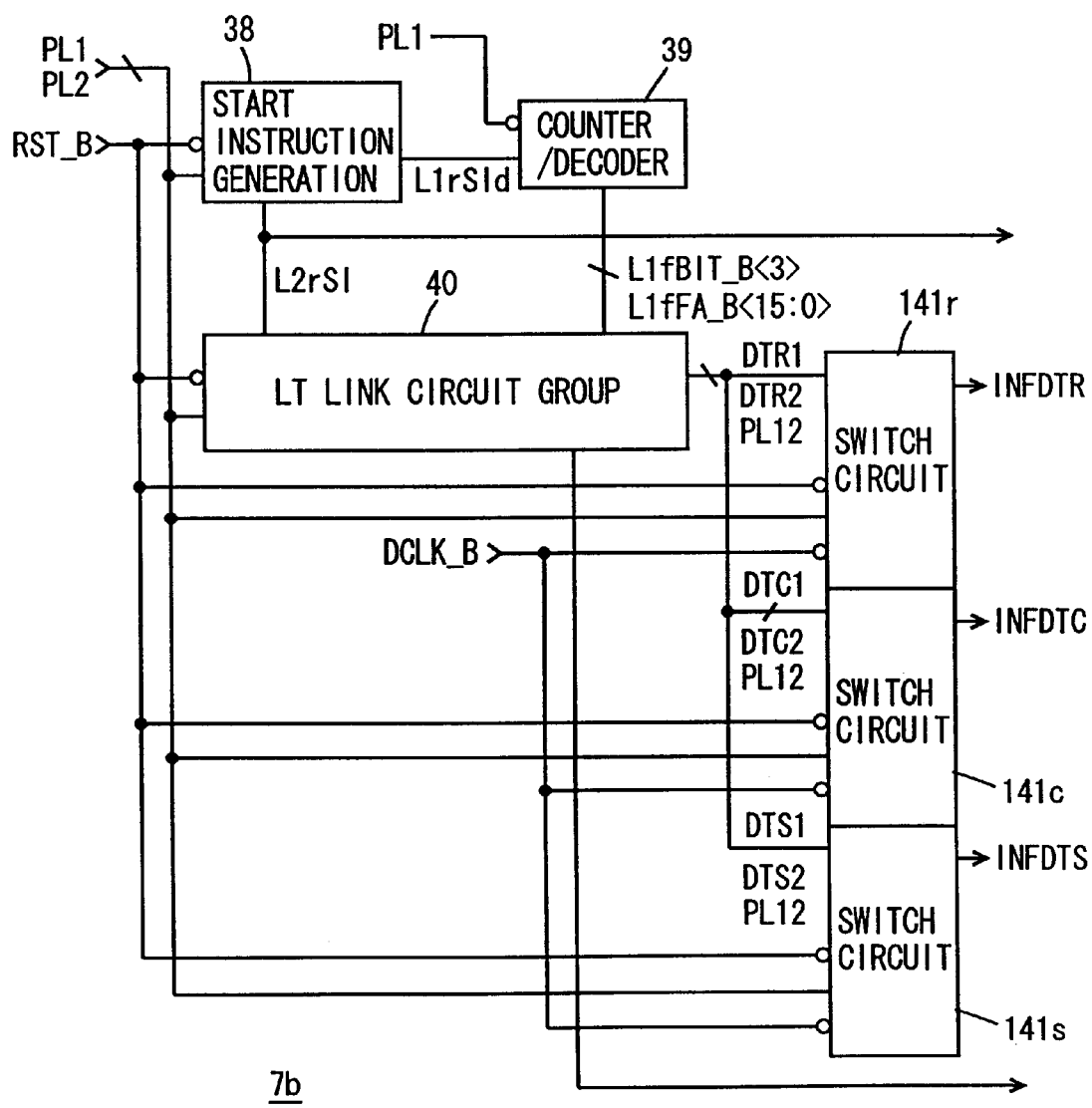
FIG. 53 schematically shows a structure of a transmitting circuit according to the seventh embodiment of the invention.

FIG. 53 schematically shows a structure of transmitting circuit 7b in the seventh embodiment of the invention. LT link circuit group 40 has the structure shown in FIG. 51, and outputs LT link information DTR1 and DTR2 for the DRAM spare row, LT link information DTC1 and DTC2 for the DRAM spare column, and LT link information DTS1 and DTS2 for the SRAM core in parallel.

Three kinds of LT link information, which are serially output from LT link circuit group 40, are applied to switch circuits 141r, 141c and 141s arranged in parallel, respectively. Switch circuit 141r receives LT link information DTR1 and DTR2 in parallel, and produces serial LT link information INFDTR. Switch circuit 141c receives LT link information DTC1 and DTC2 in parallel, and produces serial LT link information INFDTC. Switch circuit 141s receives LT link information DTS1 and DTS2 in parallel, and produces serial LT link information INFDTS. These switch circuits 141r, 141c and 141s have the structures already described and shown in FIG. 22, and produce serial LT link information INFDTR, INFDTC and INFDTS in accordance with combined transfer clock signal PL12, respectively.

Figure 54:
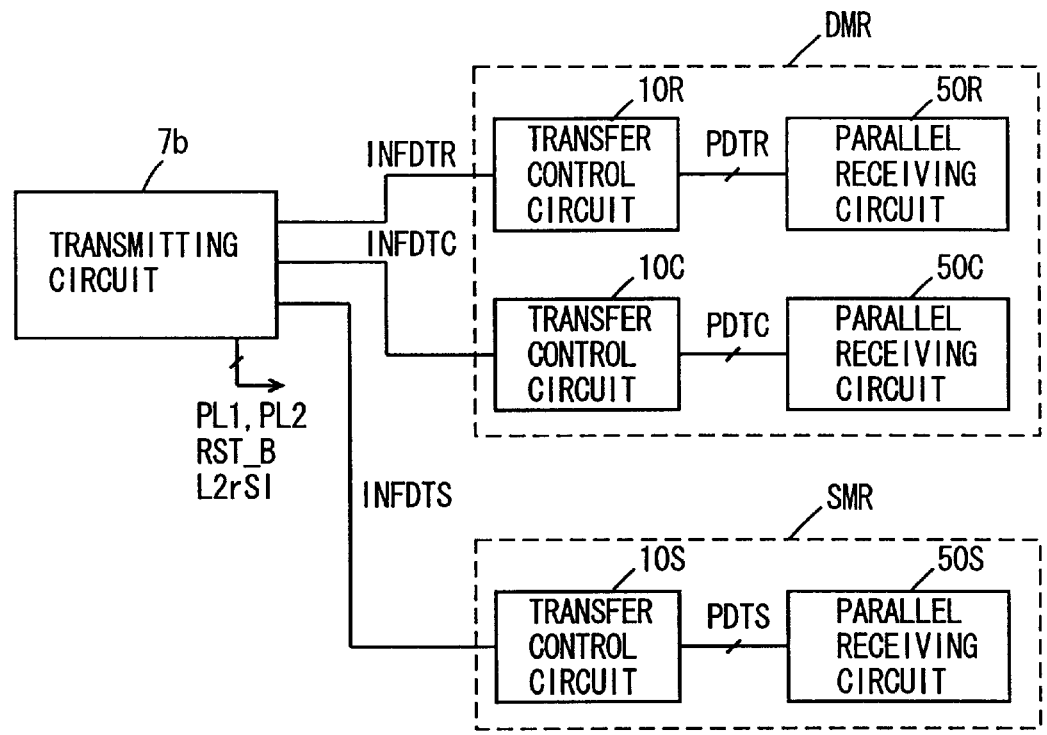
FIG. 54 schematically shows a structure of a main portion of the semiconductor integrated circuit device according to the seventh embodiment of the invention.

FIG. 54 schematically shows a structure of a transfer control portion in the seventh embodiment of the invention. In FIG. 54, DRAM macro DMR includes: a transfer control circuit 10R which serially receives DRAM spare row address bit information INFDTR from transmitting circuit 7b, and converts it to parallel LT link information PDTR; and a transfer control circuit 10c which serially receives DRAM column address information INFDTC from transmitting circuit 7b, and converts it to parallel LT link information PDTC. Parallel LT link information PDTR sent from transfer control circuit 10R is applied to parallel receiving circuit 50R, and parallel LT link information PDTC sent from transfer control circuit 10c is applied to parallel receiving circuit 50C.

Serial LT link information INFDTS for the SRAM core sent from transmitting circuit 7b is applied to a transfer control circuit 10S arranged in an SRAM core SMR. Transfer control circuit 10S converts the received serial LT link information INFDTS to parallel LT link information PDTS, and applies it to a parallel receiving circuit 50S. The structures of these transfer control circuits 10R, 10C and 10S are the same as those already described and shown in FIG. 26, and the structures of parallel receiving circuits 50R, 50C and 50S are the same as those already described and shown in FIGS. 31 and 32. Each of parallel receiving circuits 50R, 50C and 50S includes a plurality of local receiving circuits.

Transmitting circuit 7b produces transfer clock signals PL1 and PL2, reset signal RST_B and transfer start instructing signal L2rSI, and applies these signals to transfer control circuits 10R, 10C and 10S. These may be applied through the same signal lines, or may be applied through separate signal lines to transfer control circuits 10R, 10C and 10S, respectively.

As shown in FIG. 54, the fuse blocks are divided into groups in accordance with the kinds of LT link information, and the serial LT link information is transferred on a fuse block group basis. Thus, the time required for transferring the LT link information can be significantly reduced as compared with the case of serially transferring all the LT link information. The LT link information is stored individually and independently for each of the core circuits (macros) within the semiconductor integrated circuit device, whereby the LT link information can be transferred in parallel to the plurality of core circuits.

In the structure shown in FIG. 54, when transfer control circuits 10R and 10C may transfer the spare row address bit information and the spare column address bit information, the row address bus and the column address bus are utilized as the transfer signal lines for transferring the parallel LT link information.

In LT link circuit group 40, even if the fuse blocks may be different in number, parallel receiving circuits 50R, 50C and 50S are maintained in the latch state after latching the corresponding LT link information. Therefore, even when each fuse block group is different in number of LT link information pieces from the others, an intended LT link information can be latched in each local receiving circuit (parallel receiving circuit). After all the local receiving circuits latched the corresponding LT link information, generation of the transfer clock signal is stopped in accordance with transfer end instructing signal FEND. Therefore, even if invalid LT link information is transferred in such a structure, each parallel receiving circuit can reliably prevent the latching of this invalid LT link information (see FIGS. 31 to 33).

The fuse block groups are three in number in the above description. However, the number of fuse block groups is not restricted to 3, and may be appropriately determined in accordance with the kinds of LT link in formation.

According to the seventh embodiment of the invention, as described above, the fuse blocks are grouped in accordance with the kinds of holding information, and the LT information is serially transferred for each group, whereby the LT information can be serially transferred via each of a plurality of routes so that the time required for loading the LT information can be reduced.

Eighth Embodiment

Figure 55:
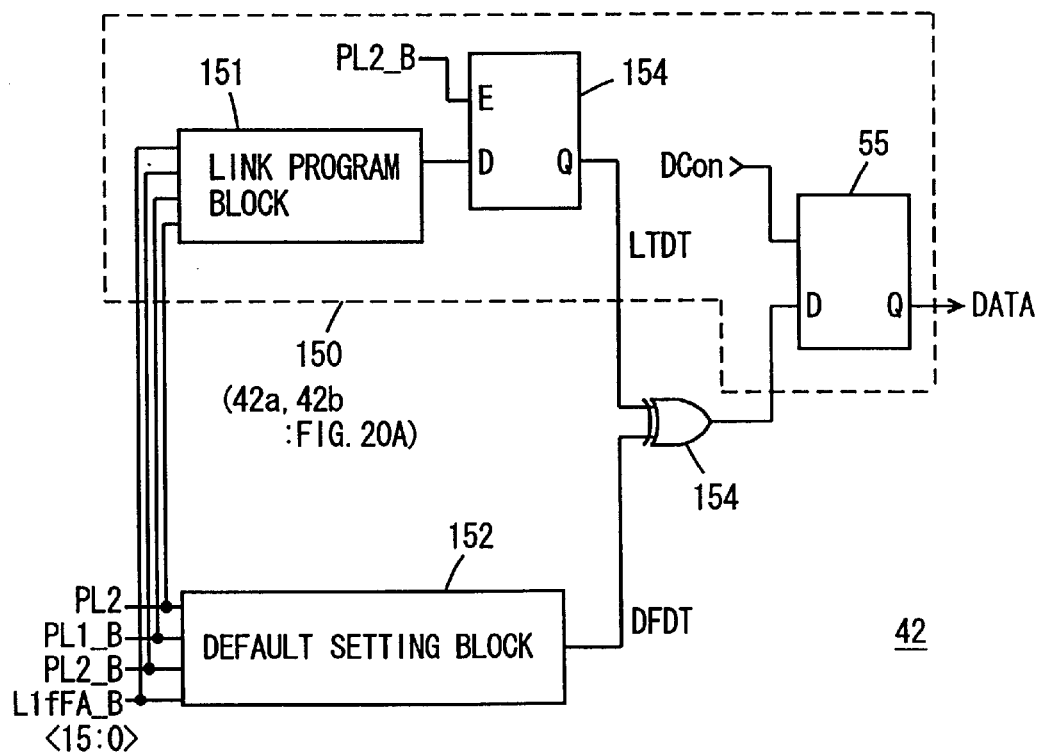
FIG. 55 schematically shows a structure of a sub-fuse block according to an eighth embodiment of the invention.

FIG. 55 schematically shows a structure of a sub-fuse block included in the LT link circuit group according to the eighth embodiment of the invention. In FIG. 55, one sub-fuse block included in fuse block 42 is representatively shown. In FIG. 55, the sub-fuse block includes an actual program block 150 which corresponds to the blocks 42a and 42b shown in FIG. 20A, and a default setting block 152 for setting a default. Actual program block 150 includes a D-latch 54 that transfers the program information of link program block 151 having the structure shown in FIG. 20A in accordance with transfer clock signal PL2_B; and a bus driver 55 which is rendered conductive to pass the signal applied to its input D when transfer activating signal DCon is at H-level. This bus driver 55 has the structure shown in FIG. 20B.

The sub-fuse block further includes: an EXOR circuit 154 which receives the actual LT link information generated at output Q of D-latch 54 and the default sent from default setting block 152, and applies an output signal thereof to bus driver 55. Default setting block 152 and link program block 151 are commonly supplied with transfer clock signals PL2, PL1_B and PL2_B as well as decode signals L1fFA_B<15:0>. Therefore, the actually programmed LT link information and the default LT link information are read out in parallel from link program block 151 and default setting block 152.

Before the laser trimming (programming) of link program block 151, all fuse elements (LT link elements) F0–F15 are conductive, as shown in FIG. 20A. Therefore, link program block 151 normally transfers the LT information at L-level in accordance with transfer clock signal PL2_B. An EXOR circuit 154 receives, on one input thereof, a signal at L-level. Therefore, EXOR circuit 154 operates as a buffer circuit, and successively applies default DFDT, which is read out from default setting block 152, to bus driver 55. For example, the delay time of a delay circuit and the information for adjusting the voltage level of a reference voltage are set by default DFDT of default setting block 152, and the activation/deactivation timing of the internal signals as well as the internal voltage level can be set to the defaults. The test is performed in this state, and programming of link program block 151 is performed when tuning of these signals and voltages is required.

In the programming in link program block 151, EXOR circuit 154 is a mismatch detecting circuit, and supplies a signal of "0" when the logical levels of two input signals do not match with each other. Therefore, the program value of each bit is set in link program block 151 in accordance with the value of a bit to be changed in the default programmed in default setting block 152. For example, if the bit of the default is "0", and the corresponding bit is to be changed, the corresponding bit in link program block 151 is set to "1". When the bit to be changed in the default is "1", and is to be set to "0", the value of the corresponding bit in link program block 151 is programmed to "1". In this case, EXOR circuit 154 outputs the inverted version of a bit value of the default set in default setting block 152, and the tuning can be performed. Particularly, for setting, e.g., a delay time, a central value in the delay time variable range is set as the default, whereby the tuning can be performed by the program in link program block in both the cases of increase and decrease of the delay time. This is true also for the adjustment of the voltage level.

Figure 56:
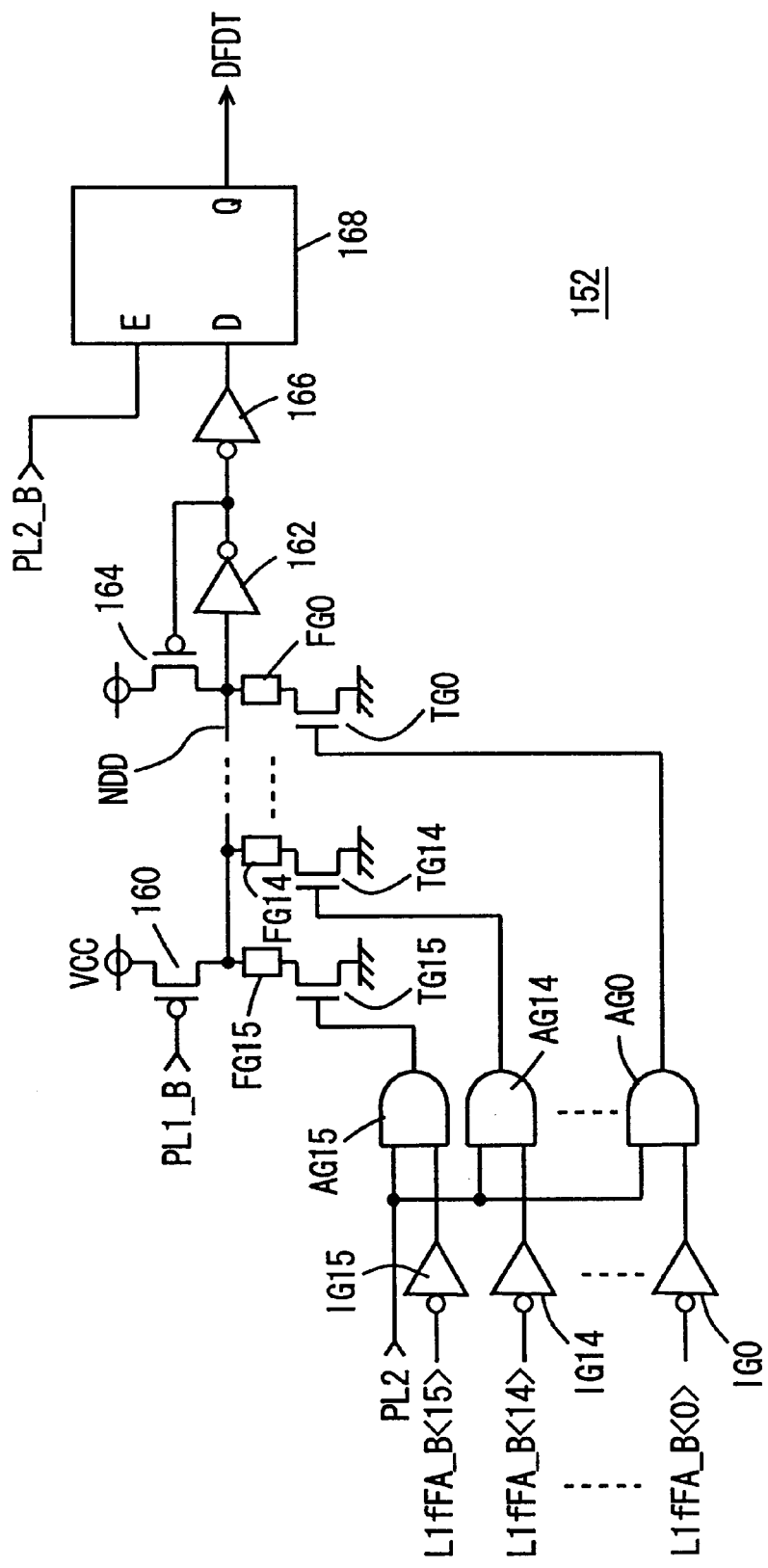
FIG. 56 shows a structure of a default setting block shown in FIG. 55.
Figure 57:
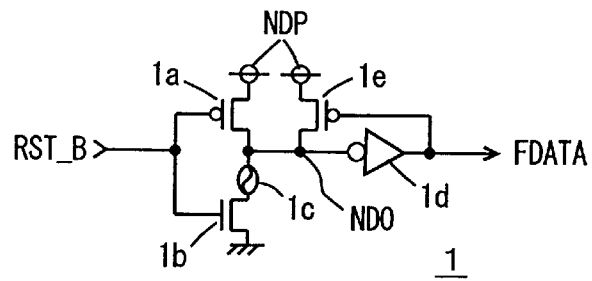
FIG. 57 shows a structure of a conventional LT link.
Figure 58:
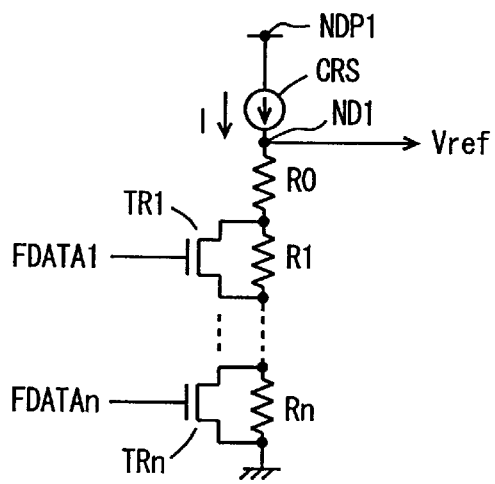
FIG. 58 shows an example of a structure of a conventional reference voltage generating circuit with a tuning function.
Figure 59:
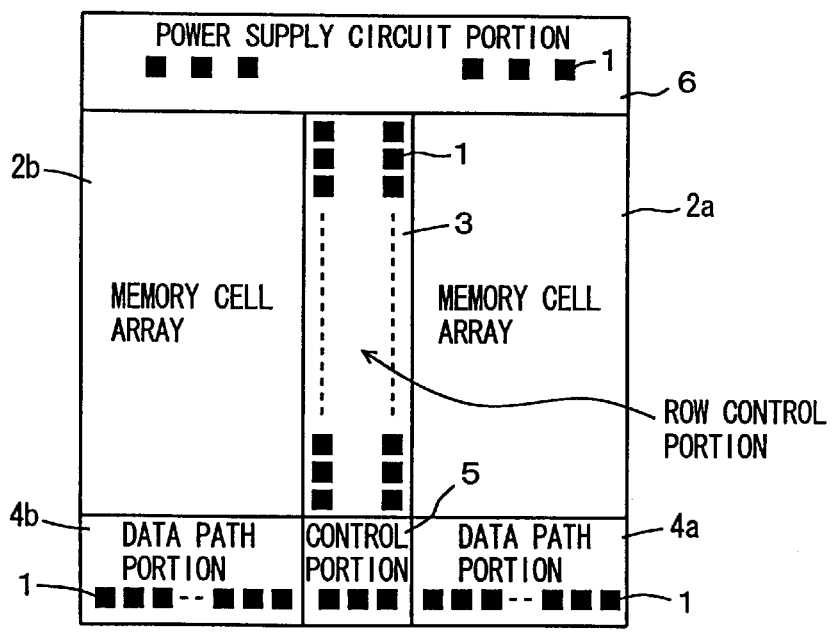
FIG. 59 schematically shows a whole structure of a conventional semiconductor integrated circuit device.

FIG. 56 shows a structure of default setting block 152 shown in FIG. 55. In FIG. 56, default setting block 152 includes inverters IG15–IG0 provided corresponding to decode signals L1fFA_B<15>–L1fFA_B<0>, respectively, and AND circuits AG15–AG0 provided corresponding to inverters IG15–IG0, respectively. These AND circuits AG15–AG0 receive, on their first inputs, the output signals of corresponding inverters IG15–IG0, respectively, and also receive transfer clock signal PL2 on their respective second inputs.

Default setting block 152 further includes: a precharging P-channel MOS transistor 160 which is turned on to precharge node NDD to power supply voltage VCC level when transfer clock signal PL1_B is at L-level; program elements FG15–FG0 coupled, in parallel, to node NDD; and N-channel MOS transistor TG15–TG0 connected in series between corresponding program elements FG15–FG0 and the ground node. These MOS transistors TG15–TG0 receive, on their gates, the output signals of AND circuits AG15–AG0, respectively.

Default setting block 152 further includes: an inverter 162 for inverting the signal on node NDD; a P-channel MOS transistor 164 rendered conductive to charge node NDD to power supply voltage VCC level when the output signal of inverter 162 is at L-level; an inverter 166 for inverting the output signal of inverter 162; and a D-latch 168 which enters the through state, when transfer dock signal PL2_B is at H-level, to pass the output signal of inverter 166 for producing default information DFDT.

Each of program element FG15–FG0 is programmed to enter the conductive or non-conductive state in accordance with the default value. These program elements FG15–FG0 may be mask interconnection lines, or may be switching transistors. If program elements FG15–FG0 are formed of the switching transistors, the gate voltages thereof are set to H- or L-level by mask interconnection lines for setting the on/off states. Alternatively, a default program circuit may be employed, and the conductive/non-conductive states of program elements FG15–FG0 may be set in accordance with the output signals of this default program circuit. In this case, the default program circuit is formed of, e.g., a nonvolatile storage circuit such as a ROM (Read Only Memory).

Default setting block 152 shown in FIG. 56 has substantially the same structure as the sub-fuse block shown in FIG. 20A, except for that program elements FG0–FG15 are employed instead of LT link elements F0–F15. Accordingly, by setting the conduction/non-conduction states of the program elements FG0–FG15, e.g., with the mask interconnection lines, default information DFDT can be read out in accordance with transfer clock signals PL2, PL1_B and PL2_B.

According to the eighth embodiment of the invention, as described above, the block for setting the default of the LT links is arranged in the LT link portion, and the states of the LT link elements for tuning a delay time, a voltage value, a current value and such can be set to defaults, so that it is merely required to program the LT link elements to adjust the deviations from the default value. Therefore, accurate tuning can be achieved. Further, the deviations from the defaults are small, so that the LT links to be programmed can be reduced in number, and therefore the tuning steps can be reduced in number.

Other Examples of Application

The foregoing description has been given on the system LSI, in which the DRAM core, logic and memory are integrated on the same semiconductor chip. However, the present invention can be generally applied to various kinds of semiconductor integrated circuits, in which LT link elements are programmed for adjusting internal states.

According to the present invention, as described above, the LT link elements are locally and concentratedly arranged. Therefore, the flexibility in interconnection layout is improved, and an area occupied by the interconnection lines is reduced. Since the LT link elements are concentratedly arranged within the LT link circuitry, it is not necessary to arrange the LT link element in a core circuit so that an area occupied by the core circuit can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
    at least one core circuit for performing a predetermined operation;
    LT link circuitry arranged outside said core circuit, for holding programmable internal information for setting an internal state of said core circuit;
    transfer circuitry for serially transferring the information held by said LT link circuitry to said core circuit after power-on;
    a plurality of latch circuits disposed in said core circuit and arranged corresponding to predetermined internal circuits, for latching corresponding internal information for application to corresponding predetermined internal circuits; and
    transfer control circuitry arranged in the core circuit, for converting serial information received from said transfer circuitry to parallel information, and transferring the parallel information to said plurality of latch circuits.

2. The semiconductor integrated circuit device according to claim 1, further comprising:
    a signal line for transferring a normal signal used in said core circuit in a normal operation mode, and
    a transmission circuit for transmitting the internal information from said transfer control circuitry, instead of said normal signal, to said signal line when a transfer operation mode instructing signal is active, each of said latch circuits latching the signal transferred via said signal line in the transfer operation.

3. The semiconductor integrated circuit device according to claim 1, wherein
    said semiconductor integrated circuit device is integrated on a semiconductor chip, and further comprises a circuit for transferring the transfer information generated from said transfer circuitry externally to the chip.

4. The semiconductor integrated circuit device according to claim 1, wherein
    said transfer circuitry and said transfer control circuitry perform a transferring operation of transferring the internal information in response to an internal clock signal generated from a clock generating circuit, and said transfer circuitry generates a transfer end instructing signal upon end of said transferring operation; and
    said semiconductor integrated circuit device further comprises a clock control circuit for stopping a clock signal generating operation of said clock generating circuit in response to said transfer end instructing signal.

5. The semiconductor integrated circuit device according to claim 1, further comprising:

a circuit for transferring externally applied test information to said transfer control circuitry, instead of the internal information from said transfer circuitry, in response to a test operation mode instructing signal.

6. The semiconductor integrated circuit device according to claim 1, wherein said LT link circuitry includes at least one modularized link block formed into a module.

7. The semiconductor integrated circuit device according to claim 1, further comprising:

a boundary scan register coupled to said transfer circuitry and said transfer control circuitry for externally transferring information with said transfer circuitry and said transfer control circuitry.

8. The semiconductor integrated circuit device according to claim 1, wherein said transfer circuitry includes a plurality of transfer routes each serially transferring the internal information.

9. The semiconductor integrated circuit device according to claim 1, wherein said at least one core circuit includes a plurality of core circuits, and said LT link circuitry stores the internal information for each of said plurality of core circuits.

10. The semiconductor integrated circuit device according to claim 9, wherein said LT link circuitry includes a plurality of LT circuits provided corresponding to the plurality of core circuits, and said transfer control circuitry includes a plurality of transfer control circuits provided corresponding to the plurality of the core circuits for transferring corresponding internal information to corresponding core circuits in parallel through transfer circuits, each transfer circuit transferring the corresponding internal information in series.

11. The semiconductor integrated circuit device according to claim 1, wherein the core circuits includes a plurality of sub circuits each performing a preassigned operation, said LT link circuitry includes a plurality of LT link circuit provided corresponding to the plurality of LT link circuits, each for holding internal information for a corresponding sub circuit, and said transfer control circuitry includes a plurality of transfer control circuits provided corresponding to the sub circuits, each for controlling transfer of the corresponding internal information to a corresponding sub circuit through a corresponding transfer circuit in the transfer circuitry on a sub circuit basis.

12. The semiconductor integrated circuit device according to claim 1, further comprising:

a default setting circuit for storing a default of said internal information; and a circuit for applying the default stored in said default setting circuit to said transfer circuitry.

13. The semiconductor integrated circuit device according to claim 12, further comprising a program circuit for storing data modifying the default, and a circuit coupled to the program circuit and said default setting circuit for modifying the default in accordance with the data stored in the program circuit.

* * * * *